United States Patent
Shibata et al.

(10) Patent No.: US 7,187,594 B2
(45) Date of Patent: Mar. 6, 2007

(54) SEMICONDUCTOR STORAGE DEVICE, SEMICONDUCTOR DEVICE, MANUFACTURING METHOD OF SEMICONDUCTOR STORAGE DEVICE, AND MOBILE ELECTRONIC DEVICE

(75) Inventors: Akihide Shibata, Nara (JP); Hiroshi Iwata, Ikoma-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 246 days.

(21) Appl. No.: 10/844,563

(22) Filed: May 13, 2004

(65) Prior Publication Data

US 2004/0228193 A1 Nov. 18, 2004

(30) Foreign Application Priority Data

May 16, 2003 (JP) .............................. 2003-138686

(51) Int. Cl.
*G11C 11/34* (2006.01)
*G11C 7/00* (2006.01)

(52) U.S. Cl. .................................. 365/189.05; 257/295

(58) Field of Classification Search ........... 365/185.05, 365/185.1, 189.05; 257/314, 315, 316, 374, 257/288, 295
See application file for complete search history.

(56) References Cited

U.S. PATENT DOCUMENTS

| | | | | | |
|---|---|---|---|---|---|
| 5,760,435 | A | * | 6/1998 | Pan .............................. | 257/314 |
| 5,949,711 | A | * | 9/1999 | Kazerounian .......... | 365/185.05 |
| 6,222,774 | B1 | * | 4/2001 | Tanzawa et al. ....... | 365/185.29 |
| 6,348,711 | B1 | | 2/2002 | Eitan | |
| 6,426,532 | B1 | * | 7/2002 | Iwata et al. .................. | 257/374 |
| 6,462,364 | B1 | * | 10/2002 | Horiuchi ..................... | 257/288 |
| 6,721,205 | B2 | * | 4/2004 | Kobayashi et al. .... | 365/185.26 |

FOREIGN PATENT DOCUMENTS

| | | |
|---|---|---|
| JP | 5-81072 B2 | 11/1993 |
| JP | 09-116119 A | 5/1997 |
| JP | 2001-156188 A | 6/2001 |
| JP | 2001-196461 A | 7/2001 |
| JP | 2001-230322 A | 8/2001 |
| JP | 2002-246571 A | 8/2002 |
| WO | 99/07000 A | 2/1999 |
| WO | WO01/17030 A | 3/2001 |
| WO | WO03/044868 A | 5/2003 |
| WO | WO03/075358 A | 9/2003 |
| WO | WO03/075359 A | 9/2003 |
| WO | WO03/103058 A | 12/2003 |
| WO | WO2004/034474 A | 4/2004 |

\* cited by examiner

*Primary Examiner*—Son T. Dinh
(74) *Attorney, Agent, or Firm*—Birch, Stewart, Kolasch & Birch, LLP

(57) ABSTRACT

A volatile memory element and a nonvolatile memory element, each of which is constituted of a field effect transistor, are formed on a single semiconductor chip. The volatile memory element includes a body region, a gate electrode, and two diffusion layer regions, and varies an amount of a current, flowing between the diffusion layer regions in applying a voltage to a gate electrode, in accordance with an amount of electric charge retained in the body region. The nonvolatile memory element includes diffusion layer regions, a gate electrode, and two memory function sections, and varies an amount of a current, flowing between the diffusion layer regions in applying a voltage to the gate electrode, in accordance with an amount of electric charge retained in the memory function sections. Thus, it is possible to form the volatile memory and the nonvolatile memory on a single chip with a simple process.

31 Claims, 27 Drawing Sheets

SEMICONDUCTOR STORAGE DEVICE, SEMICONDUCTOR DEVICE, MANUFACTURING METHOD OF SEMICONDUCTOR STORAGE DEVICE, AND MOBILE ELECTRONIC DEVICE

This Nonprovisional application claims priority under 35 U.S.C. § 119(a) on Patent Application No. 2003/138686 filed in Japan on May 16, 2003, the entire contents of which are hereby incorporated by reference.

FIELD OF THE INVENTION

The present invention relates to a semiconductor device, a semiconductor storage device, a manufacturing method thereof, and a mobile electronic device. More specifically, the present invention relates to a semiconductor storage device and a semiconductor device each of which has a volatile memory and a nonvolatile memory that are provided on a single chip, a manufacturing method of the semiconductor storage device, and a mobile electronic device having either the semiconductor storage device or the semiconductor device.

BACKGROUND OF THE INVENTION

Conventionally, there has been developed a process for providing a plurality of elements different from each other in terms of a structure on a single chip, and the process is applied to manufacture of a system LSI (Large Scale Integration).

For example, an arrangement in which a CMOS logic circuit and a flash memory such as a nonvolatile memory are provided together on a single chip is conventionally known. Further, Japanese Unexamined Patent Publication No. 196461/2001 (Tokukai 2001-196461)(Publication date: Jul. 19, 2001) discloses such an arrangement that a CMOS (Complementary Metal Oxide Semiconductor) logic circuit and a DRAM (Dynamic Random Access Memory) which is a volatile memory are provided together on a single chip. In this manner, elements different from each other in terms of a structure are provided together on a single chip, so that it is possible to improve an operation speed of the LSI and it is possible to reduce the manufacturing cost thereof.

However, in order to provide elements different from each other in terms of a structure on a single chip, a complicate process is required. Particularly, it is extremely difficult to provide a volatile memory and a nonvolatile memory on a single chip. For example, when a DRAM which is the most general volatile memory and a flash memory which is the most general nonvolatile memory are selected, it is difficult to provide a capacitance constituting the DRAM and a floating gate constituting the flash memory on the same chip. Thus, it is required to develop a technique for providing the volatile memory and the nonvolatile memory together on the same chip.

SUMMARY OF THE INVENTION

The present invention was devised in view of the foregoing problems, and its first object is to provide a semiconductor storage device and a semiconductor device, capable of being manufactured with a simpler process, each of which has a volatile memory and a nonvolatile memory on a single chip.

Further, its second object is to provide a manufacturing method of the semiconductor storage device and the semiconductor device.

Further, its third object is to provide a mobile electronic device having the semiconductor storage device and the semiconductor device.

In order to achieve the first object, the semiconductor storage device of the present invention includes one or more first field effect transistors and one or more second field effect transistors that are formed on a single semiconductor chip, wherein: the first field effect transistor includes (i) a well region or a body region, (ii) a gate electrode, and (iii) first and second diffusion layer regions, and the first field effect transistor varies an amount of a current, flowing from the first diffusion layer region to the second diffusion layer region in applying a voltage to the gate electrode, in accordance with an amount of electric charge retained in the well region or the body region, and the second field effect transistor includes (a) third and fourth diffusion layer regions, (b) a gate electrode, and (c) memory function sections, formed on both side walls of the gate electrode so as to be disposed in a gate length direction, each of which has a charge retaining function (each of which has a material having a function for retaining electric charge for example), and the second field effect transistor varies an amount of a current, flowing from the third diffusion layer region to the fourth diffusion layer region in applying a voltage to the gate electrode, in accordance with an amount of electric charge retained in the memory function sections.

Further, the semiconductor storage device of the present invention includes one or more first field effect transistors and one or more second field effect transistors that are formed on a single semiconductor chip, wherein: the first field effect transistor includes (i) a well region or a body region, (ii) a gate electrode provided in a stacking direction with respect to the well region or the body region, and (iii) first and second diffusion layer regions positioned on both sides of the gate electrode in a gate length direction of the well region or the body region, and the second field effect transistor includes (a) third and fourth diffusion layer regions, (b) a gate insulating film, and (c) a channel region formed between the third and fourth diffusion layer regions so as to be positioned under the gate insulating film, (d) a gate electrode formed on the gate insulating film, and (e) memory function sections, formed on both side walls of the gate electrode in the gate length direction, each of which has a function for retaining electric charge.

According to the arrangement, the first and second field effect transistors are formed on a single chip, and the first field effect transistor functions as a volatile memory which refers to an amount of electric charge retained in its well region or body region as stored information, and the second field effect transistor functions as a nonvolatile memory which refers to an amount of electric charge retained in the two charge retaining sections formed on both sides of the gate electrode as stored information.

Each of the first and second field effect transistors does not have an external capacitor and a floating gate each of which requires a special formation process, so that it is possible to form the field effect transistor by performing a process extremely similar to a process for forming an ordinary field effect transistor. Thus, it is possible to provide a semiconductor storage device, having the volatile memory and the nonvolatile memory on a single chip, which can be manufactured with a simple process.

In order to achieve the second object, a method of the present invention for manufacturing a semiconductor storage device which includes one or more first field effect transistors and one or more second field effect transistors that are formed on a single semiconductor chip, wherein: the first field effect transistor includes (i) a well region or a body region, (ii) a gate electrode, (iii) gate side wall insulating films formed on both side walls of the gate electrode in a gate length direction, and (iv) first and second diffusion layer regions, and neither of the gate side wall insulating films has a function for retaining electric charge, and the first field effect transistor varies an amount of a current, flowing from the first diffusion layer region to the second diffusion layer region in applying a voltage to the gate electrode, in accordance with an amount of electric charge retained in the well region or the body region, and the second field effect transistor includes (a) third and fourth diffusion layer regions, (b) a gate electrode, and (c) memory function sections, formed on both side walls of the gate electrode so as to be disposed in a gate length direction of the gate electrode, each of which has a charge retaining function, and the second field effect transistor varies an amount of a current, flowing from the third diffusion layer region to the fourth diffusion layer region in applying a voltage to the gate electrode, in accordance with an amount of electric charge retained in the memory function sections, said method comprising the steps of: forming the gate electrode; forming a film, having a function for retaining electric charge, on entire surfaces of the well region or the body region and the gate electrode; and removing a portion of the film, having the function for retaining electric charge, from a vicinity of the gate electrode of the first field effect transistor.

According to the arrangement, it is possible to form the first field effect transistor, having high reliability, which functions as the volatile memory element, with a simple process. Further, it is possible to form the second field effect transistor, being capable of rewriting information at high speed, having a sufficient retaining time and high reliability, which functions as the nonvolatile memory element, with a simple process.

In order to achieve the third object, a mobile electronic device of the present invention includes a semiconductor storage device which includes one or more first field effect transistors and one or more second field effect transistors that are formed on a single semiconductor chip, wherein: the first field effect transistor includes (i) a well region or a body region, (ii) a gate electrode, and (iii) first and second diffusion layer regions, and the first field effect transistor varies an amount of a current, flowing from the first diffusion layer region to the second diffusion layer region in applying a voltage to the gate electrode, in accordance with an amount of electric charge retained in the well region or the body region, and the second field effect transistor includes (a) third and fourth diffusion layer regions, (b) a gate electrode, and (c) memory function sections, formed on both side walls of the gate electrode so as to be disposed in a gate length direction of the gate electrode, each of which has a charge retaining function, and the second field effect transistor varies an amount of a current, flowing from the third diffusion layer region to the fourth diffusion layer region in applying a voltage to the gate electrode, in accordance with an amount of electric charge retained in the memory function sections.

According to the arrangement, elements which can be formed with a simple process are provided together, for example, LSIs are provided together, so that it is possible to improve functions and an operation speed of the mobile electronic device, and it is possible to reduce the manufacturing cost.

For a fuller understanding of the nature and advantages of the invention, reference should be made to the ensuing detailed description taken in conjunction with the accompanying drawings.

DESCRIPTION OF THE EMBODIMENTS

Each of the semiconductor storage device and the semiconductor device of the present invention is arranged so that the volatile memory element and the nonvolatile memory element are provided together on a single chip, and can be manufactured with a simple process. The following description will explain the volatile memory element and the nonvolatile memory element that constitute the semiconductor storage device and the semiconductor device of one embodiment of the present invention.

First, the volatile memory element constituting the semiconductor storage device and the semiconductor device of Embodiment 1 are described as follows.

Embodiment 1

The volatile memory element (semiconductor device, semiconductor storage device) of the present embodiment is constituted of a single transistor so as to have a function similar to a DRAM, and requires refreshment at constant intervals.

Figure 1:
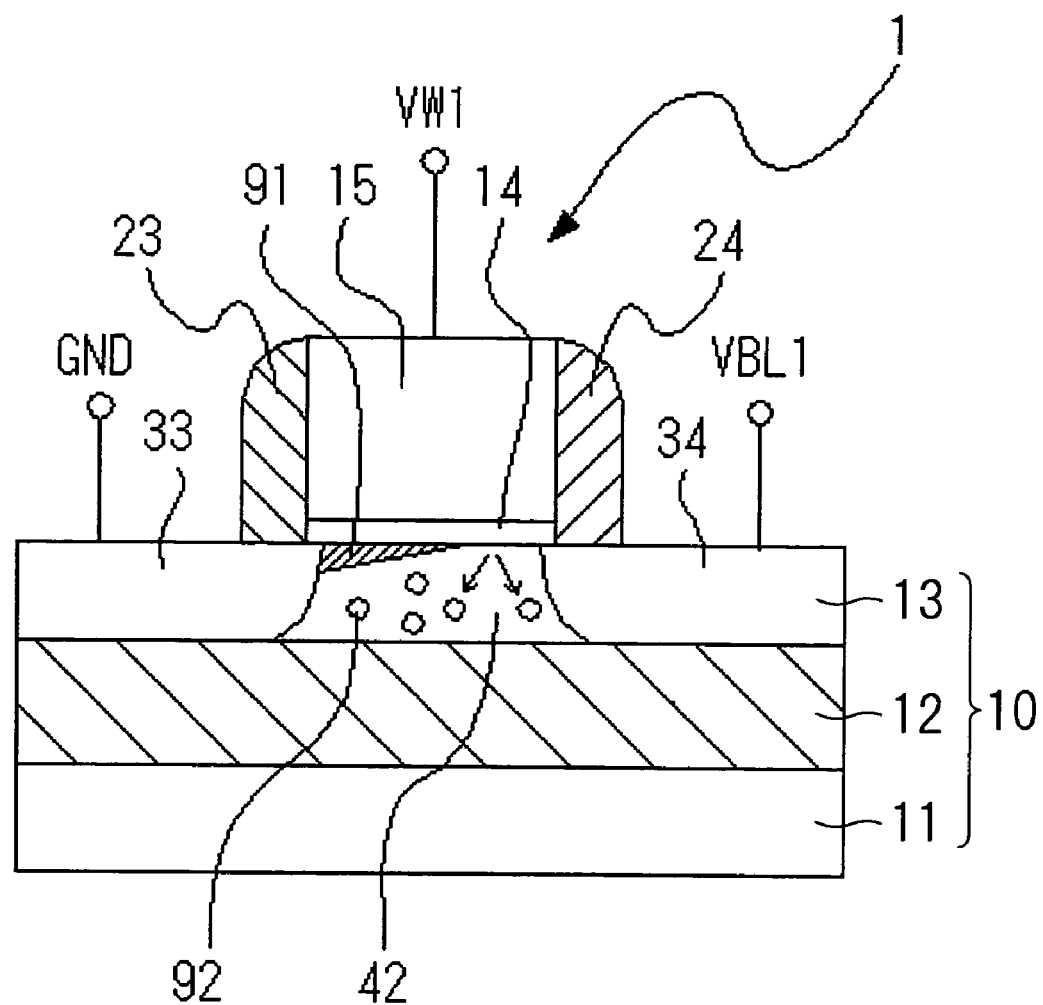
FIG. 1 is a longitudinal sectional view schematically illustrating a writing operation of a volatile memory element constituting a semiconductor storage device or a semiconductor device of one embodiment of the present invention.

As shown in FIG. 1, a volatile memory element (first field effect transistor) 1 includes mainly a well region or body region 42, a gate insulating film 14, a gate electrode 15 formed on the gate insulating film 14, diffusion layers (source/drain region, first and second diffusion layer regions) 33 and 34 formed on both sides (both sides of the well region or body region 42) of the gate electrode 15, and a channel region (not shown) disposed under the gate electrode 15.

The volatile memory element 1 functions as a memory element which can store at least binary information in accordance with an amount of electric charge stored in the well region or body region.

The volatile memory element 1 is provided on a semiconductor substrate 10, preferably on a first conduction type (either P type or N type) well region formed in the semiconductor substrate 10. One first conduction type well region of one volatile memory element 1 is electrically separated from another first conduction type well region of another volatile memory element 1. In the semiconductor substrate 10, it is preferable to provide a second conduction type well region at a position lower than the first conduction type well region so as to surround the first conduction type well region in combination with element separation regions, thereby electrically separating the volatile memory element 1 from another volatile memory element 1.

It is more preferable to form the volatile memory element 1 on an SOI (Silicon on Insulator) substrate. Note that, in case of using the SOI substrate as the semiconductor substrate 10, a region indicated by the reference sign 42 positioned under the channel region is a body region. In this case, by providing the element separation regions, it is possible to electrically separate the first conduction type body region easily.

As the semiconductor substrate 10, any material can be used as long as it can be used in a semiconductor device. Examples of the material include a substrate constituted of an elemental semiconductor such as silicon and germanium and a compound semiconductor such as GaAs, InGaAs, and ZnSe, and various substrates such as an SOI substrate or a multi-layer SOI substrate. Particularly, it is preferable to use the silicon substrate or the SOI substrate in which a silicon layer is formed as a surface semiconductor layer (a semiconductor layer on an upper surface of the semiconductor substrate 10).

It is preferable to form element separation regions in the semiconductor substrate 10, and it may be so arranged that: a transistor, a capacitor, elements such as a resistor, a circuit constituted thereof, a semiconductor device, and an interlayer insulating film are combined with each other as a single or a multi-layer structure. Note that, it is possible to use a LOCOS film, a trench oxide film, and an STI film so as to form the element separation films.

The semiconductor substrate 10 may include the P-conduction type well region or the N-conduction type well region, and it is preferable that at least one of these first conduction type well regions (P-conduction type well region and N-conduction type well region) is formed in the semiconductor substrate 10. The impurity concentration of the semiconductor substrate 10 or the well region can be set to be in a range conventionally known.

Ordinarily, the gate insulating film 14 is not particularly limited as long as it is used in the semiconductor device. Examples of materials thereof include a monolayer film such as a silicon oxide film and a silicon nitride film, or a film obtained by stacking these films. Further, it is possible to use a monolayer film of a high-dielectric film such as an oxide aluminium film, an oxide titanium film, an oxide tantalum film, and an oxide hafunium film, or a stacking film constituted thereof, as the gate insulating film 14. Particularly, the silicon oxide film is preferable.

The gate electrode 15 is formed on the gate insulating film 14 and is ordinarily shaped so that the gate electrode 15 is used in a semiconductor device. As long as the gate electrode 15 is constituted of a conductive film, the gate electrode 15 is not particularly limited unless particularly specified in the embodiment. Examples of the conductive film include a monolayer film or a stacking film such as polysilicon and metal (for example, copper, aluminium, and the like). Further, the metal may be a high melting point metal such as tungsten, titanium, and tantalum. Further, it is possible to use a monolayer film such as silicide, or a stacking film constituted of silicide and the high melting point metal, as the conduction film. It is appropriate to set a thickness of the gate electrode 15 to approximately 50 to 400 nm for example. Note that, the channel region is formed under the gate electrode 15.

The diffusion layer regions (source/drain regions) 33 and 34 are respectively disposed both sides of the gate electrode 15 as diffusion layer regions whose conduction type (second conduction type) is opposite to the well region or the body region.

It is preferable that: a slope indicative of the impurity concentration is so steep that the impurity concentration greatly varies in a junction surface between (i) the diffusion layer regions 33 and 34 and (ii) the semiconductor substrate 10 or the well region. This is because: high-energy carrier (hot electron or hot hole) occurs with high efficiency at a lower voltage, so that a high-speed operation is realized at a lower voltage. Note that, "impurity concentration greatly varies in the junction surface" means that: the impurity concentration is high at both sides of the PN junction, and the slope indicative of the impurity concentration around the junction surface is steep (thus, a slope indicative of a potential around the junction surface is steep).

A junction depth of the diffusion layer regions 33 and 34 is not particularly limited. It is possible to adjust the junction depth as required in accordance with a performance and the like of a target semiconductor storage device. Note that, in case of using the SOI substrate as the semiconductor substrate 10, the junction depth of the diffusion layer regions 33 and 34 may be smaller than a thickness of a surface semiconductor layer, but it is preferable that the junction depth is substantially the same as the thickness of the surface semiconductor layer.

The diffusion layer regions 33 and 34 may be extended so as to be partially positioned higher than a surface of the channel region, i.e., an under face of the gate insulating film 15. In this case, it is appropriate that the conductive film is integrally stacked on the diffusion layer regions 33 and 34 formed in the semiconductor substrate 10.

Examples of the conductive film include a semiconductor (polysilicon, amorphous silicon), silicide, the metal, and the high melting point metal. Particularly, polysilicon is preferable. The diffusion velocity of impurity of polysilicon is much faster than that of the semiconductor substrate, so that it is easy to shorten the junction depth of the source/drain regions in the semiconductor substrate, and it is easy to suppress the short channel effect.

A structure and operation principle of the volatile memory 1 are described as follows with reference to FIG. 1 and FIG. 2. FIG. 1 is a schematic sectional view of the volatile memory 1, and shows a case where an N-channel-type volatile memory 1 is formed on the SOI substrate as the semiconductor substrate 10.

In the SOI substrate, an embedded oxide film 12 is formed on a silicon substrate 11, and an SOI layer 13 is formed thereon. The SOI layer 13 has the P-type body region 42 and the N-type diffusion layer regions 33 and 34. The body region 42 is partially depleted. Further, the body region 42 is not electrically connected directly to other node, so that it is in a floating state.

The gate electrode 15 made of silicon is formed on the body region 42 via a gate insulating film 14 constituted of the gate oxide film. Gate side wall insulating films 23 and 24 each of which is constituted of a silicon nitride film are provided on the gate electrode 15's side walls in a gate length direction. Each of the gate side wall insulating films 23 and 24 does not have an electric charge retaining function.

Next, principle of a writing operation of the volatile memory 1 is described as follows with reference to FIG. 1 and FIG. 2. From the volatile memory 1, an amount of positive holes stored in the body region 42 is read as a threshold value difference (whether the threshold value is high or low) of the volatile memory 1 constituted of a field effect transistor. Here, to write a "1" value means to decrease the threshold value of the transistor, and to write a "0" value means to increase the threshold value of the transistor.

In order to write the "1" value in the volatile memory 1, as shown in FIG. 1, the diffusion layer region 33 is used as a source electrode, and a ground potential GND is applied to the diffusion layer region 33, and the diffusion layer region 34 is used as a drain electrode, and a positive voltage VBL1 is applied to the diffusion layer region 34, and a positive voltage VW1 is applied to the gate electrode 15. Thus, the transistor turns ON.

At this time, an inversion layer 91 extends from the diffusion layer region 33 (source region), but does not reach the diffusion layer region 34 (drain region), so that the volatile memory 1 is in a pinch-off state. In order to bring about the pinch-off state, it is necessary to cause the transistor to operate in a saturation state, so that it is preferable to set the voltage VBL1 of the diffusion layer region 34 (drain region) to be the same as or higher than the voltage VW1 of the gate electrode 15. Specifically, VW1 is set to be 1V, and VBL1 is set to be 1.5V for example, but the voltage values are not limited to this.

Electrons of the inversion layer 91 in the pinch-off state (reaching the pinch-off point) are accelerated by an intense electric field so as to bring about impact-ionization around an end of the diffusion layer region 34 (drain region). Thus, positive holes 92 occur, and are stored in the body region 42. When the positive holes 92 are stored in the body region 42, a potential of the body region 42 increases. Thus, a threshold value of the transistor drops, so that a driving current increases. Note that, the positive holes 92 stored in the body region 42 escape to the diffusion layer regions 33 and 34 with the passage of time. Specifically, almost all the positive holes 92 are scattered and lost in several seconds at a room temperature, so that stored information is lost. However, when a refreshment operation is performed before the stored information is lost, it is possible to retain the stored information.

Figure 2:
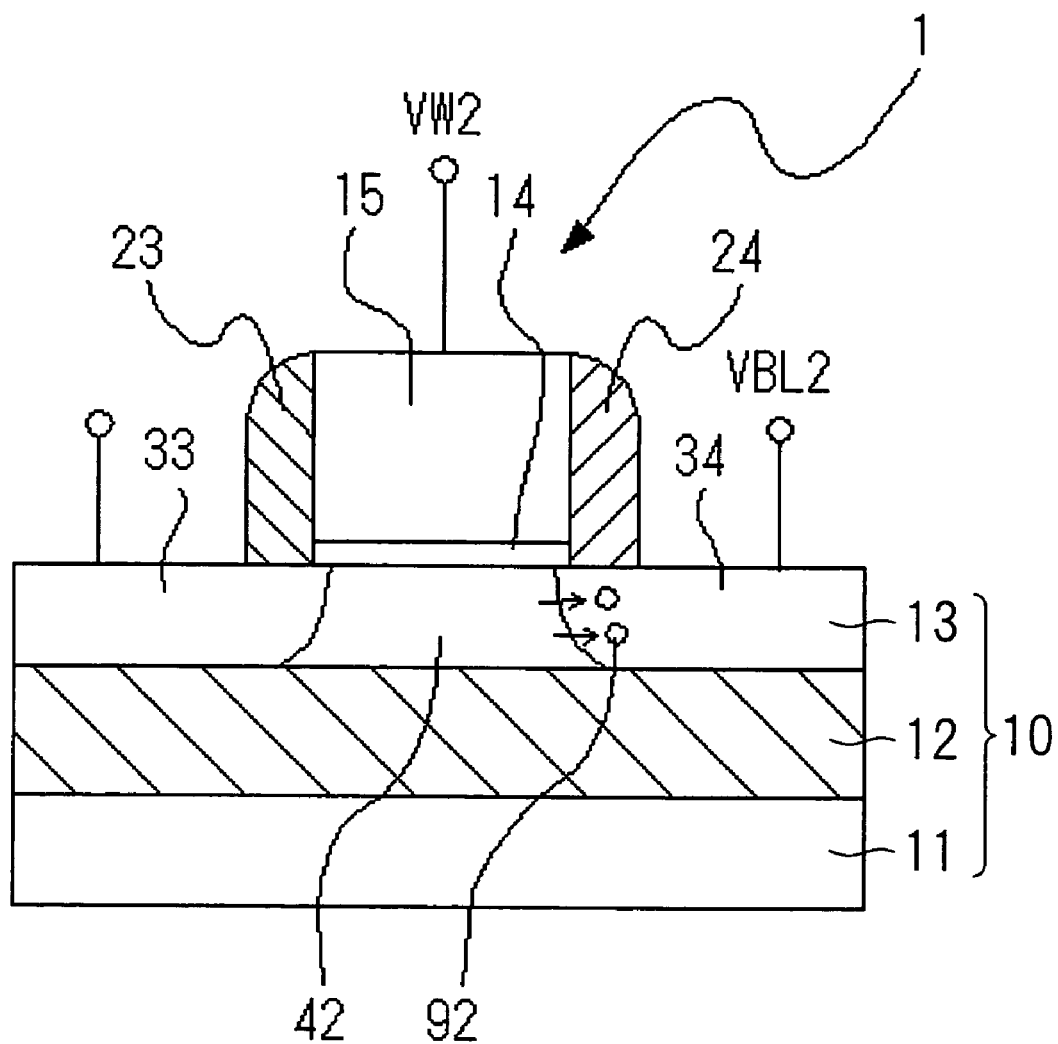
FIG. 2 is a longitudinal sectional view schematically illustrating an erasing operation of the volatile memory element shown in FIG. 1.

In order to write the "0" value in the volatile memory 1, as shown in FIG. 2, a negative voltage VBL2 is applied to the diffusion layer region 34, and a positive voltage VW2 is applied to the gate electrode 15, so as to draw the positive holes stored in the body region 42 to the diffusion layer region 34. Specifically, VW2 is set to be 1V, and VBL2 is set to be −1V for example, but the voltage values are not limited to this. Thus, the number of the positive holes 92 stored in the body region 42 decreases, and the threshold value of the transistor increases, so that the driving current decreases.

In order to read the stored information in the volatile memory element 1, the transistor is turned ON so as to detect a current (driving current) flowing between the diffusion layer region 33 (source region) and the diffusion layer region 34 (drain region). At this time, it is preferable to decrease an absolute value of a voltage of the diffusion layer region 34 (drain region) so as not to allow the writing operation. Specifically, VW2 is set to be 1 V and VBL2 is set to be 0.1 V for example, but the voltage values are not limited to this.

The threshold value of the transistor more largely varies as variation of the potential of the body region 42 becomes greater. Further, as long as the number of the positive holes 92 does not change, the variation of the potential of the body region 42 becomes greater as the capacitance of the body region 42 becomes smaller. Thus, the memory effect (threshold variation) of the transistor becomes greater as the capacitance of the body region 42 becomes smaller. Thus, it is particularly preferable to use an SOI substrate in which it is possible to largely reduce the capacitance of a junction between the body region 42 and the diffusion layer region 33 and the capacitance of a junction between the body region 42 and the diffusion layer region 34. However, it may be so arranged that: the well regions are electrically separated from each other for each element by using a bulk substrate so that each of thus separated well regions stores the positive holes.

It is possible to form the volatile memory element 1 in accordance with an ordinary semiconductor process for forming a field effect transistor.

As apparent from the foregoing description, the volatile memory 1 can obtain the same effect as DRAM by incorporating a single field effect transistor which is ordinarily arranged. Further, the volatile memory 1 requires no capacitor other than the transistor unlike the DRAM, and stores electric charge in the body region and the well region. Thus, it is possible to form the volatile memory 1 with an extremely simple process, and it is easy to miniaturize a memory cell.

Next, the following embodiments 2 to 10 will detail a nonvolatile memory element 3 constituting the semiconductor storage device and the semiconductor device of the present invention.

Embodiment 2

Figure 3:
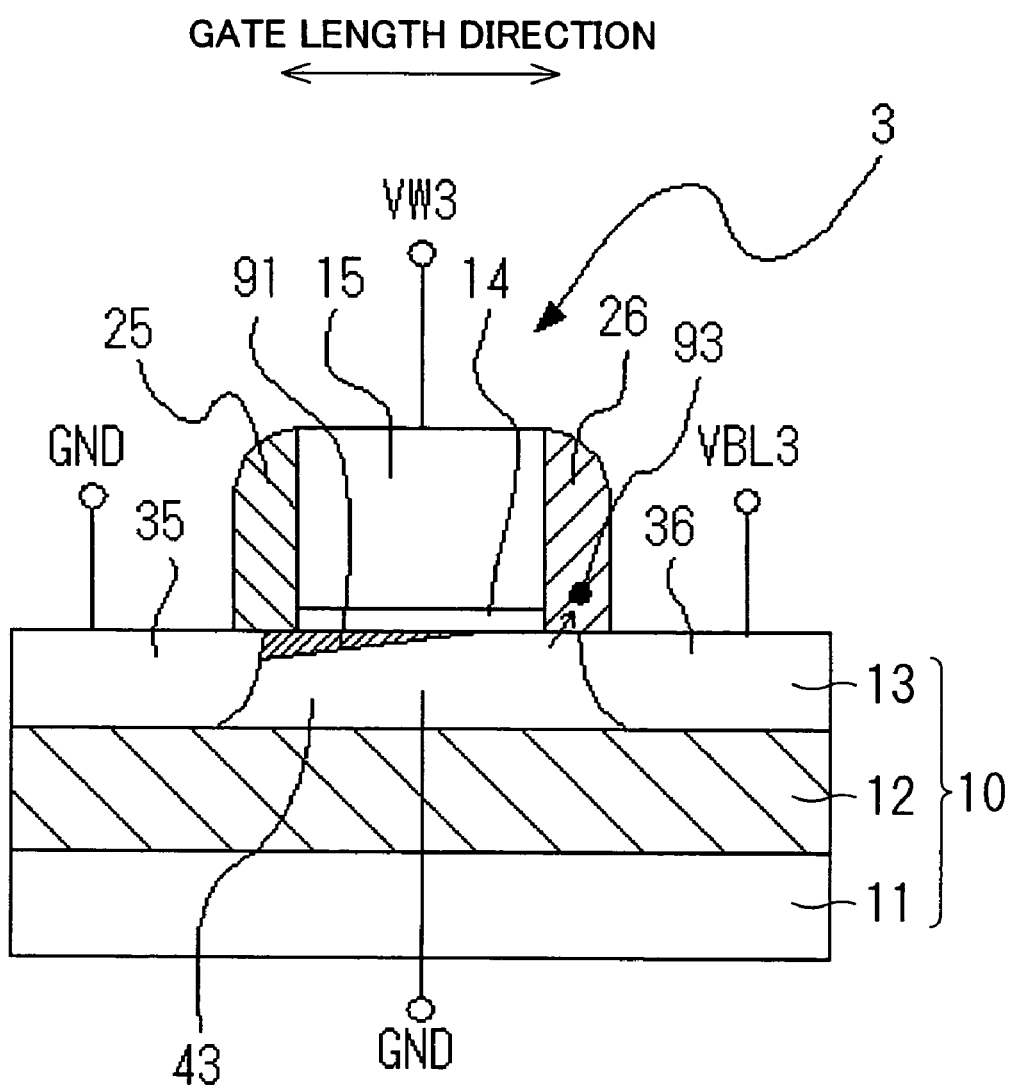
FIG. 3 is a longitudinal sectional view, showing a nonvolatile memory element constituting a semiconductor storage device or a semiconductor device of another embodiment of the present invention, which schematically illustrates a writing operation performed with respect to a second memory function section.
Figure 4:
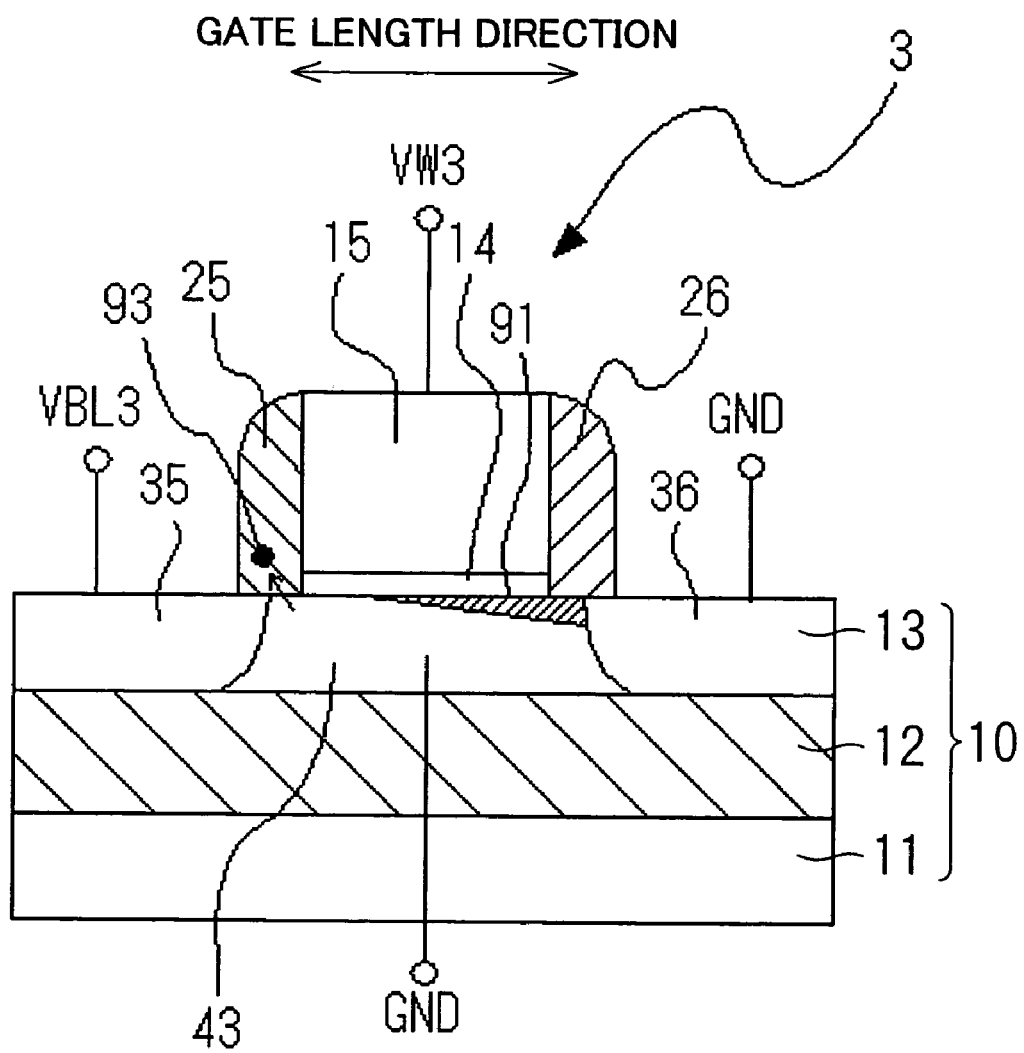
FIG. 4 is a longitudinal sectional view schematically illustrating a writing operation performed with respect to a first memory function section of the nonvolatile memory element shown in FIG. 3.

Each of FIG. 3 and FIG. 4 shows a structure of the nonvolatile memory element (semiconductor device, semiconductor storage device) of the embodiment of the present invention. As shown in FIG. 3, the nonvolatile memory element (second field effect transistor) 3 is constituted mainly of diffusion layer regions (third and fourth diffusion layer regions) 35 and 36, a body region 43, memory function sections 25 and 26, a gate insulating film 14, and a gate electrode 15. Each of the diffusion layer regions 35 and 36 is a first conduction type region (the one of a P-type region and an N-type region). The body region 43 is a second conduction type region (the other of the P-type region and the N-type region) provided between the diffusion layer regions 35 and 36. The memory function sections 25 and 26 are electric charge retaining sections that are provided on the semiconductor substrate 10 so as to respectively cover (i) a borderline between the diffusion layer region 35 and the body region 43 and (ii) a borderline between the diffusion layer region 36 and the body region 43. The gate insulating film 14 is formed on the semiconductor substrate 10 so as to be positioned between both the memory function sections 25 and 26. The gate electrode 15 is formed on the gate insulating film 14 so as to be positioned between both the memory function sections 25 and 26.

Alternatively, the nonvolatile memory element 3 is constituted mainly of the gate electrode 15, the memory function sections (gate side wall insulating films) 25 and 26, the diffusion layer regions (source/drain regions) 35 and 36, and a channel region (not shown). The gate insulating film 14 is formed on the semiconductor substrate 10. The gate electrode 15 is formed on the gate insulating film 14. The memory function sections 25 and 26 are formed on the gate electrode 15's both side walls in a gate length direction. The diffusion layer regions (source/drain regions) 35 and 36 are respectively disposed on the semiconductor substrate 10 so as to be positioned opposite to the gate electrode 15 surrounded by the memory function sections 25 and 26. The channel region is disposed on the semiconductor substrate 10 so as to be positioned under the gate electrode 15.

The nonvolatile memory element 3 causes electric charge retaining films (each of the films retains and stores electric charge), each of which constitutes each of the memory function sections 25 and 26, to store binary or more information, so that the nonvolatile memory element 3 functions as a nonvolatile memory which stores quaternary or more information. Further, the nonvolatile memory element 3 functions also as a memory cell which functions as both a selection transistor and a memory transistor due to variable resistance effect caused by the memory function sections 25 and 26. However, it is not necessary to make the nonvolatile memory element 3 store quaternary or more information, but it is possible to make the nonvolatile memory element 3 store binary information for example.

It is preferable that the nonvolatile memory element 3, which functions as the semiconductor storage device (semiconductor device) of the embodiment of the present invention, is formed on the semiconductor substrate 10, preferably on the first conduction type well region (either the P-type well region or the N-type well region) formed in the semiconductor substrate 10.

The semiconductor substrate 10 is not particularly limited as long as it is used in the semiconductor device. Examples of materials for the semiconductor substrate 10 include a bulk substrate constituted of a semiconductor (elemental semiconductor such as silicon and germanium) and a compound semiconductor (GaAs, InGaAs, ZnSe, and GaN and the like). Further, it is possible to use a substrate having a semiconductor layer on a surface thereof, and it is possible to use various substrates such as an SOI (Silicon on Insulator) substrate or a multilayer SOI substrate, and it is possible to use a substrate obtained by forming a semiconductor layer on a glass or plastic substrate. Particularly, it is preferable to use the silicon substrate or the SOI substrate obtained by forming a silicon layer on a surface thereof. A semiconductor member constituted of a semiconductor substrate or a semiconductor layer may be monocrystal (for example, based on epitaxial growth), porycrystal, or amorphous though there is slight difference in terms of an amount of an internally flowing current.

It is preferable that an element separation region is formed on the semiconductor member constituted of the semiconductor substrate or the semiconductor layer, and it may be so arranged that elements such as a transistor, a capacitor, and a resistor, a circuit constituted thereof, a semiconductor device, and an interlayer insulating film are combined with each other so as to have a single or a multilayer structure. Note that, the element separation region can be constituted of various kinds of element separation films such as a LOCOS film, a trench oxide film, and an STI film.

The semiconductor substrate 10 may have a P-type conduction well region or an N-type conduction well region. That is, it is preferable to form at least one of the first conduction type well regions (either the P-type well region or the N-type well region). The impurity concentration of the semiconductor substrate 10 and the well region can be set to be in a range conventionally known. Note that, in case of using the SOI substrate as the semiconductor substrate 10, the well region may be formed on a surface semiconductor layer, but the body region may be formed under the channel region.

Ordinarily, the gate insulating film 14 or the insulating film is not particularly limited as long as it is used in the semiconductor device. Examples of materials thereof include an insulating film (a monolayer film such as a silicon oxide film and a silicon nitride film, or a staking film constituted thereof), or a monolayer film of a high-dielectric film such as an oxide aluminium film, an oxide titanium film, an oxide tantalum film, and an oxide hafunium film, or a staking film constituted thereof. Particularly, the silicon oxide film is preferable.

It is appropriate to set a thickness of the gate insulating film 14 to be approximately 1 to 20 nm for example, preferably approximately 1 to 6 nm. The gate insulating film 14 may be formed merely under the gate electrode 15, and may be formed so as to be larger (wider) than the gate electrode 15.

The gate electrode 15 is formed on the gate insulating film 14 and is shaped so that the gate electrode 15 is ordinarily used in the semiconductor device or is shaped so that its lower end is concaved. Note that, a single gate electrode 15 means a gate electrode 15 integrally formed without being separated by a monolayer or multilayer conduction film. Further, the gate electrode 15 may have side wall insulating films on both sides thereof.

The gate electrode 15 is not particularly limited as long as it is ordinarily used in the semiconductor device and is constituted of a conduction film. An example of materials thereof includes a monolayer film of polysilicon and metal (copper, aluminium, and the like), or a multilayer film constituted thereof. Further, the metal may be a high melting point metal such as tungsten, titanium, and tantalum. Moreover, as the conduction film, it is possible to use a monolayer film constituted of silicide or the like or a stacking film constituted of silicide and the high melting point metal. It is appropriate to set a thickness of the gate electrode 15 to be approximately 50 to 400 nm for example. Note that, a channel region is formed under the gate electrode 15.

Each of the memory function sections 25 and 26 includes at least a film or a region which retains electric charge, or stores and retains electric charge, or traps electric charge, or keeps a charge polarization state. Examples of materials having these functions include silicate glass containing impurity such as silicon nitride, silicon, and boron, silicon carbide, alumina, zinc oxide, ferroelectric material, metal, and the like. Further, examples of materials having these functions include high dielectric material such as hafnium oxide, zirconium oxide, and tantalum oxide.

Each of the memory function sections 25 and 26, for example, includes: an insulating film containing a silicon nitride film; an insulating film containing a conduction film or a semiconductor layer therein; an insulating film containing one or more conductor dots or one or more semiconductor dots; a monolayer or stacking structure constituted of an insulating film containing ferroelectric material in which internal electric charge is polarized by an electric field and the condition is kept. Particularly, the silicon nitride film can realize a hysteresis property since the silicon nitride film has a large number of multiplicities for trapping the electric charge. Further, a time in which the electric charge is retained is long, and there is no problem such as leakage of electric charge due to a leak path, so that the silicon nitride film is preferable in terms of the retaining property. Further, the silicon nitride film is ordinarily used in the LSI process, so that the silicon nitride film is preferable.

In the nonvolatile memory element 3, the insulating films each of which internally contains an insulating film such as a silicon nitride film which retains electric charge are used as the memory function sections 25 and 26, so that it is possible to improve the reliability in retaining information. This is based on the following property: since the silicon nitride film has an insulating property, even when the leakage of the electric charge partially occurs, the whole silicon nitride film hardly loses the electric charge immediately.

Further, in case where a plurality of nonvolatile memory elements 3 are disposed, even when the nonvolatile memory elements 3 come close to each other and a memory function section 25 comes into contact with a memory function section 26 of an adjacent nonvolatile memory element 3 and the memory function section 26 comes into contact with a memory function section 25 of an adjacent nonvolatile memory element 3, information respectively stored in the memory function sections 25 and 26 are not lost unlike the case where each of the memory function sections 25 and 26 is constituted of the conductor. Further, a contact plug can be disposed closer to the memory function sections 25 and 26, and the contact plug can be disposed so as to overlap the memory function sections 25 and 26 in some cases, so that it is easy to miniaturize the nonvolatile memory element 3.

Further, in the nonvolatile memory element 3, the insulating film which retains the electric charge does not have to be film-shaped in improving the reliability concerning information retention, and it is preferable that insulators each of which retains the electric charge are provided separately from each other. Specifically, it is preferable that insulators each of which retains the electric charge are dispersed in a material which hardly retains the electric charge, for example, in silicon oxide, so as to be like dots.

Further, in case of using insulator films each of which internally contains the conduction film or the semiconductor layer as the memory function sections 25 and 26, it is possible to control an amount of electric charge injected into the conduction film or the semiconductor layer, so that it is easy to make information thereof multi-valued.

Further, in case of using insulating films each of which contains one or more conductor dots or one or more semiconductor dots as the memory function sections 25 and 26, it is easy to write and erase information on the basis of a tunnel effect of the electric charge (direct tunneling of the electric charge), so that it is possible to realize lower power consumption.

Further, as the memory function sections 25 and 26, ferroelectric films, such as PZT and PLZT, whose polarization direction is varied by the electric field, may be used. In this case, polarization causes the electric charge to substantially occur in a surface of the ferroelectric film, and this condition is kept. Thus, each of the memory function sections 25 and 26 can realize a hysteresis property as in a film having such a memory function that the electric charge is supplied from the outside of the film and thus supplied electric charge is trapped. Further, it is not necessary to inject the electric charge from the outside of the film in causing the ferroelectric film to retain the electric charge, and it is possible to obtain the hysteresis property merely by polarizing the electric charge inside the film, so that it is possible to write and erase information at high speed.

That is, it is preferable that each of the memory function sections 25 and 26 further includes a region which makes it difficult for the electric charge to escape or a film which makes it difficult for the electric charge to escape. As an example of the film which makes it difficult for the electric charge to escape, it is possible to use a silicon oxide film and the like.

The electric charge retaining films contained in the memory function sections 25 and 26 are formed on both sides of the gate electrode 15 directly or via the insulating films, and the electric charge retaining films are disposed directly on the semiconductor substrate 10 (the well region, the body region or the diffusion layer regions (source/drain regions) 35 and 36) or above the semiconductor substrate 10 with the gate insulating film 14 or the insulating film intervening therebetween.

It is preferable that the electric charge retaining films (memory function sections 25 and 26) provided on both sides of the gate electrode 15 are disposed so as to entirely or partially cover the side walls of the gate electrode 15 directly or via the insulating film. The following is an example of how such arrangement is applied. In case where the gate electrode 15 has a concave in its lower end, the memory function sections 25 and 26 may be formed so as to entirely or partially fill the concave directly or via the insulator film (gate insulating substrate 14).

It is preferable that: the gate electrode 15 is constituted merely of the side walls of the memory function sections 25 and 26, or upper portions of the memory function sections 25 and 26 are not covered. Due to such arrangement, it is possible to dispose the contact plug closer to the gate electrode 15, so that it is easy to miniaturize the nonvolatile memory element 3. Further, it is easy to manufacture the nonvolatile memory element 3 having such a simple structure, so that it is possible to improve the yield thereof.

In case of using the conduction films as the electric charge retaining films of the memory function sections 25 and 26, it is preferable to dispose the electric charge retaining film via the insulating film so as not to directly contact the semiconductor substrate 10 (the well region, the body region or the diffusion layer regions (source/drain regions) 35 and 36) or the gate electrode 15. Examples of a structure of the memory function sections 25 and 26 in this case include (i) a structure in which the conduction film and the insulating film are stacked, (ii) a structure in which the conduction films are dispersed in the insulating film like dots, and (iii) a structure in which the conduction film is disposed in an internal part of the side wall insulating film formed on the side wall of the gate.

The diffusion layer regions (source/drain regions) 35 and 36 are respectively disposed in the semiconductor substrate 10 so as to be positioned under the memory function sections 25 and 26 with them opposite to the gate electrode 15. It is preferable that: a slope indicative of the impurity concentration is so steep that the impurity concentration greatly varies in a junction surface between (i) the diffusion layer regions 35 and 36 and (ii) the semiconductor substrate 10 or the well region. This is because: a hot electron or a hot hole occurs with high efficiency at a lower voltage, so that a high-speed operation is realized at a lower voltage.

A junction depth of the diffusion layer regions 35 and 36 is not particularly limited. It is possible to adjust the junction depth as required in accordance with a performance and the like of a target semiconductor storage device (nonvolatile memory element 3). Note that, in case of using the SOI substrate as the semiconductor substrate 10, the junction depth of the diffusion layer regions 35 and 36 may be smaller than a thickness of a surface semiconductor layer (for example, an SOI layer 13 described later), but it is preferable that the junction depth is substantially the same as the thickness of the surface semiconductor layer.

The diffusion layer regions (source/drain regions) 35 and 36 may be disposed so as to overlap (partially overlap) end portions of the gate electrode 15, and may be disposed so as to be offset by the end portions of the gate electrode 15 (so as not to overlap the end portions of the gate electrode 15). Particularly, in case where the diffusion layer regions 35 and 36 are offset, when a voltage is applied to the gate electrode 15, a condition under which the offset region under the memory function sections 25 and 26 tends to invert is greatly varied depending on an amount of the electric charge stored in the memory function sections 25 and 26, so that the memory effect increases, and the short channel effect decreases. Thus, such arrangement is preferable.

However, when the diffusion layer regions 35 and 36 are extraordinarily offset, a driving current flowing between two diffusion layer regions (source/drain regions) 35 and 36 becomes extremely small. Specifically, it is preferable that a distance between (a) an end of a gate electrode in a gate length direction and (b) the source or the drain region closer to that end of the gate electrode is shorter than a thickness of the electric charge retaining film which is parallel to the gate length direction. It is particularly important that at least one part of an electric charge storing region (electric charge retaining film) of each of the memory function section 25 and 26 overlaps a part of the source or drain region which functions as the diffusion layer region.

The diffusion layer regions (source/drain regions) 35 and 36 may be partially extended to a surface of the channel region, i.e., may be partially extended so as to be higher than an under face of the gate insulating film 14. In this case, it is appropriate that the conduction film is integrally stacked on the diffusion layer regions 35 and 36 formed in the semiconductor substrate 10. Examples of the conduction film include a semiconductor such as polysilicon and amorphous silicon, silicide, the aforementioned metal, a high melting point metal, and the like. Particularly, polysilicon is preferable. The impurity diffusion ratio is much higher than that of the semiconductor substrate 10, so that it is easy to reduce the junction depth of the diffusion layer regions 35 and 36 in the semiconductor substrate 10, and it is easy to suppress the short channel effect. Note that, in this case, it is preferable that: at least one part of the memory function section 25 is surrounded by a part of the diffusion layer region 35 and a part of the gate electrode 15, and at least one part of the memory function section 26 is surrounded by a part of the diffusion layer region 36 and a part of the gate electrode 15.

Figure 30:
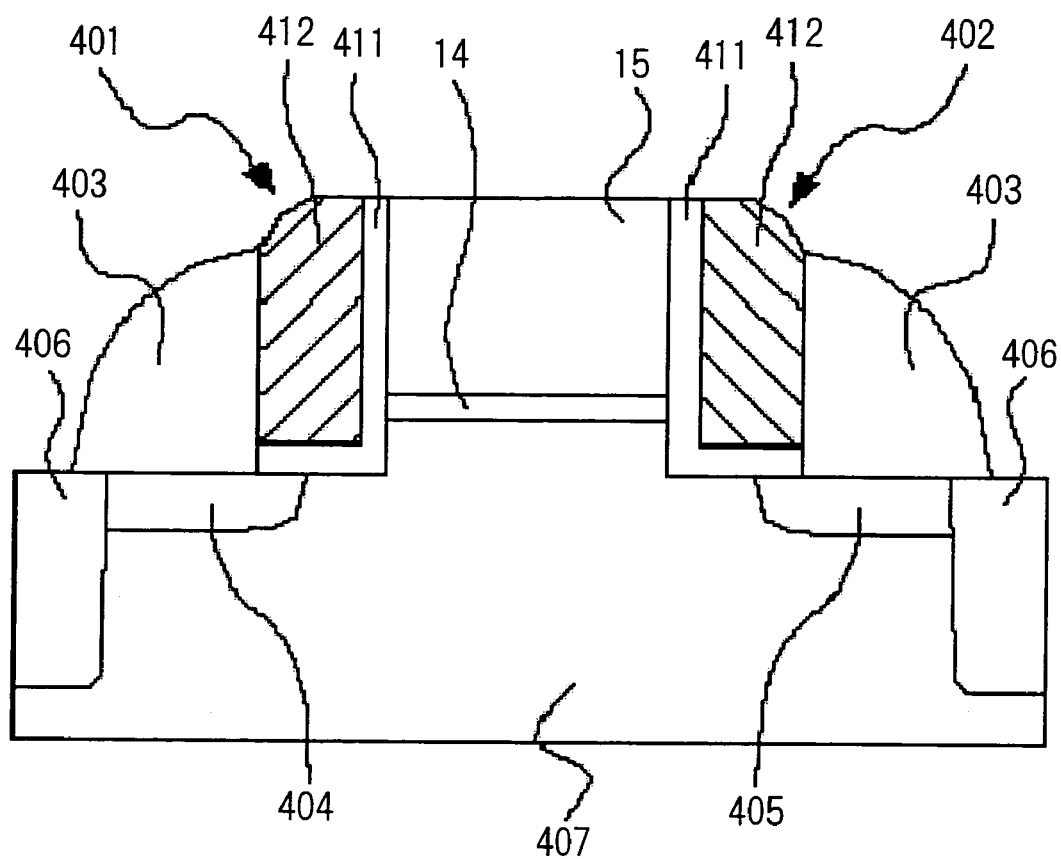
FIG. 30 is a schematic sectional view of an important portion showing another example of the semiconductor device shown in FIG. 3.

Here, FIG. 30 shows an example of a case where the source/drain regions are formed so as to be partially positioned higher than the surface of the channel region. The conductive side walls 403 each of which is constituted, for example, of polysilicon or amorphous silicon are formed on side walls of memory function sections 401 and 402. The source/drain regions are formed as follows: after injecting impurities into the conductive side walls 403, the impurities are dispersed by performing a thermal process. At this time, the impurities are dispersed also in a semiconductor substrate 407 (regions 404 and 405). In this case, the source region (or the drain region) is constituted of the side walls 403 and the region 404 (or the region 405). Thus, a part of the source and the drain is positioned higher than the surface of the channel region.

Note that, each of the memory function sections 401 and 402 is constituted of (i) a silicon nitride film 412 which is a side-wall-shaped first insulating film and (ii) a silicon oxide film 411. The silicon oxide film 411 is a second insulating film which separates the silicon nitride film 412 from the gate electrode 15, the semiconductor substrate 407, and the diffusion layer region 404 (or the diffusion layer region 405). Here, it is the silicon nitride film 412 that can store the electric charge (electrons or positive holes), and the silicon oxide film 411 prevents the electric charge stored in the silicon nitride film 412 from leaking. Further, 406 represents the element separation region.

According to the foregoing arrangement, a thickness of the source and the drain increases compared with the case where the source/drain regions are constituted merely of the regions 404 and 405, so that it is possible to reduce the source/drain resistance. Thus, it is possible to increase a speed of the writing operation performed by the memory element. Further, in case where the conductive side walls 403 are made of polysilicon or amorphous silicon, the impurity dispersion ratio of polysilicon or amorphous silicon is much higher than that of the semiconductor substrate 407, so that it is easy to make a thickness of the regions 404 and 405 much thinner in a vertical direction on paper (a direction orthogonal to a gate length direction and a stacking direction of the semiconductor substrate 407 and the gate electrode 15). That is, it is easy to make the junction depth of the source/drain regions shorter. Thus, it is easy to miniaturize the memory element.

It is possible to form the nonvolatile memory element 3 of the embodiment of the present invention in accordance with an ordinary semiconductor process, for example, in accordance with the same process as a process for forming wide wall spacers (memory function sections 25 and 26) having a monolayer or stacking structure on side walls of the gate electrode 15. Specifically, examples of the process are as follows.

A first process is such that: after forming the gate electrode 15 or an electrode, the electric charge retaining film is formed as a monolayer film, or a stacking film is formed in an order of the electric charge retaining film and the insulating film, or in an order of the insulating film and the electric charge retaining film, or in an order of the insulating film, the electric charge retaining film, and the insulating film. Further, the film is etched-back under an appropriate condition so as to be remain in a side wall spacer shape.

A second process is such that: the insulating film or the electric charge retaining film is formed, and the film is etched-back under an appropriate condition so as to remain in a side wall spacer shape, and the electric charge retaining film or the insulating film is formed so as to remain in a side wall spacer shape likewise.

A third process is such that: an insulating-film material in which particulate electric-charge-retaining material is dispersed is applied or is deposited on the semiconductor substrate 10 containing the gate electrode 15, and the film is etched-back under an appropriate condition so that the insulating-film material remains in a side wall spacer shape.

A fourth process is such that: after forming the gate electrode 15, the monolayer film or the stacking film is formed, and the film is patterned by using a mask.

A fifth process is such that: before forming the gate electrode 15 or the electrode, the electric charge retaining film is formed as a monolayer film, or a stacking film is formed in an order of the electric charge retaining film and the insulating film, or in an order of the insulating film and the electric charge retaining film, or in an order of the insulating film, the electric charge retaining film, and the insulating film. Further, an opening is formed in a region which functions as a channel region of the films, and a gate electrode material film is formed on the whole upper surface, and the gate electrode material film is patterned so widely that its opening is covered.

In case where the nonvolatile memory elements 3 of the embodiment of the present invention are disposed so as to constitute a memory cell array, the best modes of the nonvolatile memory elements 3 are as follows for example.

(1) The gate electrodes 15 of the nonvolatile memory elements 3 integrally function as a word line.

(2) The memory function sections 25 and 26 are formed on both sides of the word line.

(3) It is an insulator, particularly a silicon nitride film, that retains the electric charge in the memory function sections 25 and 26.

(4) Each of the memory function sections 25 and 26 is constituted of an ONO (Oxide Nitride Oxide) film, and the silicon nitride film has a surface substantially parallel to a surface of the gate insulating film.

(5) The silicon nitride films in the memory function sections 25 and 26 are separated from each other by the word line, the channel region, and the silicon oxide film.

(6) The silicon nitride films in the memory function sections 25 and 26 overlap the diffusion layer regions 35 and 36.

(7) A thickness of the gate insulating film 14 is different from a thickness of the insulating film which separates the silicon nitride film having a surface substantially parallel to a surface of the gate insulating film 14 from the channel region or the semiconductor layer.

(8) Information is written and erased in and from a single nonvolatile memory element 3 by means of a single word line.

(9) There is no electrode (word line), which gives assistance in the writing or erasing operation, on the memory function sections 25 and 26.

(10) A region, having high impurity, whose conduction type is opposite to that of the diffusion layer regions 35 and 36, is provided on a portion, positioned below the memory function sections 25 and 26, which contacts the diffusion layer regions 35 and 36.

That is, the nonvolatile memory element 3 is in the best mode when satisfying all the foregoing requirements, but it is not necessary to satisfy all the foregoing requirements.

In the nonvolatile memory element 3, when some of the foregoing requirements are satisfied, a particularly preferable combination thereof can be obtained. An example of the particularly preferable combination is the following combination.

(3) It is an insulator, particularly a silicon nitride film, that retains the electric charge in the memory function sections 25 and 26.

(9) There is no electrode (word line), which gives assistance in the writing or erasing operation, on the memory function sections 25 and 26.

(6) The silicon nitride films in the memory function sections 25 and 26 overlap the diffusion layer regions 35 and 36.

That is, the inventors of the present invention found that: in the case where it is an insulator that retains the electric charge in the memory function sections 25 and 26 and there is no electrode, which gives assistance in the writing or erasing operation, on the memory function sections 25 and 26, the writing operation is performed in a preferable manner only when the insulating films (silicon nitride films) in the memory function sections 25 and 26 overlap the diffusion layer regions 35 and 36. This means that: when the requirements (3) and (4) are satisfied, it is essential to satisfy the requirement (6).

While, in the case where it is the conductor that retains the electric charge in the memory function sections 25 and 26, even when the conductors in the memory function sections 25 and 26 do not overlap the diffusion layer regions 35 and 36, it is possible to perform the writing operation. This is because the conductor in each of the memory function sections 25 and 26 gives assistance in the writing operation by coupling with the writing electrode in terms of the capacitance. Further, in the case where there is an electrode, which gives assistance in the writing of erasing operation, on the memory function sections 25 and 26, even when the conductors in the memory function sections 25 and 26 do not overlap the diffusion layer regions 35 and 36, it is possible to perform the writing operation.

However, in the case where it is not the conductor but the insulating film that retains the electric charge in the memory function sections 25 and 26, and there is no electrode, which gives assistance in the writing or erasing operation, on the memory function sections 25 and 26, it is possible to obtain the following great effects.

First, it is possible to dispose a bit line contact closer to the memory function sections 25 and 26 on the word line side walls. Alternatively, it is possible to keep the stored information without being interfered with by a plurality of the memory function sections 25 and 26 even when the nonvolatile memory elements 3 come close to each other. Thus, it is easy to miniaturize the nonvolatile memory element 3. Adversely, in case where the electric charge retaining regions of the memory function sections 25 and 26 are conductors, the storage of the information is interfered with between the electric charge retaining regions as the nonvolatile memory elements 3 come closer to each other due to the capacitance coupling, so that it is impossible to keep the stored information.

Further, in case where the electric charge retaining regions in the memory function sections 25 and 26 are insulators (for example, silicon nitride films), it is not necessary to electrically separate a memory function section 25 from another memory function section 26 for each memory cell. For example, it is not necessary to separate the memory function sections 25 and 26, formed on both sides of a single word line shared by a plurality of memory cells, from each other for each memory cell, so that the memory function sections 25 and 26 formed on both sides of the single word line can be shared by the plurality of memory cells that share the word line. Thus, it is not necessary to perform the photo process and the etching process by which the memory function section is separated, so that the manufacturing steps are simplified. Further, a margin for positioning the photo and a margin for film reduction brought about in etching are not required, so that it is possible to reduce the margin between the memory cells. Thus, compared with the case where the electric charge retaining regions in the memory function sections 25 and 26 are conductors (for example, polycrystalline silicon films), it is possible to make an area occupied by the memory cells smaller even when the nonvolatile memory element 3 is formed at the same level of the process for miniaturize it. Adversely, in case where the electric charge retaining regions in the memory function sections 25 and 26 are conductors, it is necessary to perform the photo process and the etching process for separating the memory function sections 25 from each other and for separating the memory function sections 26 from each other for each memory cell, so that the margin for positioning the photo and the margin for film reduction brought about in etching are required.

Further, there is no electrode, which gives assistance in the writing or erasing operation, on the memory function sections 25 and 26, and a structure of the element is simple, so that the number of manufacturing steps decreases, so that it is possible to improve the yield thereof, and it is easier to provide the element in combination with a transistor constituting a logic circuit and an analog circuit.

Further, as an extremely important matter of design, the inventors of the present invention found the following characteristics. That is, even in the case where the electric charge retaining regions in the memory function sections 25 and 26 are insulators, and there is no electrode, which gives assistance in the writing or erasing operation, on the memory function sections 25 and 26, it is possible to write and erase information at an extremely low voltage by causing the electric charge retaining regions in the memory function sections 25 and 26 to overlap the diffusion layer regions 35 and 36. Further, in addition, by satisfying the foregoing two conditions, it is possible to reduce the area occupied by the cells, and it is possible to improve the yield thereof on the basis of simplification of the manufacturing steps, and it is possible to reduce the manufacturing cost.

Specifically, as to the foregoing voltage, the inventors of the present invention found that the writing or erasing operation can be performed at a low voltage of not more than 5V. This function exhibits a great effect in designing the circuit. That is, it is not necessary to generate a high voltage in the chip unlike a flash memory, so that it is possible to omit or minify a charge pump circuit which requires a large area. Particularly, in case where a memory whose capacitance is small is provided in a logic LSI as an adjusting memory, an area occupied by peripheral circuits for driving the memory cells is larger than an area occupied by the memory cells, so that it is possible to omit or minify a memory cell voltage boosting circuit. This is most effective in reducing the chip size.

As apparent from the foregoing description, it is particularly preferable that the nonvolatile memory element 3 satisfies the requirements (3), (9), and (6).

Next, the following description will further detail a structure of the nonvolatile memory element 3 and how the nonvolatile memory element 3 operates, with reference to FIG. 3 to FIG. 6.

FIG. 3 is a cross sectional view schematically showing the nonvolatile memory element 3, and shows a case where an N-channel-type nonvolatile memory element 3 is formed on the semiconductor substrate constituted of an SOI substrate. In the semiconductor substrate 10, an embedded oxide film 12 is formed on a silicon substrate 11, and an SOI layer 13 which functions as a surface semiconductor layer is formed thereon. In the SOI layer 13, the P-type body region 43 and N-type diffusion layer regions 35 and 36 are formed.

Above the body region 43, the gate electrode 15 made of polysilicon is formed via the gate insulating film 14 constituted of a gate oxide film. On side walls of the gate electrode 15, gate side wall insulating films each of which is constituted of a silicon nitride film, that is, the memory function sections 25 and 26 are formed. The memory function sections 25 and 26 respectively constitute the first and second electric charge retaining sections.

The diffusion layer regions 35 and 36 are not positioned under the gate electrode 15 of the SOI layer 13. That is, the diffusion layer regions 35 and 36 are disposed so as to be offset by end portions of the gate electrode 15 (by a region in which the gate electrode 15 is formed). That is, the diffusion layer regions 35 and 36 are formed so as not to overlap the gate electrode 15 and so as to respectively overlap the memory function sections 25 and 26's end portions, positioned further from the gate electrode 15, in a stacking direction of the semiconductor substrate 10, the gate insulating film 14, and the gate electrode 15. Further, although not shown, it is possible to give a desired potential to the body region 43 via a terminal.

Next, how the nonvolatile memory element 3 performs the writing operation is described with reference to FIG. 3 and FIG. 4. In the nonvolatile memory element 3, an amount of electrons stored in the memory function sections 25 and 26 (gate side wall insulating films) which function as the electric charge retaining sections is read out as a threshold value difference of the field effect transistor (nonvolatile memory element 3). Here, the writing operation means to increase the threshold value of the transistor by injecting electrons into the memory function sections 25 and 26.

In the nonvolatile memory element 3, in order to inject (write) electrons into the second memory function section 26 (electric charge retaining section), as shown in FIG. 3, the diffusion layer region 35 is used as a source electrode, and the diffusion layer region 36 is used as a drain electrode. In this case, for example, a ground potential GND (0V) is applied to the diffusion layer region 35 and the body region 43, and a positive potential VBL3 (for example, +5V) is applied to the diffusion layer region 36, and a positive potential VW3 (for example, +2V) is applied to the gate electrode 15.

Under such voltage condition, an inversion layer 91 extends from the diffusion layer region 35 (source electrode) in a direction of the diffusion layer region 36 (drain electrode), but the inversion layer 91 does not reach the diffusion layer region 36 (drain electrode), so that a pinch off point occurs. Electrons 93 are accelerated from the pinch off point to the diffusion layer region 36 (drain electrode) due to a drain electric field, and are injected into the second memory function section 26, thereby writing information.

Note that, in a periphery of the first memory function section 25, the electrons accelerated by the drain electric field do not occur, so that information is not written. Further, the voltage required in writing information is not limited to the foregoing value. For example, even in case where a voltage of 0V is applied to the diffusion layer region 35 and the body region 43, and a voltage of +10V is applied to the diffusion layer region 36, and a voltage of +5V is applied to the gate electrode 15, hot electrons are injected into the second memory function section 26, so that information is written.

In this manner, in the nonvolatile memory element 3, electrons are selectively injected merely into the second memory function section 26, so that information is written.

While, in order to inject (write) electrons into the first memory function section 25 (electric charge retaining section), as shown in FIG. 4, the diffusion layer region 36 is used as a source electrode, and the diffusion layer region 35 is used as a drain electrode. For example, a ground potential 0V is applied to the diffusion layer region 36 and the body region 43, and a positive potential VBL3 (for example, +5V) is applied to the diffusion layer region 35, and a positive potential VW3 (for example, +2V) is applied to the gate electrode 15.

In this case, the electrons 93 are injected into the first memory function section 25. That is, in case where electrons are injected into the first memory function section 25, the source region and the drain region are switched unlike the case where electrons are injected into the second memory function section 26. Then, the electrons are selectively injected into only the first memory function section 25, thereby writing information.

Next, how the nonvolatile memory element 3 performs the erasing operation is described as follows with reference to FIG. 5 and FIG. 6. Here, the erasing operation means to decrease the electrons stored in the memory function sections 25 and 26, so as to decrease the threshold value of the transistor. The following description will sequentially explain two erasing processes.

Figure 5:
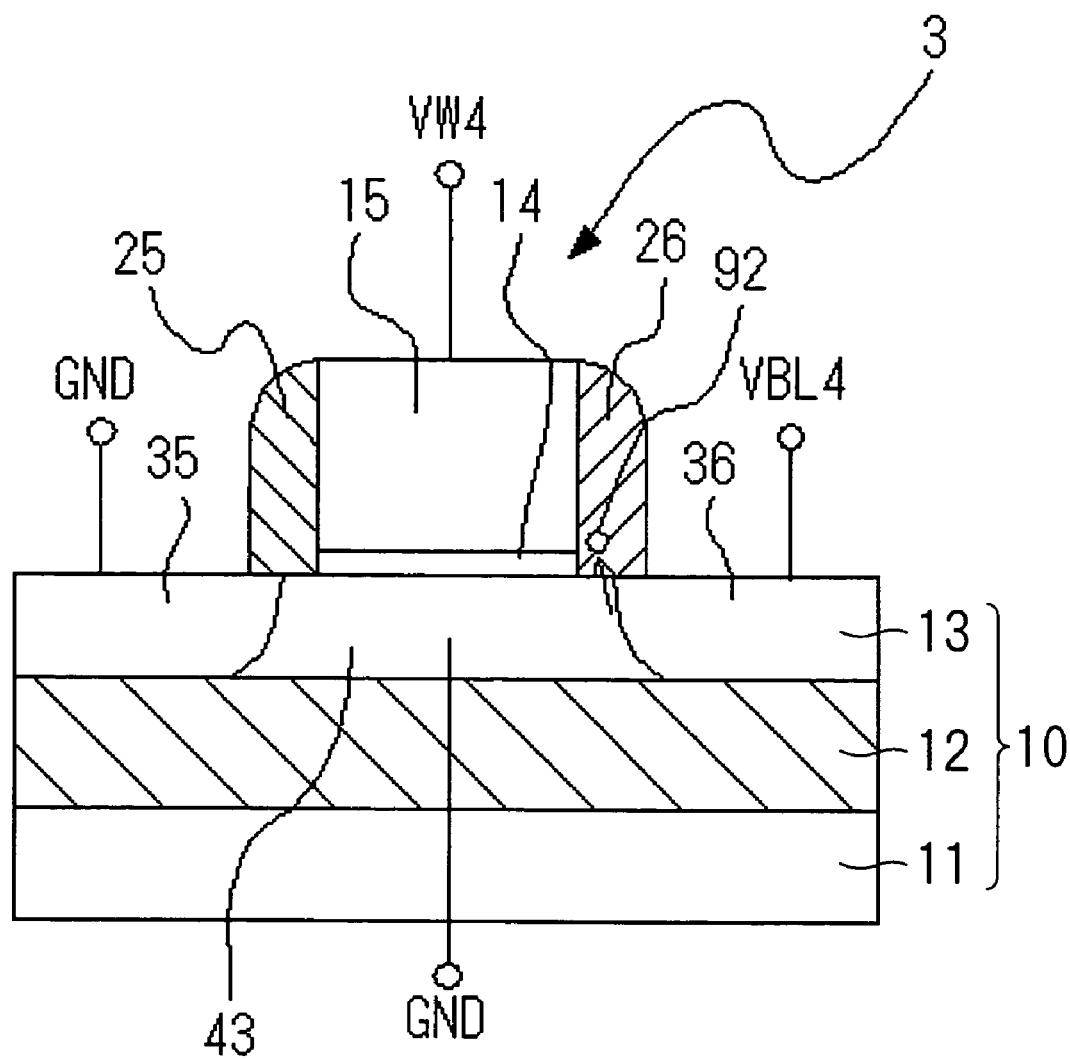
FIG. 5 is a longitudinal sectional view schematically illustrating a first erasing operation in the nonvolatile memory element shown in FIG. 3.

In the first process, in case of erasing information stored in the second memory function section 26, as shown in FIG. 5, a positive voltage VBL4 (for example, +6V) is applied to the diffusion layer region 36, and a ground potential GND (0V) is applied to the body region 43, and the PN junction between the diffusion layer region 36 and the body region 43 is biased backward, and a negative potential VW4 (for example, −5V) is applied to the gate electrode 15.

At this time, in the PN junction, a portion near to the gate electrode 15 to which the negative voltage has been applied has a potential which is indicated by a particularly steep slope. Thus, in the PN junction, hot holes (high-energy positive holes) occur on the side of the body region 43 due to a tunnel effect between bands. The hot holes are attracted toward the gate electrode 15 having the negative potential. As a result, the holes are injected into the second memory function section 26. Thus, the erasing operation is performed with respect to the second memory function section 26. Note that, a voltage of 0V is applied to the diffusion layer region 35 at this time.

While, in case of erasing information stored in the first memory function section 25, a potential of the diffusion layer region 35 and a potential of the diffusion layer region 36 are switched unlike the foregoing process.

Figure 6:
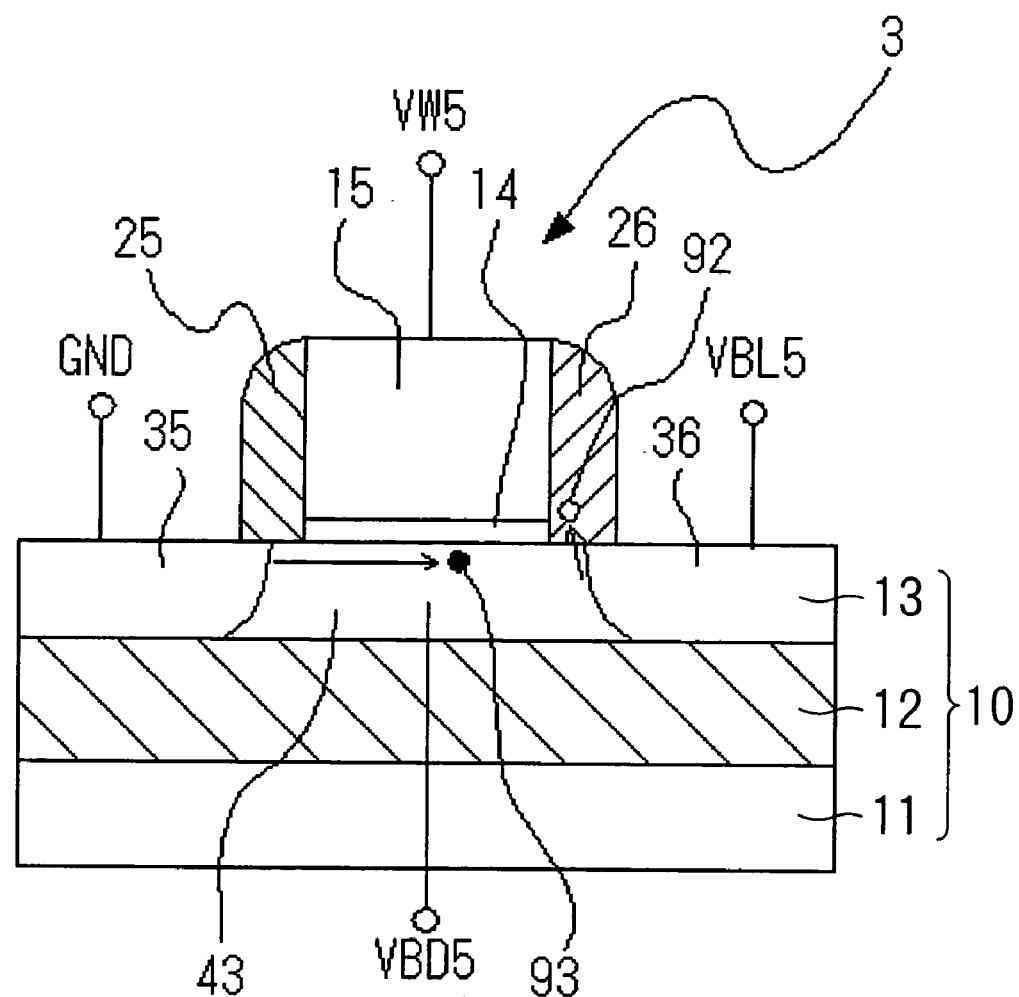
FIG. 6 is a longitudinal sectional view schematically illustrating a second erasing operation in the nonvolatile memory element shown in FIG. 3.

In the second process, in case of erasing information stored in the first memory function section 25, as shown in FIG. 6, a positive voltage VBL5 (for example, +5V) is applied to the diffusion layer region 36, and a ground potential GND (0V) is applied to the diffusion layer region 35, and a positive voltage VBD5 (for example, +0.8V) is applied to the body region 43.

At this time, a forward voltage is applied between the body region 43 and the diffusion layer region 35, and electrons 93 are injected into the body region 43. Thus injected electrons 93 diffuse to the PN junction between the body region 43 and the diffusion layer region 36, and the electrons are accelerated by a strong electric field so as to be hot electrons. The hot electrons bring about a pair of electrons and positive holes in the PN junction. That is, a forward voltage is applied between the body region 43 and the diffusion layer region 35, so that the electrons injected into the body region 43 cause positive holes to occur in the PN junction positioned opposite thereto. The positive holes which have occurred in the PN junction are attracted to the gate electrode 15 having the negative potential. As a result, the positive holes are injected into the second memory function section 26.

According to the second process, even in case where merely an insufficient voltage which fails to bring about the hot holes due to the tunnel effect between bands is applied to the PN junction between the body region 43 and the diffusion layer region 36, it is possible to bring about the positive holes. Thus, it is possible to drop a voltage in performing the erasing operation. Particularly, in case where the diffusion layer regions 35 and 36 are not positioned under the gate electrode 15 (that is, in case where the gate electrode 15 is offset), it is general that a slope indicative of a potential in the PN junction is not steep due to the gate electrode 15 to which the negative potential has been applied. Thus, it is difficult to bring about the hot holes due to the tunnel effect between bands. The second process solves such problem, thereby realizing the erasing operation at a low voltage.

Note that, in case of erasing information stored in the second memory function section 26, the first process requires a voltage of +6V to be applied to the diffusion layer region 36, but the second process requires merely a voltage of +5V to be applied to the diffusion layer region 36. In this manner, according to the second process, it is possible to reduce a voltage in performing the erasing operation, so that the power consumption is reduced. As a result, it is possible to prevent the storage element from being deteriorated by the hot carrier.

Further, also in the second erasing process, in case of erasing information stored in the first memory function section 25, a potential of the diffusion layer region 35 and a potential of the diffusion layer region 36 are switched likewise.

Next, how the nonvolatile memory element 3 performs a reading operation is described as follows.

In case of reading information stored in the first memory function section 25, the diffusion layer region 35 is used as a source electrode, and the diffusion layer region 36 is used as a drain electrode, and the transistor is caused to operate in a saturation state. For example, a voltage of 0V is applied to the diffusion layer region 35 and the body region 43, and a voltage of +2V is applied to the diffusion layer region 36, and a voltage of +1V is applied to the gate electrode 15.

At this time, in case where electrons are not stored in the first memory function section 25, a drain current tends to flow. While, in case where the electrons are stored in the first memory function section 25, the inversion layer is hardly formed in the periphery of the first memory function section 25, so that a drain current hardly flows. Thus, by detecting the drain current, it is possible to read information stored in the first memory function section 25. At this time, whether the electric charge is stored or not in the second memory function section 26 does not influence the drain current since a periphery of the drain is pinched off.

In case of reading information stored in the second memory function section 26, the diffusion layer region 36 is used as a source electrode, and the diffusion layer region 35 is used as a drain electrode, and the transistor is caused to operate in a saturation state. For example, a voltage of 0V is applied to the diffusion layer region 36 and the body region 43, and a voltage of +2V is applied to the diffusion layer region 35, and a voltage of +1V is applied to the gate electrode 15.

In this manner, the source region and the drain region are switched unlike the case of reading information stored in the first memory function section 25, so that it is possible to read information stored in the second memory function section 26.

Note that, in case where a channel region (offset region) remains uncovered by the gate electrode 15, the inversion layer disappears or is formed in the channel region, which is not covered by the gate electrode 15, depending on whether there are surplus electrons or not in the memory function section. As a result, it is possible to obtain a large hysteresis (variation of the threshold value). However, when a width of the offset region is too large, the drain current drastically decreases, so that also the reading speed drastically decreases. Thus, it is preferable to determine the width of the offset region so that it is possible to obtain sufficient hysteresis and reading speed.

Further, even in case where the diffusion layer regions 35 and 36 reach ends of the gate electrode 15, that is, even in case where the diffusion layer regions 35 and 36 overlap the gate electrode 15, the threshold value of the transistor hardly varies due to the writing operation. However, a parasitic resistance of an end of the source and a parasitic resistance of an end of the drain greatly vary, so that the drain current drastically decreases (single digit or more). Thus, it is possible to read the information by detecting the drain current, so that it is possible to obtain a function as a memory. However, in case where the great memory hysteresis effect is required, it is more preferable that the diffusion layer regions 35 and 36 do not overlap the gate electrode 15 (the diffusion layer regions 35 and 36 offset the gate electrode 15, that is, there is the offset region).

By performing the foregoing operation processes, it is possible to selectively write or erase information of 2 bits for each transistor in the nonvolatile memory element 3. Note that, in the foregoing operation processes, information of 2 bits is written or erased for each transistor by switching the source electrode and the drain electrode, but it may be so arranged that the source electrode and the drain electrode are fixed so as to operate as a 1 bit memory.

The nonvolatile memory element (semiconductor storage device) 3 of the embodiment of the present invention can be formed by performing an ordinary semiconductor process for forming a field effect transistor, for example, by performing the same processes as processes of forming the side wall spacer, having a stacking structure, on the side wall of the gate electrode 15. Specifically, an example of the process is as follows: after forming the gate electrode 15, stacking films in which an insulating film (second insulator), an electric charge storing film (first insulator), and an insulating film (second insulator) are stacked is formed, and they are etched back under an appropriate condition, thereby leaving the films in a shape of a side wall spacer. As another example, a condition in forming the side wall and a deposited material are determined as required according to structures of desired memory function sections 25 and 26.

The following embodiment will further detail the nonvolatile memory element.

Embodiment 3

Figure 7:
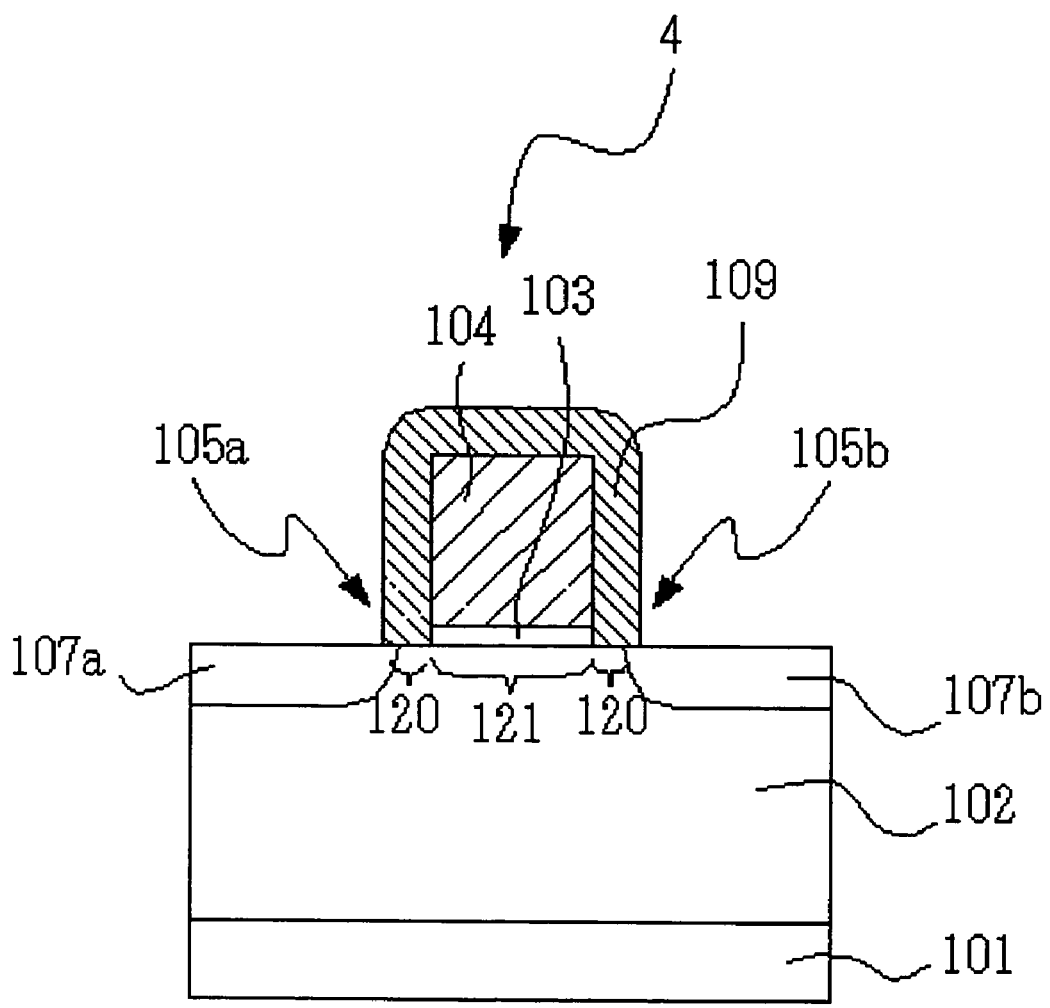
FIG. 7 is a longitudinal sectional view schematically showing a nonvolatile memory element constituting a semiconductor storage device or a semiconductor device of still another embodiment of the present invention.

FIG. 7 shows a cross sectional structure of a nonvolatile memory element (semiconductor device, semiconductor storage device) 4 of an embodiment of the present invention. The nonvolatile memory element 4 is formed on a P-type well region 102 formed on a surface of a semiconductor substrate 101. A gate electrode 104 is formed above the P-type well region 102 via a gate insulating film 103. On both sides of the gate electrode 104, memory function sections 105a and 105b are formed.

Here, the memory function section is a portion of a memory function body or a charge retaining film, and the portion actually stores electric charge. In an example shown in FIG. 7, an upper face and side faces of the gate electrode 104 are sequentially covered by a silicon nitride film 109, having a trap level for retaining electric charge, which functions as the charge retaining film. In the silicon nitride film 109, both side wall sections of the gate electrode 104 function as the memory function sections 105a and 105b for actually retaining electric charge.

Diffusion layer regions 107a and 107b of the nonvolatile memory element 4 respectively function as a source region or a drain region. Each of the diffusion layer regions 107a and 107b has an offset structure. That is, neither the diffusion layer region 107a nor the diffusion layer region 107b exist in a region 121 positioned under the gate electrode 104. The diffusion layer regions 107a and 107b respectively overlap portions positioned in the peripheries of external ends of the memory function sections 105a and 105b in a stacking direction of the semiconductor substrate 101, the P-type well region 102, the gate insulating film 103, and the gate electrode 104. Thus, offset regions 120 are provided under the memory function sections 105a and 105b so as to be respectively positioned between the region 121 and the diffusion layer region 107a and between the region 121 and the diffusion layer region 107b. Thus, the offset regions 120 are parts of the channel region positioned between the diffusion layer regions 107a and 107b.

Note that, in the nonvolatile memory element 4, each of the memory function section 105a and 105b may be arranged so that: fine particles constituted of conductor or semiconductor having nanometer size are dispersed in the insulating film in a dotted manner. At this time, when each of the fine particles is less than 1 nm, a quantum effect is excessively caused, so that a tunnel effect of electric charge hardly occurs with respect to dots (the fine particles). While, when each of the fine particles exceeds 10 nm, an outstanding quantum effect does not occur at room temperature. Thus, it is preferable that a diameter of the fine particle is in a range of from 1 nm to 10 nm.

Figure 8:
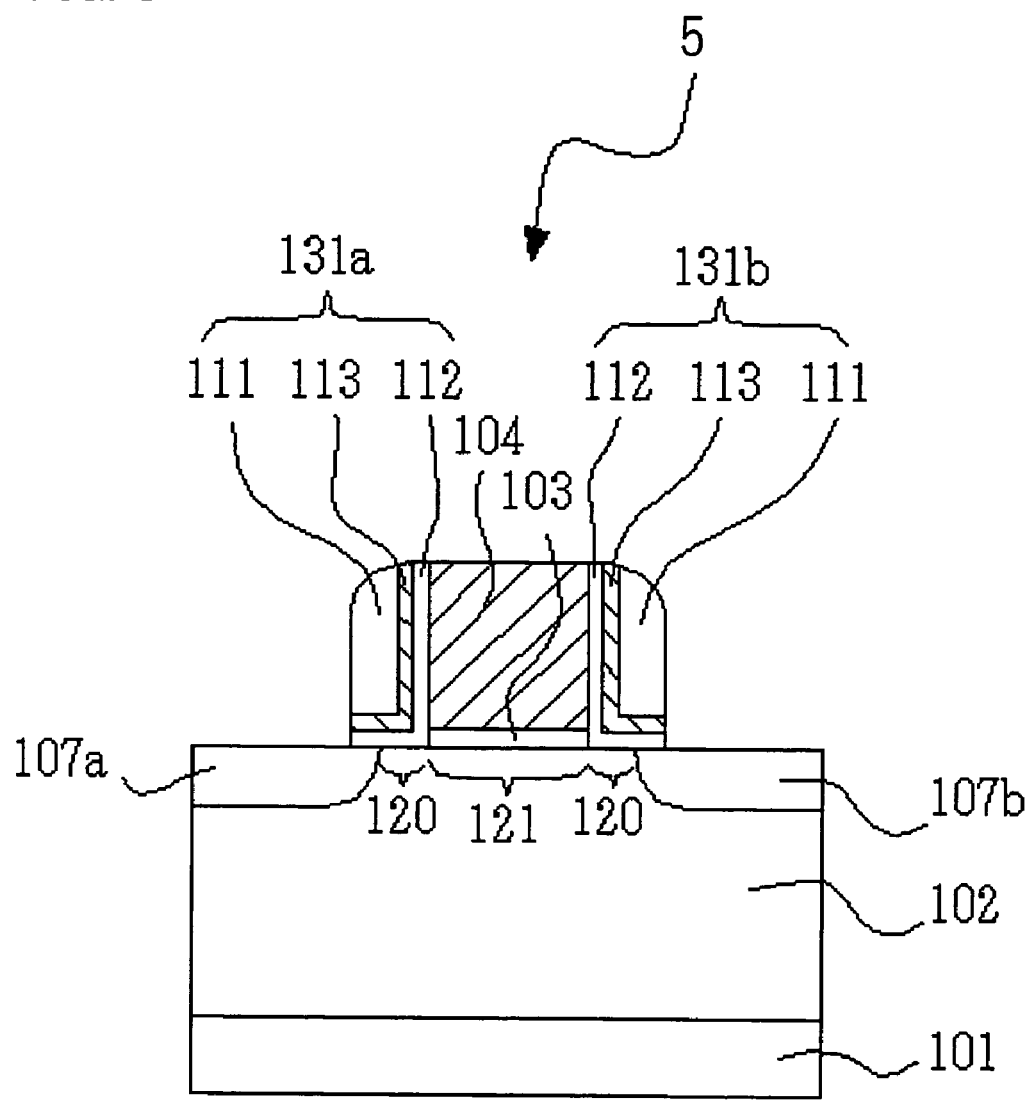
FIG. 8 is a longitudinal sectional view schematically showing a nonvolatile memory element constituting a semiconductor storage device or a semiconductor device of further another embodiment of the present invention.

FIG. 8 shows another example of the nonvolatile memory element. A nonvolatile memory element 5 shown in FIG. 8 is different from the nonvolatile memory element 4 shown in FIG. 7 in terms of the following points. That is, the nonvolatile memory element 5 has memory function sections 131a and 131b. Each of the memory function sections 131a and 131b has a trap level for retaining electric charge, and a silicon nitride film 113 which functions as the charge retaining film is sandwiched by silicon oxide films 111 and 112. In the nonvolatile memory element 5, the silicon nitride film is sandwiched by the silicon oxide films 111 and 112, so that an efficiency at which electric charge is injected in performing the rewriting operation is improved, thereby operating the nonvolatile memory element 5 at higher speed.

Note that, in the nonvolatile memory element 5, the silicon nitride film 113 may be replaced with a ferroelectric film.

Further, in the nonvolatile memory element 5, each of the memory function sections 131a and 131b does not have to be in a shape of the side wall spacer as shown in FIG. 8. For example, in the nonvolatile memory element 4 (FIG. 7), the silicon nitride film 109, having the trap level for retaining electric charge, which constitutes the memory function sections 105a and 105b, covers side faces and an upper face of the gate electrode 104. However, portions which function as the memory function sections 105a and 105b for actually retaining electric charge are regions opposite to both side walls of the gate electrode 104. That is, a function for retaining electric charge or a material for retaining polarization is provided on these regions.

As apparent from the foregoing description, in the nonvolatile memory element of the foregoing embodiment, the memory function sections are formed separately from the gate insulating film, and are formed on both sides of the gate electrode. Thus, the nonvolatile memory element can operate on the basis of 2-bit information. Further, the memory function sections are separated from each other by the gate electrode, so that interference in rewriting is effectively suppressed. Further, the gate insulating film is separated from the memory function section (the gate insulating film is not stacked on the memory function section), so that it is possible to suppress the short channel effect by making the gate insulating film thinner. Thus, it is easy to miniaturize the nonvolatile memory element of the foregoing embodiment.

Embodiment 4

Figure 9:
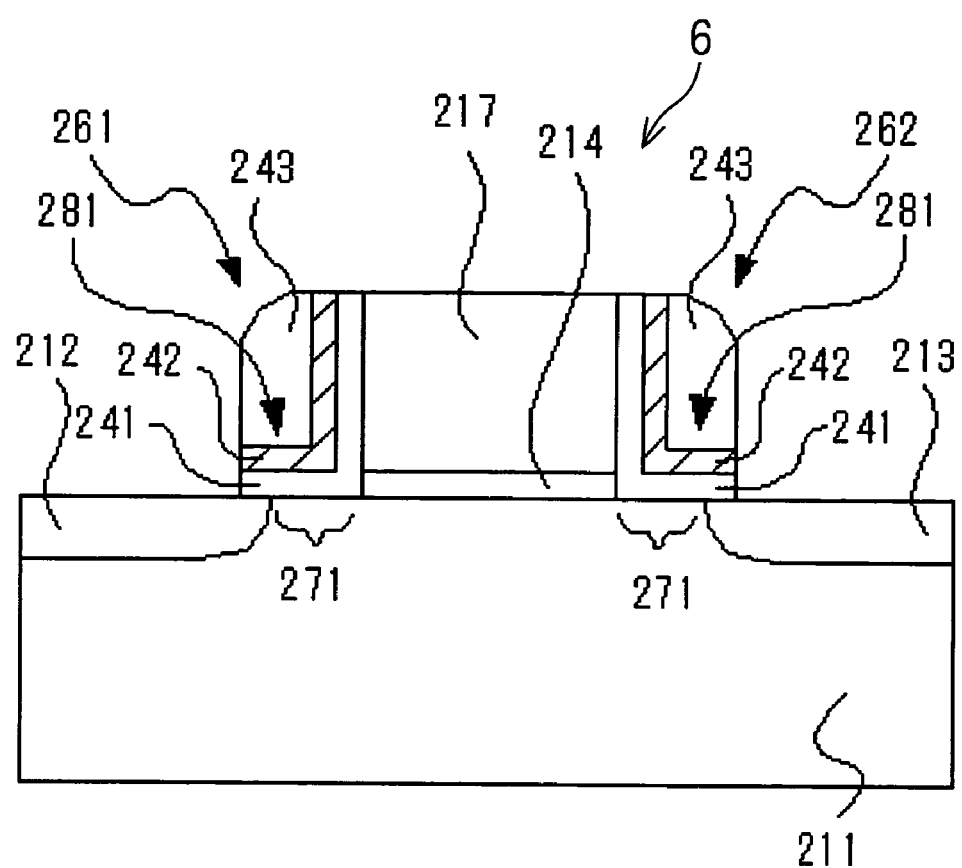
FIG. 9 is a longitudinal sectional view schematically showing a nonvolatile memory element constituting a semiconductor storage device or a semiconductor device of still further another embodiment of the present invention.

A nonvolatile memory element (semiconductor device, semiconductor storage device) of the present embodiment is arranged as shown in FIG. 9. In the nonvolatile memory element 6, each of memory function sections 261 and 262 is constituted of (i) a region for retaining electric charge and (ii) a region for making it difficult for electric charge to escape. The region for retaining electric charge is a region for storing electric charge. As the region, for example, a film having a function for retaining electric charge may be used. As the region for making it difficult for electric charge to escape, for example, a film having a function for making it difficult for electric charge to escape may be used.

Each of the memory function sections 261 and 262 has an ONO structure as shown in FIG. 9 for example. That is, each of the memory function sections 261 and 262 is arranged so that a silicon nitride film 242 is sandwiched by a silicon oxide film 241 and a silicon oxide film 243. The silicon nitride film 242 has a function for retaining electric charge. Each of the silicon oxide films 241 and 243 has a function for making it difficult for electric charge stored in the silicon nitride film 242 to escape.

In the memory function sections 261 and 262, the silicon nitride films 242 each of which functions as a region for retaining electric charge respectively overlap the diffusion layer regions 212 and 213. Here, the description "the silicon nitride films 242 overlap the diffusion layer regions 212 and 213" means that: at least one part of each silicon nitride film 242 exists above at least one part of each of the diffusion layer regions 212 and 213. That is, at least one part of each of the diffusion layer regions 212 and 213 overlaps one part of the silicon nitride film 242 in a stacking direction of the semiconductor substrate 211, the gate insulating film 214, and the gate electrode 217.

Note that, in FIG. 9, the reference sign 271 shows an offset region in which the gate electrode 217 does not overlap the diffusion layer regions 212 and 213 in the stacking direction. Further, an outermost surface of the semiconductor substrate 211 which is positioned under the gate insulating film 214 is a channel region.

Here, the following description will explain an effect obtained by causing the silicon nitride films 242 (region for retaining electric charge) of the memory function sections 261 and 262 to overlap the diffusion layer regions 212 and 213.

Figure 10:
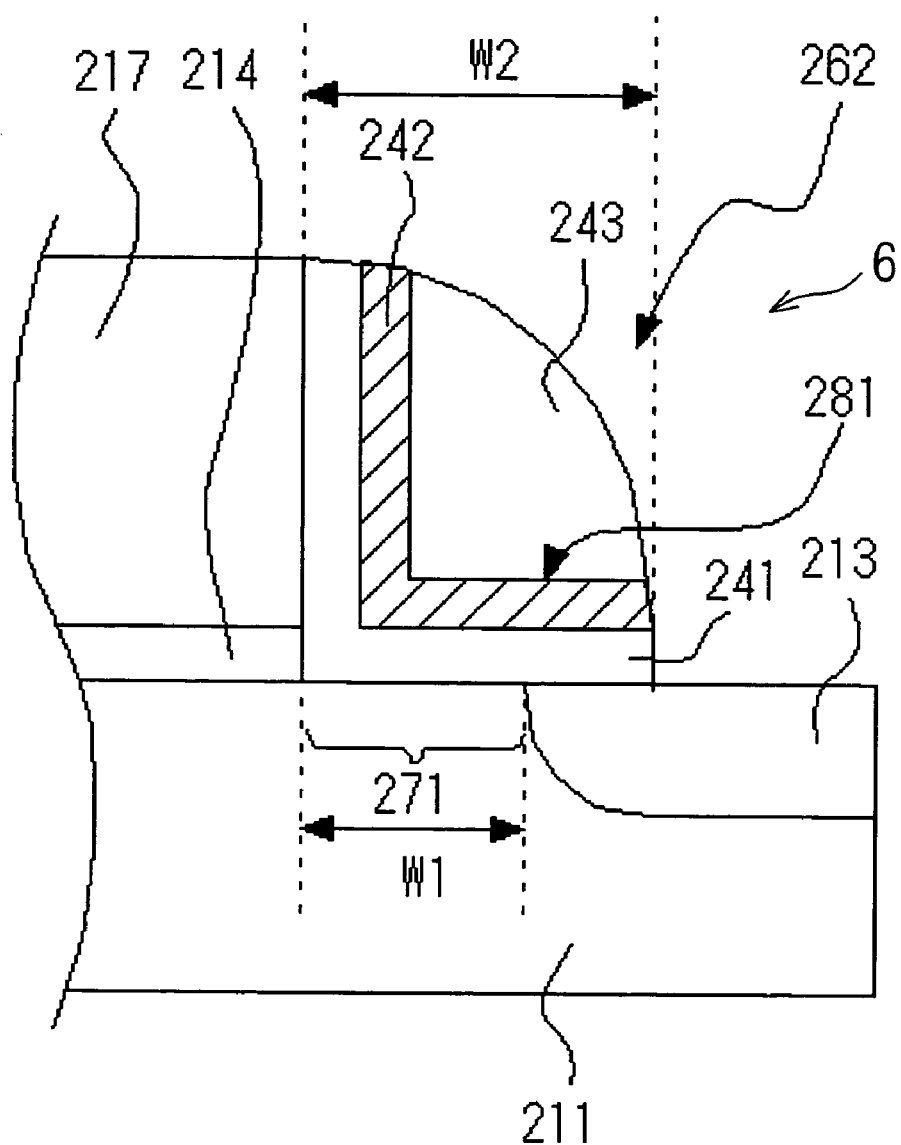
FIG. 10 is an enlarged sectional view of an important portion of the nonvolatile memory element shown in FIG. 9.

FIG. 10 is an enlarged view of a peripheral portion of one of, for example, right one of the memory function sections 261 and 262 shown in FIG. 9. In FIG. 10, W1 indicates an offset amount (offset region 271) of the gate electrode 217 and the diffusion layer region 213. Further, W2 indicates a width of the memory function section 262 in a cross sectional view in a channel length direction of the gate electrode 217. Note that, in the nonvolatile memory element 6, the silicon nitride film 242's end portion, positioned furthest from the gate electrode 217, which is a part of the memory function section 262, corresponds to the memory function section 262's end portion positioned furthest from the gate electrode 217. Thus, the width of the memory function section 262 is defined as W2.

An overlap amount of the memory function section 262 and the diffusion layer region 213 is represented as follows: W2−W1. It is particularly important that: the silicon nitride film 242 of the memory function section 262 overlaps the diffusion layer region 213, that is, a condition under which W2>W1 is satisfied.

Figure 11:
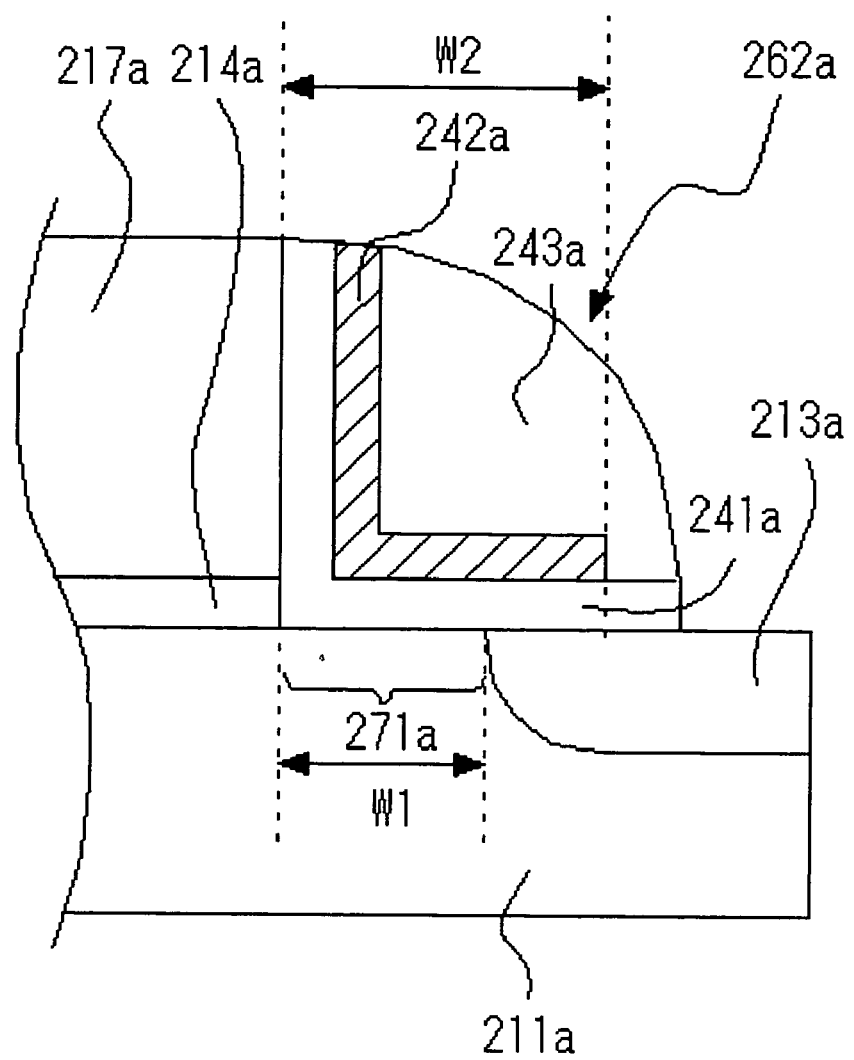
FIG. 11 is an enlarged sectional view of an important portion which shows another example of the nonvolatile memory element shown in FIG. 9.

Note that, in case where a silicon nitride film 242a's end portion, positioned furthest from a gate electrode 217a, which is a part of a memory function section 262a, does not correspond to the memory function section 262a's end portion positioned furthest from the gate electrode 271a as shown in FIG. 11, W2 is defined as a width from the end portion of the gate electrode 217a to the silicon nitride film 242a's end portion positioned furthest from the gate electrode 217a.

Figure 12:
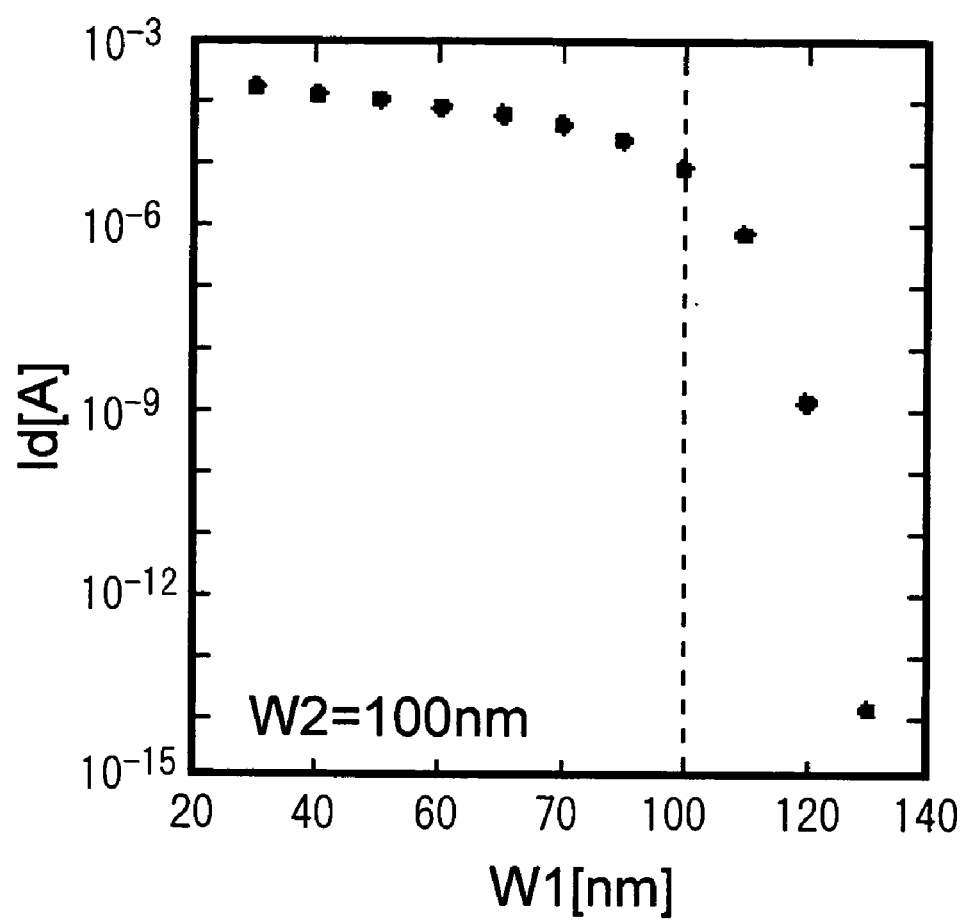
FIG. 12 is a graph of a relationship between an offset W1 shown in FIG. 10 and a drain current Id whereby a property of the nonvolatile memory element of FIG. 9 is shown.

FIG. 12 shows a condition of the structure shown in FIG. 10. FIG. 12 shows a drain current Id in case where the width W2 of the memory function section 262 is fixed to 100 nm and the offset amount W1 is varied. Here, the drain current is calculated by device simulation on the assumption that: the memory function section 262 is in an erasing state (state in which holes are stored), and the diffusion layer regions 212 and 213 are respectively regarded as a source electrode and a drain electrode.

As apparent from FIG. 12, in case where W1 is 100 nm or more, that is, in case where the silicon nitride film 242 does not overlap the diffusion layer region 213, the drain current rapidly decreases. A value of the drain current is substantially in proportion to a speed of the reading operation. Thus, when W1 is 100 nm or more, the performance of the memory rapidly deteriorates. While, in a range where the silicon nitride film 242 overlaps the diffusion layer region 213, the drain current gently decreases. Thus, taking into consideration unevenness in mass production, it is difficult to obtain a substantial memory function unless at least one part of the silicon nitride films 242 each of which has a function for retaining electric charge overlap the diffusion layer regions (source/drain regions) 212 and 213.

On the basis of a result obtained by the aforementioned device simulation, W2 was fixed to 100 nm, and W1 was designed so as to be 60 nm and 10 nm. Under such condition, a memory cell array was produced. When W1 was 60 nm, the silicon nitride film 242 overlapped each of the diffusion layer regions 212 and 213 by 40 nm in a designed value. When W1 was 100 nm, the silicon nitride film 242 did not overlap the diffusion layer regions 212 and 213 in the designed value.

A reading time of the memory cell array was measured. Then, comparison was performed in terms of the worst case in which unevenness was taken into consideration. As a result, a reading access time in case where W1 was designed so as to be 60 nm was 10 times higher than a reading access time in case where W1 was designed so as to be 100 nm. In practice, it is more preferable that the reading access time is 100 nanoseconds or less for each bit. However, it was found that this condition could not be achieved when W1=W2. Further, it was found that: taking the unevenness of production into consideration, it is more preferable that W2−W1>10 nm.

Further, it is preferable that: information stored in the memory function section 261 (region 281 shown in FIG. 10) is read by using the diffusion layer region 212 as a source electrode, and using the diffusion layer region 213 as a drain region, and forming a pinch off point in the channel region so that the pinch off point is positioned near to the drain region, as in Embodiment 3. That is, in reading information stored in one of the memory function sections 261 and 262, it is preferable to form the pinch off point in the channel region so as to be positioned near to the other memory function section. Thus, it is possible to sensitively detect information stored in the memory function section 261 regardless of a condition under which information is stored in the memory function section 262. This is a factor which enables 2-bit operation of the nonvolatile memory element 6.

While, in case of causing merely one of the memory function sections 261 and 262 to store information, or in case of using the two memory function sections 261 and 262 under the same condition in terms of storage, the pinch off point does not have to be formed in reading information.

Note that, although not shown in FIG. 9, it is preferable to form a well region (P type well in case of an N channel element) on a surface of the semiconductor substrate 211. By forming the well region, it is easier to control electric properties (pressure resistance, junction capacitance, and short channel effect) while optimizing the impurity concentration of the channel region in memory operation (in rewriting operation and reading operation).

In terms of improvement of the retention property of the nonvolatile memory element 6, it is preferable that each of the memory function sections 261 and 262 includes a charge retaining film and insulating films each of which has a function for retaining electric charge. The arrangement of the present embodiment uses: a silicon nitride film 242, which has a level for trapping the electric charge, as the charge retaining film; and silicon oxide films 241 and 243, each of which prevents the electric charge stored in the charge retaining film from scattering, as the insulating films. Each of the memory function section 261 and 262 includes the charge retaining film and the insulating films, so that it is possible to improve the retaining property while preventing the electric charge from scattering. Further, compared with a case where each of the memory function sections 261 and 262 is constituted merely of the charge retaining film, it is possible to appropriately reduce a volume of the charge retaining film. By appropriately reducing the volume of the charge retaining film, it is possible to limit movement of the electric charge in the charge retaining film, thereby suppressing property variation caused by the movement of the electric charge in storing information.

Further, it is preferable that each of the memory function sections 261 and 262 includes the charge retaining film which has a portion disposed substantially in parallel to a surface of the gate insulating film 214. In other words, it is preferable that the charge retaining film includes a portion whose upper surface is parallel to an upper surface of the gate insulating film 214.

Figure 13:
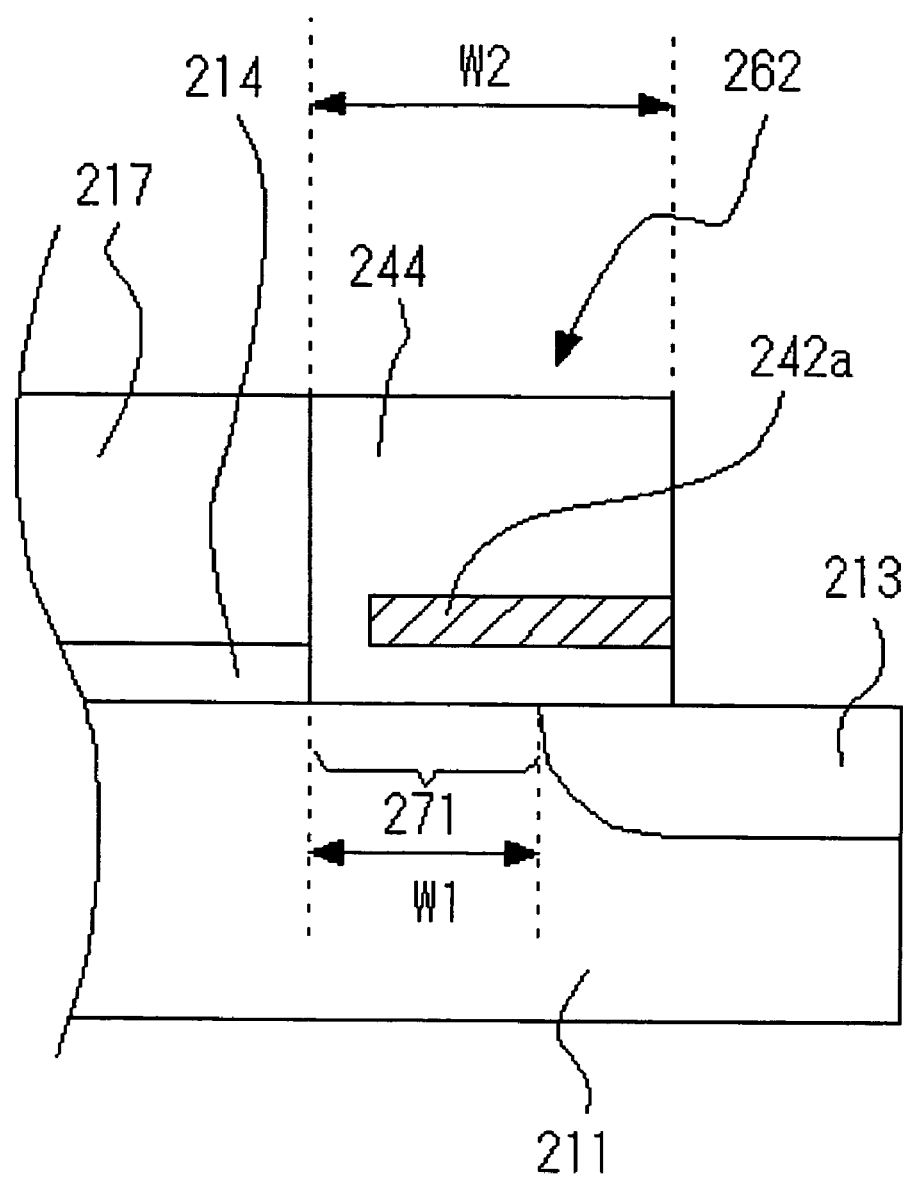
FIG. 13 is an enlarged sectional view of an important portion that shows a still another example of the nonvolatile memory element shown in FIG. 9.

Specifically, as shown in FIG. 13, the charge retaining film 242a (for example, the silicon nitride film) of the memory function section 262 has a surface which is substantially in parallel to a surface of the gate insulating film 214. In other words, the charge retaining film (first insulating film) 242a of the memory function section 262 includes a portion whose surface spreads along a surface opposite to a surface of the gate insulating film 214 with the silicon nitride film 244 therebetween. That is, it is preferable to form the charge retaining film 242a so as to be positioned at a constant height from a position corresponding to an upper surface of the gate insulating film 214. In the silicon nitride film 242 shown in FIG. 10, the structure of the charge retaining film 242a corresponds to the region 281 having a surface substantially in parallel to the surface of the gate insulating film 214.

The memory function section 262 includes the charge retaining film 242a substantially parallel to the surface of the gate insulating film 214, so that it is possible to effectively control a condition under which the inversion layer tends to occur in the offset region 271 depending on an amount of electric charge stored in the charge retaining film 242a, thereby enhancing the memory effect. Further, the charge retaining film 242a is substantially in parallel to the surface of the gate insulating film 214, so that it is possible to keep variation of the memory effect relatively small even in case where the offset amount (W1) is uneven. Moreover, the electric charge is suppressed from moving upward in the charge retaining film 242a, so that it is possible to suppress property variation caused by the movement of the electric charge in storing information.

Further, it is preferable that the memory function section 262 includes an insulating film (for example, a portion, positioned on the offset region 271, which is a part of the silicon nitride film 244) for separating the charge retaining film 242a substantially in parallel to the surface of the gate insulating film 214 from the channel region (or the well region). Due to the insulating film, the electric charge stored in the charge retaining film is suppressed from scattering, so that it is possible to obtain the nonvolatile memory element having a more preferable retaining property.

Note that, a thickness of the charge retaining film 242a is controlled, and a thickness of the insulating film (a portion, positioned on the offset region 271, which is a part of the silicon oxide film 244) positioned under the charge retaining film 242a is controlled so as to be constant, so that it is possible to fix a distance from the surface of the semiconductor substrate 211 to the electric charge stored in the charge retaining film 242a. That is, it is possible to control the distance from the surface of the semiconductor substrate 211 to the electric charge stored in the charge retaining film 242a so that the distance is within a range from (i) a minimum thickness of the insulating film positioned under the charge retaining film 242a to (ii) a total of a maximum thickness of the insulating film positioned under the charge retaining film 242a and a maximum thickness of the charge retaining film 242a. Thus, it is possible to substantially control concentration of electric flux lines caused by the electric charge stored in the charge retaining film 242a, so that it is possible to drastically reduce unevenness of the memory effect of the nonvolatile memory element.

Embodiment 5

Figure 14:
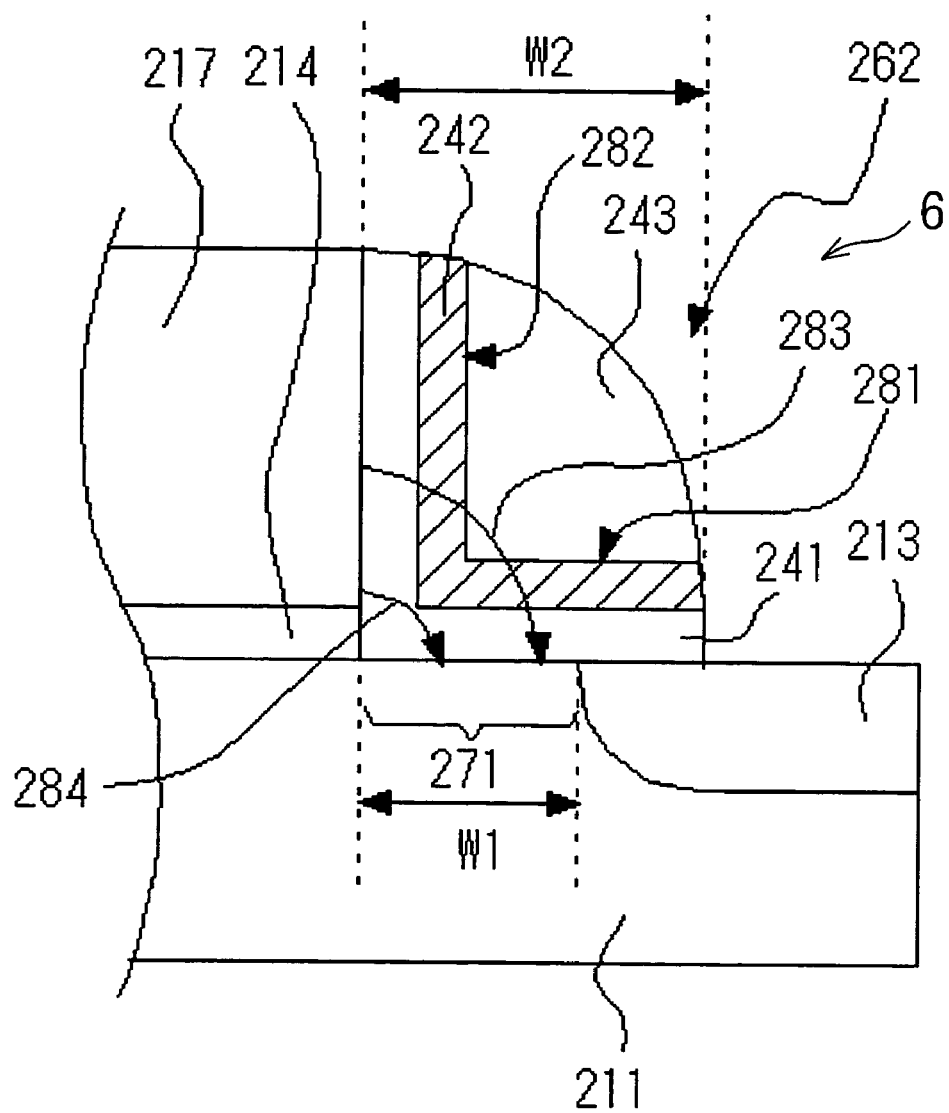
FIG. 14 is an explanatory drawing showing electric flux lines in a memory function section of the nonvolatile memory element shown in FIG. 9.

In the present embodiment, as shown in FIG. 14, a nonvolatile memory element (semiconductor device, semiconductor storage device) 6 is arranged so that a silicon nitride film (charge retaining film) 242 of each of memory function sections 261 and 262 includes: a portion (region 281) which has a substantially even thickness and is disposed substantially in parallel to a surface of a gate insulating film 214; and a portion (region 282) which is disposed substantially in parallel to a side face of a gate electrode 217. That is, the region 282 of the silicon nitride film (charge retaining film) 242 is positioned opposite to the side face of the gate electrode 217 with the silicon oxide film (second insulating film) therebetween, and extends along the side face.

In the nonvolatile memory element 6, when a positive voltage is applied to the gate electrode 217, an electric flux line in the memory function section 262 passes through the silicon nitride film 242 twice as shown by an arrow 283 (passing though the region 182+passing through the region 181). Note that, a direction of the electric flux line in case where a negative voltage is applied to the gate electrode 217 is opposite to a direction shown in FIG. 14.

Here, specific inductive capacity of the silicon nitride film 242 is approximately 6, and specific inductive capacity of the silicon oxide films 241 and 243 is approximately 4. Thus, in each of the memory function sections 261 and 262, effective specific inductive capacity in a direction of the electric flux line 283 is larger than the case where merely the region 281 exists. As a result, it is possible to further reduce a potential difference between both the ends of the electric flux line. That is, a large part of the voltage applied to the gate electrode 217 is used to enforce an electric field in the offset region 271.

In the nonvolatile memory element 6, electric charge is injected into the silicon nitride film 242 in the rewriting operation. This is because thus generated electric charge is drawn by the electric field in the offset region 271. Thus, the silicon nitride film 242 includes the region 282, so that the electric charge injected into the memory function section 262 in the rewriting operation increases, thereby increasing the rewriting speed.

Note that, in case where also a portion corresponding to the silicon oxide film 243 is the silicon nitride film, that is, in case where the silicon nitride film (charge retaining film) is uneven in terms of a height from a surface of the gate insulating film 214, the electric charge apparently moves in an upward direction of the silicon nitride film, so that the retaining property is deteriorated.

It is more preferable to use high dielectric material, such as hafunium oxide, whose specific inductive capacity is extremely high, instead of the silicon nitride film, so as to form the charge retaining film.

Further, it is preferable that each of the memory function sections 261 and 262 further includes an insulating film (a portion, positioned on the offset region 271, which is a part of the silicon oxide film 241) for separating the charge retaining film (region 281 of the silicon nitride film), which is substantially in parallel to the surface of the gate insulating film 214, from the channel region (or the well region). Due to the insulating film, electric charge stored in the charge retaining film (silicon nitride film 242) is suppressed from scattering, so that it is possible to improve the retaining property.

Further, it is preferable that each of the memory function sections 261 and 262 further includes an insulating film (a portion, being in contact with the gate electrode 217, which is a part of the silicon oxide film 241) for separating the gate electrode 217 from the charge retaining film (region 282 of the silicon nitride film 242) which extends in a direction substantially parallel to the side face of the gate electrode 217. Due to the insulating film, it is possible to prevent the electric charge from being injected from the gate electrode into the charge retaining film, so that it is possible to prevent the electric properties from varying. As a result, it is possible to further enhance reliability of the nonvolatile memory element.

Further, as in Embodiment 4, it is preferable to control a thickness of the insulating film (a portion, positioned on the offset region 271, which is a part of the silicon oxide film 241) positioned under the charge retaining film 242 is controlled so that the thickness is constant, and it is preferable to control a thickness of the insulating film (a portion, being in contact with the gate electrode 217, which is a part of the silicon oxide film 241) disposed on the side face of the gate electrode so that the thickness is constant. Thus, it is possible to substantially control concentration of the electric flux lines caused by the electric charge stored in the charge retaining film 242, and it is possible to prevent the electric charge from leaking.

Embodiment 6

The present embodiment relates to optimization of (i) a distance between one end and the other end of the gate electrode 217, (ii) a distance between the memory function sections 261 and 262, and (iii) a distance between the diffusion layer regions (source/drain regions) 212 and 213 in the nonvolatile memory element (semiconductor device, semiconductor storage device).

Figure 15:
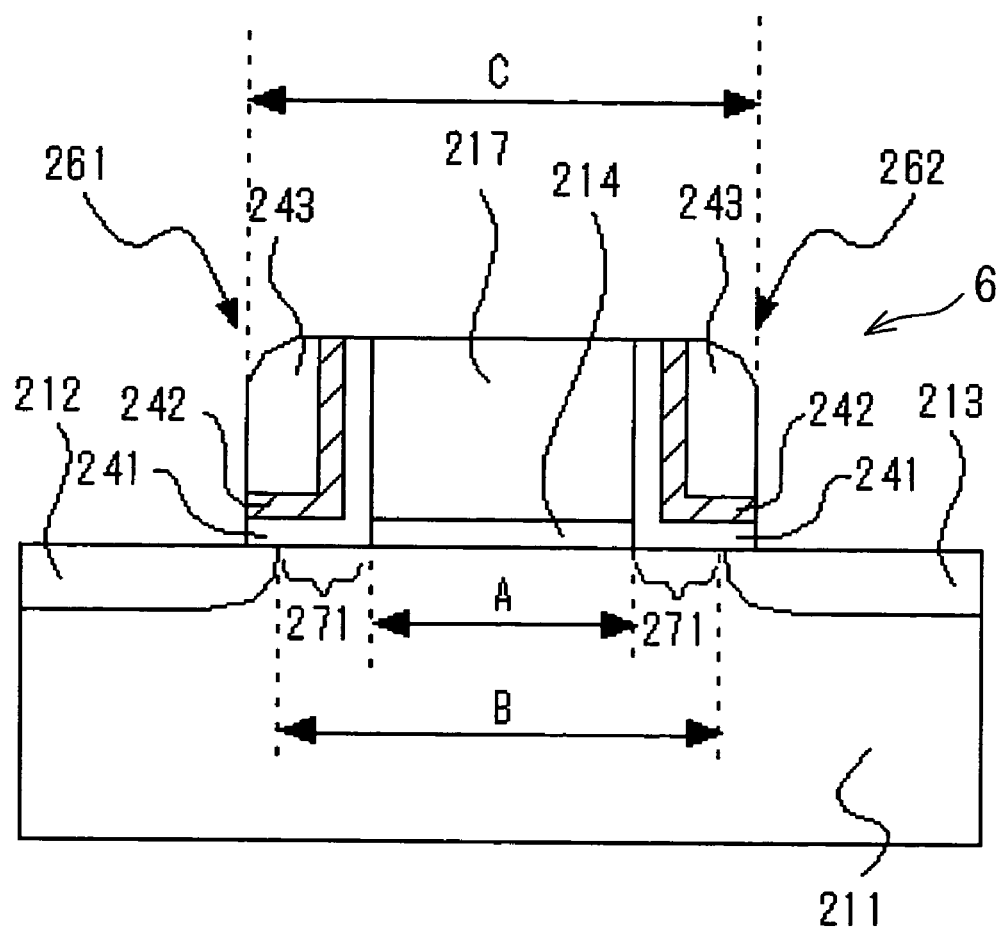
FIG. 15 is a longitudinal sectional view schematically showing the nonvolatile memory of FIG. 9 so as to illustrate a most appropriate relationship among a gate electrode size in a channel length direction, a distance between external ends of the memory function section, and a distance between diffusion layers.

In FIG. 15, in a cross sectional view in a channel length direction, "A" represents a length of the gate electrode, and "B" represents a distance (channel length) between the diffusion layer regions (source/drain regions) 212 and 213, and "C" represents a distance between external ends of the memory function sections 261 and 262 in the channel length direction. In more detail, "C" represents a distance from (i) an end portion (external end), being a part of the silicon nitride film 242 of the memory function section 261, which is positioned further from the gate electrode 217 to (ii) an end portion (external end), being a part of the silicon nitride film 242 (charge retaining film) of the memory function section 262, which is positioned further from the gate electrode 217, in the channel length direction.

In the relationship among "A" to "C", first, it is preferable that B<C. In the channel region, there is the offset region 271 between (i) a portion (a counter region, being a part of the semiconductor substrate 211, which is positioned opposite to the gate electrode 217) positioned under the gate electrode 217 and (ii) each of the diffusion layer regions (source/drain regions) 212 and 213. When B <C, a condition under which inversion tends to occur is effectively varied throughout the offset region 271 due to the electric charge stored in each of the memory function sections 261 and 262 (silicon nitride film 242). Thus, the memory effect is enhanced, thereby realizing a higher speed particularly in reading out information.

Further, in case where each of the diffusion layer regions (source/drain regions) 212 and 213 offsets the gate electrode 217, that is, in case where A<B, a condition under which the offset region 271 tends to invert in applying a voltage to the gate electrode 217 is greatly varied due to the electric charge stored in the memory function sections 261 and 262, so that the memory effect is enhanced and it is possible to reduce the short channel effect. However, as long as the memory effect is exhibited, the offset region 271 does not have to exist. That is, even in case where the offset region 271 does not exist, the memory effect can be exhibited in the memory function sections 261 and 262 (silicon nitride film 242) as long as the impurity concentration of the diffusion layer regions 212 and 213 is sufficiently low.

As apparent from the foregoing description, it is the most preferable to set the relation ship among A to C so that A<B<C.

Figure 16:
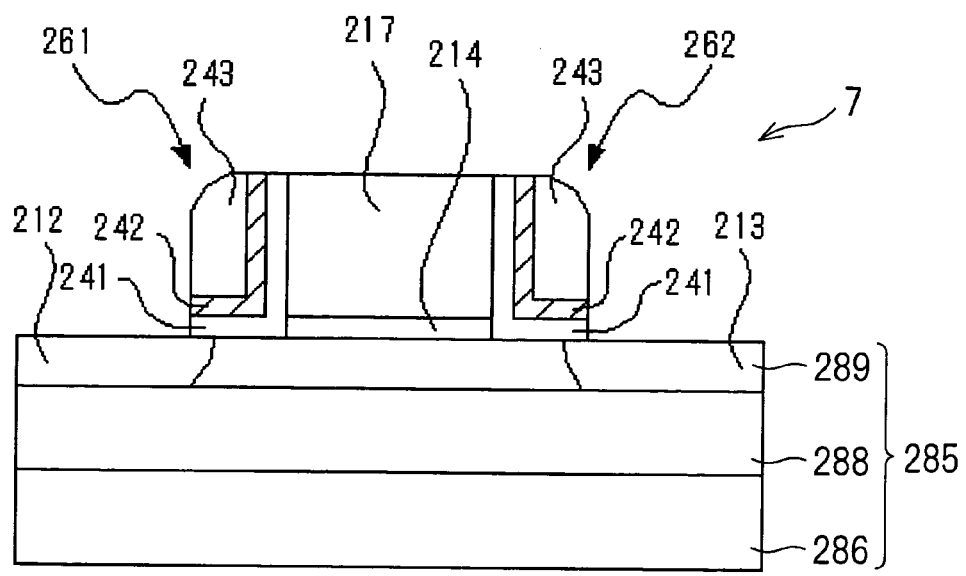
FIG. 16 is a longitudinal sectional view schematically showing an example where an SOI substrate is used instead of a semiconductor substrate in the nonvolatile memory element shown in FIG. 9.

Note that, as in the nonvolatile memory element 7 shown in FIG. 16, in the nonvolatile memory element 6, an SOI substrate 285 may be used instead of the semiconductor substrate 211.

In the nonvolatile memory element 7, the SOI substrate 286 is arranged so that: an embedded oxide film 288 is formed on the semiconductor substrate 286, and an SOI layer 289 is formed thereon. In the SOI layer 289, the diffusion layer regions 212 and 213 are formed. A region other than the diffusion layer regions 212 and 213 is a body region 287.

In the nonvolatile memory element 7, it is possible to greatly reduce the junction capacity between (i) the diffusion layer regions 212 and 213 and (ii) the body region 287, so that it is possible to operate the element at higher speed and it is possible to reduce the power consumption. Other functions of the nonvolatile memory element 7 are the same as in the nonvolatile memory element 6.

Embodiment 7

Figure 17:
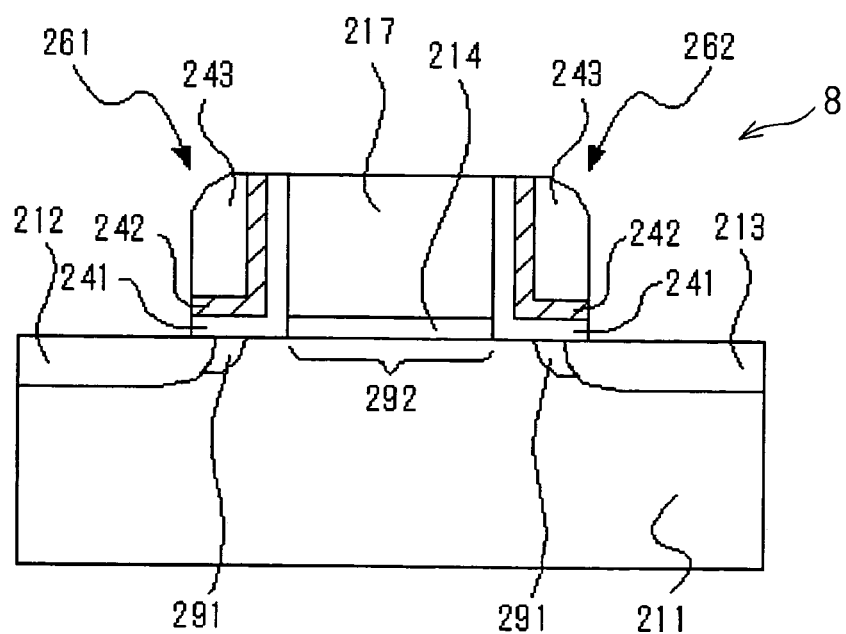
FIG. 17 is a longitudinal sectional view schematically showing still another example of the nonvolatile memory element shown in FIG. 9.

A nonvolatile memory element (semiconductor device, semiconductor storage device) 8 of the present embodiment is different from the nonvolatile memory element 6 described in Embodiment 4 (FIG. 9) in that: as shown in FIG. 17, there are added P-type highly concentrated regions 291 adjacent to N-type diffusion layer regions (source/drain regions) 212 and 213 so as to be positioned on the sides of the channel. Except for the difference, the nonvolatile memory element 8 is arranged substantially in the same manner as in the nonvolatile memory element 6.

In each of the P-type highly concentrated regions 291, concentration of impurity (for example, boron) which supplies positive holes (P-type) is higher than concentration of impurity which supplies positive holes (P-type) in the region 292 positioned between the P-type highly concentrated regions 291. As the concentration of the P-type impurity in the P-type highly concentrated region 291, for example, approximately $5 \times 10^{17}$ to $1 \times 10^{19}$ cm$^{-3}$ is appropriate. Further, it is possible to set the concentration of the P-type impurity of the region 292 to be $5 \times 10^{16}$ to $1 \times 10^{18}$ cm$^{-3}$.

In this manner, the P-type highly concentrated region 291 is provided, so that the impurity concentration under the memory function sections 261 and 262 sharply varies in a junction surface between the diffusion layer region 212 and the semiconductor substrate 211 and in a junction surface between the diffusion layer region 213 and the semiconductor substrate 211. Thus, hot carrier is liable to occur in the writing and erasing operation, so that it is possible to drop a voltage in the writing and erasing operation, or it is possible to perform the writing and erasing operation at higher speed. Further, the impurity concentration of the region 292 is relatively low, so that a threshold value in case where information of the memory is erased is low. As a result, the drain current becomes large. Thus, the reading speed is improved. Therefore, it is possible to obtain the nonvolatile memory element in which: its rewriting voltage is low, or its rewriting speed is high, and its reading speed is high.

Further, as shown in FIG. 17, the semiconductor substrate 211 includes the P-type highly concentrated regions 291 which are provided opposite to the memory function sections 261 and 262 (so as not to be opposite to the gate electrode 217) so as to be positioned close to the diffusion layer regions (source/drain regions) 212 and 213, so that the threshold value of the whole transistor largely rises. The threshold value largely rises compared with a case where the P-type highly concentrated region 291 is positioned under the gate electrode 217 (the P-type highly concentrated region 291 is provided in the semiconductor substrate 211 so as to be opposite to the gate electrode 217). When electric charge used to write information is stored in the memory function sections 261 and 262 (in case where the transistor is an N-channel type, electrons are stored), this difference becomes larger.

On the other hand, when electric charge used to erase information is sufficiently stored in the memory function sections 261 and 262 (in case where the transistor is an N-channel type, positive holes are stored), the threshold value of the whole transistor drops so as to be a threshold value determined in accordance with the impurity concentration of the channel region (region 292) positioned under the gate electrode 217. That is, the threshold value in erasing information does not depend on the impurity concentration of the P-type highly concentrated region 291, but a threshold value in writing information is greatly influenced by the impurity concentration of the P-type highly concentrated region 291. Thus, the P-type highly concentrated regions 291 are provided under the memory function sections 261 and 262 (provided in the semiconductor substrate 211 so as to be opposite to the charge retaining films 261 and 262) so as to be positioned close to the diffusion layer regions (source/drain regions) 212 and 213, so that merely the threshold value in writing information greatly varies. As a result, it is possible to greatly enhance the memory effect (a difference between the threshold value in writing information and the threshold value in erasing information).

Embodiment 8

Figure 18:
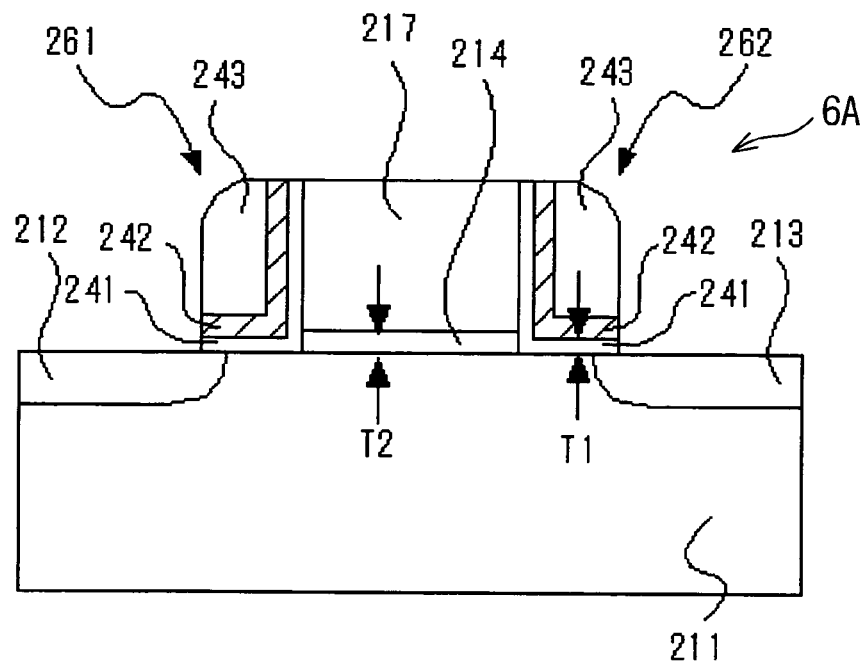
FIG. 18 is a longitudinal sectional view schematically showing a case where a thickness T1 of an insulating film for separating an electric charge retaining film from a channel region or a well region is made thinner than a thickness T2 of a gate insulating film in the nonvolatile memory element shown in FIG. 9.

A nonvolatile memory element (semiconductor device, semiconductor storage device) 6A of the present embodiment is different from the nonvolatile memory element 6 described in Embodiment 4 (FIG. 9) in that: as shown in FIG. 18, a thickness T1 of the insulating film for separating the charge retaining film (silicon nitride film 242) from the channel region or the well region is made thinner than a thickness T2 of the gate insulating film 214. Except for the difference, the nonvolatile memory element 6A is arranged substantially in the same manner as in the nonvolatile memory element 6.

The rewriting operation performed with respect to the memory requires the gate insulating film 214 to have some pressure resistance, so that the gate insulating film 214 has a lower limit in its thickness T2. However, it is possible to make the thickness T1 of the insulating film (silicon oxide film 241) of each of the memory function sections 261 and 262 thinner than T2 regardless of whether the insulating film is required to have some pressure resistance or not.

In the nonvolatile memory element 6A of the present embodiment, it is possible to more freely design the thickness T1 of the insulating film (silicon oxide film 241) as described above. This is based on the following reason.

In the nonvolatile memory element 6A, the insulating film (silicon oxide film 241) for separating the charge retaining film (silicon nitride film 242) of each of the memory function sections 261 and 262 from the channel region or the well region is not sandwiched by the gate electrode 217 and the channel region or the well region. Thus, a high electric field between the gate electrode 217 and the channel region or the well region does not directly influence the insulating film (silicon oxide film 241), but merely a relatively weak electric field spreading from the gate electrode 217 in a widthwise direction influences the insulating film. As a result, it is possible to make the thickness T1 of the silicon oxide film 241 thinner than the thickness T2 of the gate insulating film 214 regardless of whether the gate insulating film is required to have some pressure resistance or not.

While, in EEPROM represented by a flash memory for example, an insulating film for separating a floating gate from a channel region or a well region is sandwiched by a gate electrode (control gate) and the channel region or the well region, so that a high electric field from the gate electrode directly acts. Therefore, in the EEPROM, a thickness of the insulating film for separating the floating gate from the channel region or the well region is limited, so that optimization of functions of the nonvolatile memory element is prevented.

As apparent from the foregoing description, in the nonvolatile memory element 6A of the present embodiment, the insulating film (silicon oxide film 241) for separating the charge retaining film (silicon nitride film 242) from the channel region or the well region is not sandwiched by the gate electrode 217 and the channel region or the well region. This is the essential reason for which it is possible to more freely design the thickness T1 of the insulating film (silicon oxide film 241).

In the nonvolatile memory element 6A, the thickness T1 of the insulating film (silicon oxide film 241) is made thinner, so that it is easier to inject electric charge into the charge retaining film (silicon nitride film 242) of each of the memory function sections 261 and 262. As a result, it is possible to drop a voltage used to write or erase information, and it is possible to improve a speed at which information is written or erased. Further, an amount of electric charge caused by the channel region or the well region when electric charge is stored in the charge retaining film (silicon nitride film 242) increases, so that it is possible to enhance the memory effect.

Incidentally, in electric flux lines of the memory function sections 261 and 262, some electric flux lines are so short that they do not pass through the silicon nitride film 242 as shown by an arrow 284 of FIG. 14. In such a short electric flux line 284, the electric field is relatively intense, so that the electric field generated along the electric flux line 284 greatly contributes to the rewriting operation.

While, in case where the thickness T1 of the silicon oxide film 241 is made thinner like the nonvolatile memory element 6A of the present embodiment, the silicon nitride film 242 moves downward in view of the figure (the silicon nitride film 242 comes close to the semiconductor substrate 211), so that the electric flux line 284 passes through the silicon nitride film 242. Thus, in the memory function sections 261 and 262, the effective specific inductive capacity along the electric flux line 284 becomes higher, so that it is possible to further reduce a potential difference between both ends of the electric flux line 284. Thus, a large part of a voltage applied to the gate electrode 217 is used to enforce an electric field in the offset region 271, so that information is written and erased at higher speed.

As apparent from the foregoing description, in the nonvolatile memory element 6A, it is so set that T1<T2. As a result, it is possible to drop a voltage used to write and erase information without deteriorating the pressure resistance of the memory element, or it is possible to write and erase information at higher speed. Further, it is possible to enhance the memory effect.

Note that, it is preferable to set the thickness T1 of the insulating film (silicon oxide film 241) to be 0.8 nm or more. The thickness of 0.8 nm enables uniformity in the manufacturing process and film quality to be kept at a certain level, and is a limit above which the retaining property is not significantly deteriorated.

Next, an example of preferable application of the nonvolatile memory element 9 of the present embodiment is described as follows. For example, in case of a liquid crystal driver LSI, required to have high pressure resistance, which needs to be processed on the basis of a large design rule, it is necessary to apply a voltage of 15 to 18V at the maximum in order to drive TFT of the liquid crystal panel. Thus, it is impossible to make the gate oxide film (gate insulating film) thinner in the LSI.

While, in case of providing the nonvolatile memory element 9 of the present embodiment on the liquid crystal driver LSI as a device for adjusting images, in the nonvolatile memory element 6A, it is possible to most appropriately design the thickness of the insulating film (silicon oxide film 241) for separating the charge retaining film (silicon nitride film 242) from the channel region or the well region regardless of the thickness of the gate insulating film 214. For example, in a memory cell whose gate electrode length (word line width) is 250 nm, it can be so set that T1=20 nm and T2=10 nm respectively. As a result, it is possible to realize a memory cell having high efficiency in writing information.

Note that, in the nonvolatile memory element 6A, even when the thickness T1 of the silicon oxide film 241 is thicker than that of an ordinary logic transistor, the short channel effect does not occur. This is because the gate electrode 217 is offset by the diffusion layer regions (source/drain regions) 212 and 213.

Embodiment 9

Figure 19:
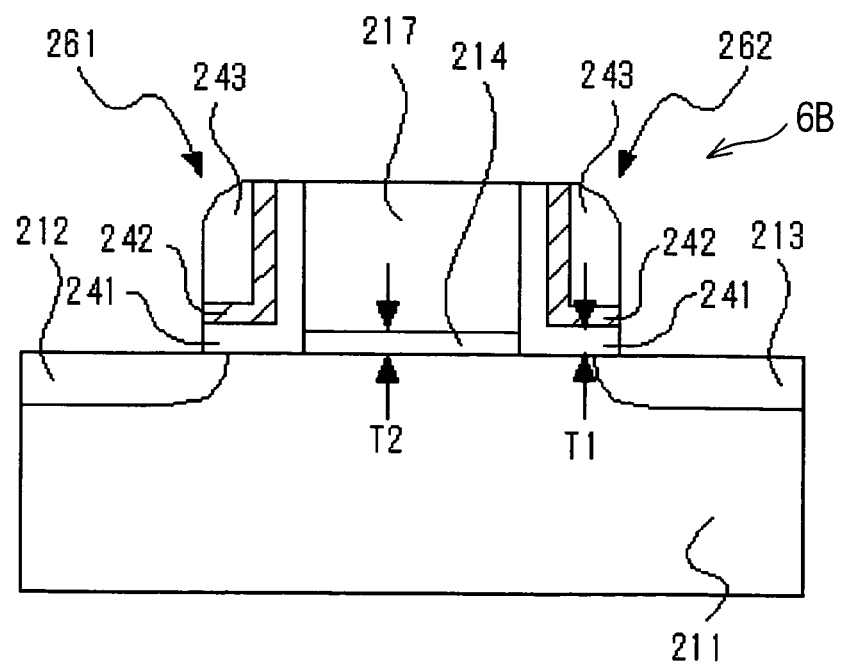
FIG. 19 is a longitudinal sectional view schematically showing a case where the thickness T1 of the insulating film for separating the electric charge retaining film from the channel region or the well region is made thicker than the thickness T2 of the gate insulating film in the nonvolatile memory element shown in FIG. 9.

A nonvolatile memory element (semiconductor device, semiconductor storage device) 6B of the present embodiment is different from the nonvolatile memory element 6 described in Embodiment 4 (FIG. 9) in that: as shown in FIG. 19, the thickness T1 of the insulating film (silicon oxide film 241) for separating the charge retaining film (silicon nitride film 242) from the channel region or the well region thicker than the thickness T2 of the gate electrode 217. Except for the difference, the nonvolatile memory element 6B is arranged substantially in the same manner as in the nonvolatile memory element 6.

In order to prevent the short channel effect of the element, the gate insulating film 214 has an upper limit in its thickness T2. However, the thickness T1 of the insulating film (silicon oxide film 241) of each of the memory function sections 261 and 262 can be made thicker than the thickness T2 of the gate insulating film 214 regardless of necessity for preventing the short channel effect. That is, when finer scaling is realized (when the gate insulating film 214 is made thinner), it is possible to most appropriately design the thickness of the insulating film (silicon oxide film 241) for separating the charge retaining film (silicon nitride film 242) from the channel region or the well region regardless of the thickness of the gate insulating film 214. Thus, it is possible to obtain such effect that each of the memory function sections 261 and 262 does not interfere with the scaling.

In the nonvolatile memory element 6B of the present embodiment, it is possible to more freely design the thickness T1 of the insulating film (silicon oxide film 241) as described above. This is because the insulating film (silicon oxide film 241) for separating the charge retaining film (silicon nitride film 242) of each of the memory function sections 261 and 262 from the channel region or the well region is not sandwiched by the gate electrode 217 and the channel region or the well region as described above. Thus, it is possible to make the thickness T1 of the silicon oxide film 241 thicker than the thickness T2 of the gate insulating film 214 regardless of necessity for the gate insulating film to prevent the short channel effect.

The thickness T1 of the silicon oxide film 241 is made thicker, so that it is possible to prevent electric charge stored in the memory function sections 261 and 262 from scattering, thereby improving the retaining property of the memory. Thus, it is so set that T1>T2, so that it is possible to improve the retaining property without promoting the short channel effect of the memory. Note that, it is preferable to set the thickness T1 of the insulating film (silicon oxide film 241) to be 20 nm or less taking drop of the rewriting speed into consideration.

Next, an example of preferable application of the nonvolatile memory element 6B of the present embodiment is described as follows. In a conventional nonvolatile memory element represented by a flash memory, a selection gate electrode constitutes a writing/erasing gate electrode, and a gate insulating film (having a floating gate therein) corresponding to the writing/erasing gate electrode functions as a charge storing film. Thus, it is required to miniaturize the nonvolatile memory element (it is necessary to make the insulating film thinner so as to control the short channel effect) and it is required to obtain reliability (in order to suppress leakage of the stored electric charge, the thickness of the insulating film for separating the floating gate from the channel region or the well region is set so as to exceed 7 nm). These requirements conflict with each other. Thus, it is difficult to miniaturize the conventional nonvolatile memory. Actually, according to ITRS (International Technology Roadmap for Semiconductor), miniaturization of a physical gate length into less than 0.2 micrometer cannot be realized so far.

While, in the nonvolatile memory element 6B of the present embodiment, it is possible to design T1 and T2 separately from each other as described above, so that it is possible to realize the miniaturization. In the present invention, with respect to a memory cell whose gate electrode length (word line width) is 45 nm, it is so set that T2=4 nm and T1=7 nm respectively, thereby realizing the nonvolatile memory element 6B which does not cause any short channel effect.

Note that, in the nonvolatile memory element 6B, even when T2 is set to be thicker than that of an ordinary logic transistor, the short channel effect does not occur. This is because the gate electrode 271 is not offset by the diffusion layer regions (source/drain regions) 212 and 213. Further, in the memory cell of the present embodiment, the gate electrode 217 is offset by the diffusion layer regions (source/drain regions) 212 and 213, so that it is easier to miniaturize the memory cell than in miniaturizing an ordinary logic transistor.

The foregoing points are summarized as follows. In the nonvolatile memory element of the present embodiment, there is no electrode for giving assistance in writing and erasing information in the memory function sections 261 and 262, that is, there is no gate electrode 217, so that a high electric field between the gate electrode 217 and the channel region or the well region does not directly act on the insulating film (silicon nitride film 242) for separating the charge retaining film (silicon nitride film 242) of each of the memory function section 261 and 262 from the channel region or the well region, but merely a relatively weak electric field spreading from the gate electrode 217 in a widthwise direction acts. Thus, it is possible to realize a memory cell whose gate length is miniaturized so as to be as fine as or finer than the gate length of the logic transistor.

Embodiment 10

The present embodiment relates to variation of electric properties in rewriting information of a nonvolatile memory element (semiconductor device, semiconductor storage device).

Figure 20:
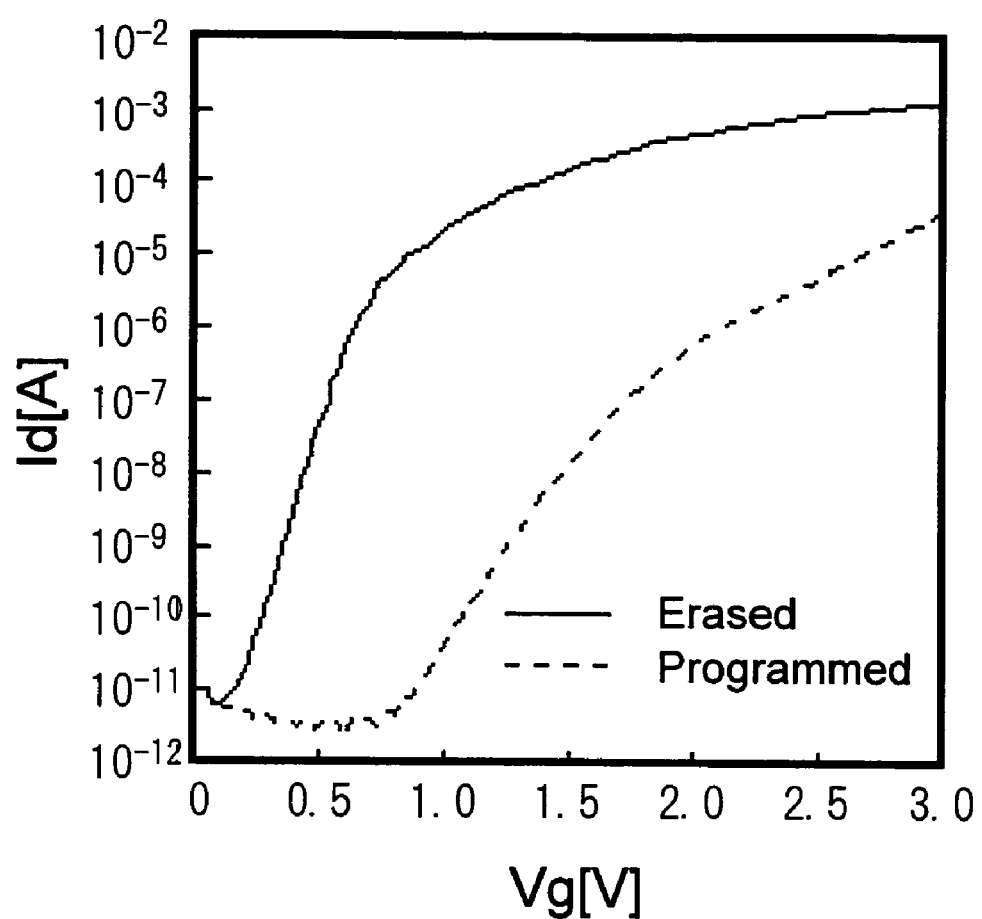
FIG. 20 is a graph showing a property (found value) indicative of a relationship between a drain current (Id) and a gate voltage (Vg) when an electric charge amount in a memory function section 2 of an N channel type nonvolatile memory element varies in one embodiment of the present invention.

FIG. 20 is a graph showing a property (found value) indicative of a relationship between a drain current (Id) and a gate voltage (Vg) in case where an amount of electric charge in the memory function sections 261 and 262 of an N-channel type nonvolatile memory element of the present embodiment varies.

Figure 29:
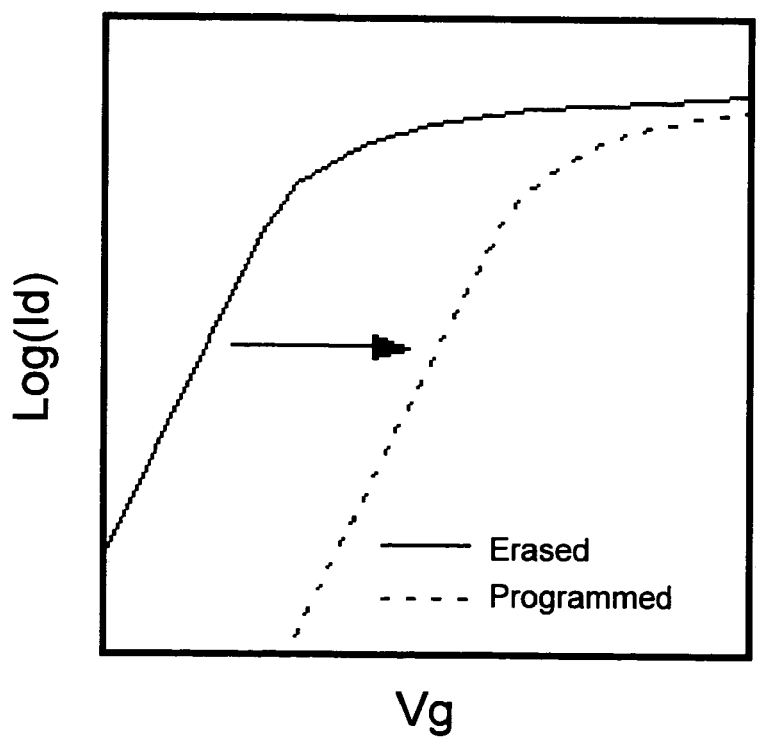
FIG. 29 is a graph showing an electric property of a flash memory of a background art.

As apparent from FIG. 20, in case where the writing operation is performed under an erasing condition (shown by continuous line), the threshold value not merely rises, but an Id-Vg curve is much less inclined particularly in a sub threshold area. Thus, even in an area where a gate voltage (Vg) is relatively high, a drain current ratio of the erasing condition and the writing condition is large. In case where Vg=2.5V for example, the current ratio is kept at two or more digits. This property is greatly different from the case of the flash memory (FIG. 29). The gate electrode is offset by the diffusion layer regions, and a gate electric field hardly acts on an offset region. This causes a particular phenomenon which is regarded as the foregoing property.

In case where the nonvolatile memory element is under the writing condition, even when a positive voltage is applied to the gate electrode 217, it is so difficult to generate an inversion layer in the offset region 271 positioned under the memory function sections 261 and 262 (provided in the semiconductor substrate 211 so as to be opposite to the memory function sections 261 and 262). This causes the Id-Vg curve to be less inclined in the sub threshold area under the writing condition.

While, when the nonvolatile memory element is under the erasing condition, highly concentrated electrons are induced in the offset region 271. Moreover, when 0V is applied to the gate electrode 217 (that is, when the nonvolatile memory element is in an OFF state), no electron is induced in a channel positioned under the gate electrode 217 (therefore, an OFF current is small). This causes the Id-Vg curve to be further inclined in the sub threshold area under the erasing condition and causes an increasing rate (conductance) of a current to be high also in an area over the threshold value.

As apparent from the foregoing description, in the memory element constituting the semiconductor storage device and the semiconductor device of the present invention, it is possible to particularly increase the drain current ratio of the writing condition and the erasing condition.

The foregoing description explains the volatile memory element and the nonvolatile memory element each of which constitutes the semiconductor storage device and the semiconductor device of the present invention. The following description will detail the semiconductor storage device and the semiconductor device of the present invention with reference to attached drawings.

Embodiment 11

A semiconductor device (semiconductor storage device) of an embodiment of the present invention is described as follows with reference to FIG. 21 to FIG. 23.

Figure 21:
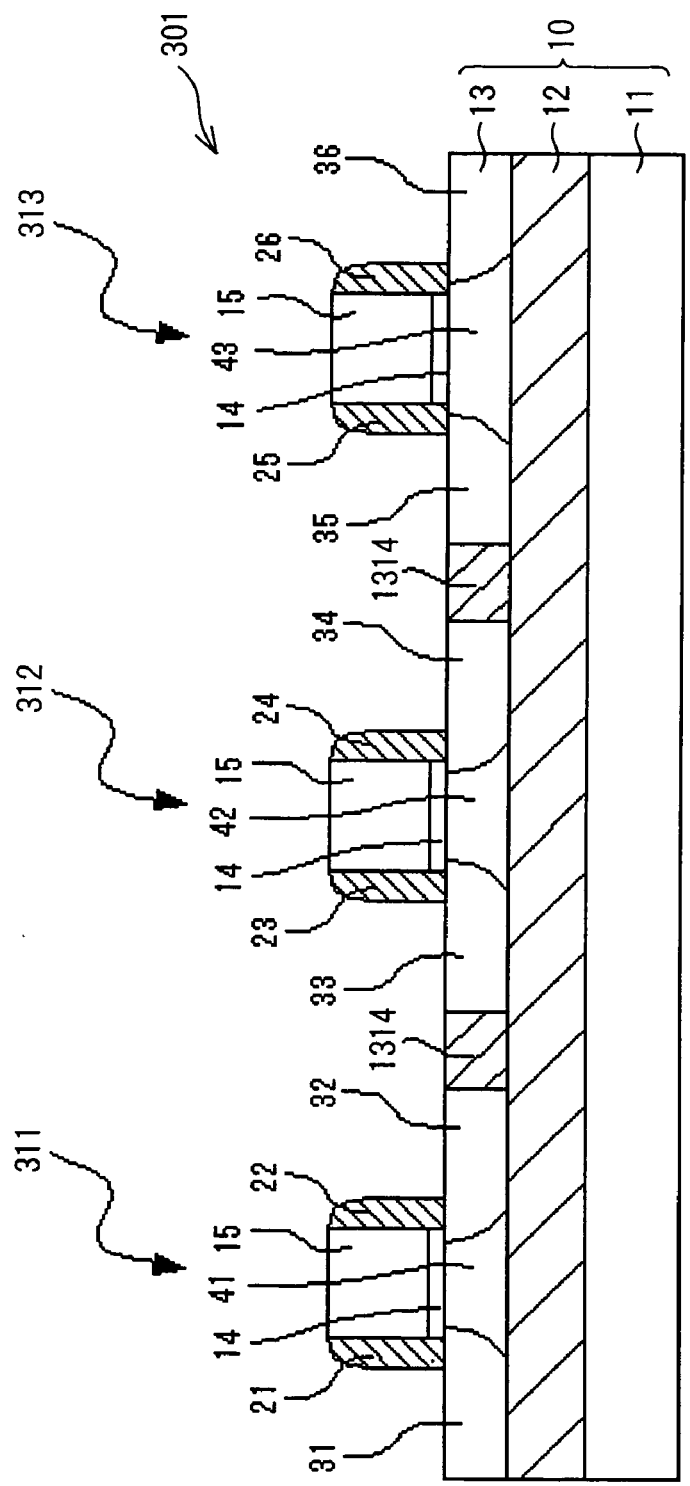
FIG. 21 is a longitudinal sectional view schematically showing a semiconductor storage device or a semiconductor device of one embodiment of the present invention.

FIG. 21 is a longitudinal cross sectional view schematically showing a semiconductor device 301 of the present embodiment. FIG. 22 is a longitudinal cross sectional view schematically showing a semiconductor device 302 which is different from the semiconductor device 301 of FIG. 21 in terms of a substrate used therein. FIG. 23 is a block diagram showing function sections provided on the semiconductor devices 301 and 302.

In each of the semiconductor devices 301 and 302 of the present embodiment, a logic circuit transistor (third field effect transistor) 311, a volatile memory element (first field effect transistor) 312, and a nonvolatile memory element (second field effect transistor) 313 are provided together. Each of these elements is constituted of a field effect transistor.

The semiconductor device 301 shown in FIG. 21 uses a semiconductor substrate 10 in which: an embedded oxide film 12 is formed on a silicon substrate 11, and an SOI layer 13 is formed thereon. In the semiconductor device 301, a logic circuit transistor 311 constituted of a field effect transistor, the volatile memory element 312, and the nonvolatile memory element 313 are formed on the semiconductor substrate 10.

The logic circuit transistor 311 includes: diffusion layer regions (fifth and sixth diffusion layer regions) 31 and 32 formed in the SOI layer 13; a body region 41 formed between the diffusion layer regions 31 and 32; a gate electrode 15 formed above the body region 41 with a gate oxide film 14 intervening therebetween; and gate side wall insulating films 21 and 22 formed on both side walls of the gate electrode 15. Note that, the gate electrode 15 is made of polysilicon, and each of the gate side wall insulating films 21 and 22 is constituted of a silicon nitride film. Each of the gate side wall insulating films 21 and 22 does not have an electric charge retaining function.

The volatile memory element 312 and the nonvolatile memory element 313 are respectively arranged in the same manner as in the volatile memory 1 and the nonvolatile memory element 3 that are respectively described in FIG. 1 (Embodiment 1) and FIG. 3 (Embodiment 2), so that description thereof is omitted here.

Regions of the logic circuit transistor 311, the volatile memory element 312, and the nonvolatile memory element 313 are separated from each other by element separation regions 1314 formed in the SOI layer 13.

The field effect transistors respectively constituting the logic circuit transistor 311, the volatile memory element 312, and the nonvolatile memory element 313 are arranged substantially in the same manner. However, merely in the field effect transistor which functions as the nonvolatile memory element 313, the diffusion layer regions 35 and 36 do not exist under the gate electrode 15, and the diffusion layer regions 35 and 36 do not overlap the gate electrode 15 in a stacking direction of the gate insulating film 14 and the gate electrode 15. That is, merely the nonvolatile memory element 313 has a structure (offset structure) in which the gate electrode 15 is offset by the diffusion layer regions 35 and 36.

Figure 22:
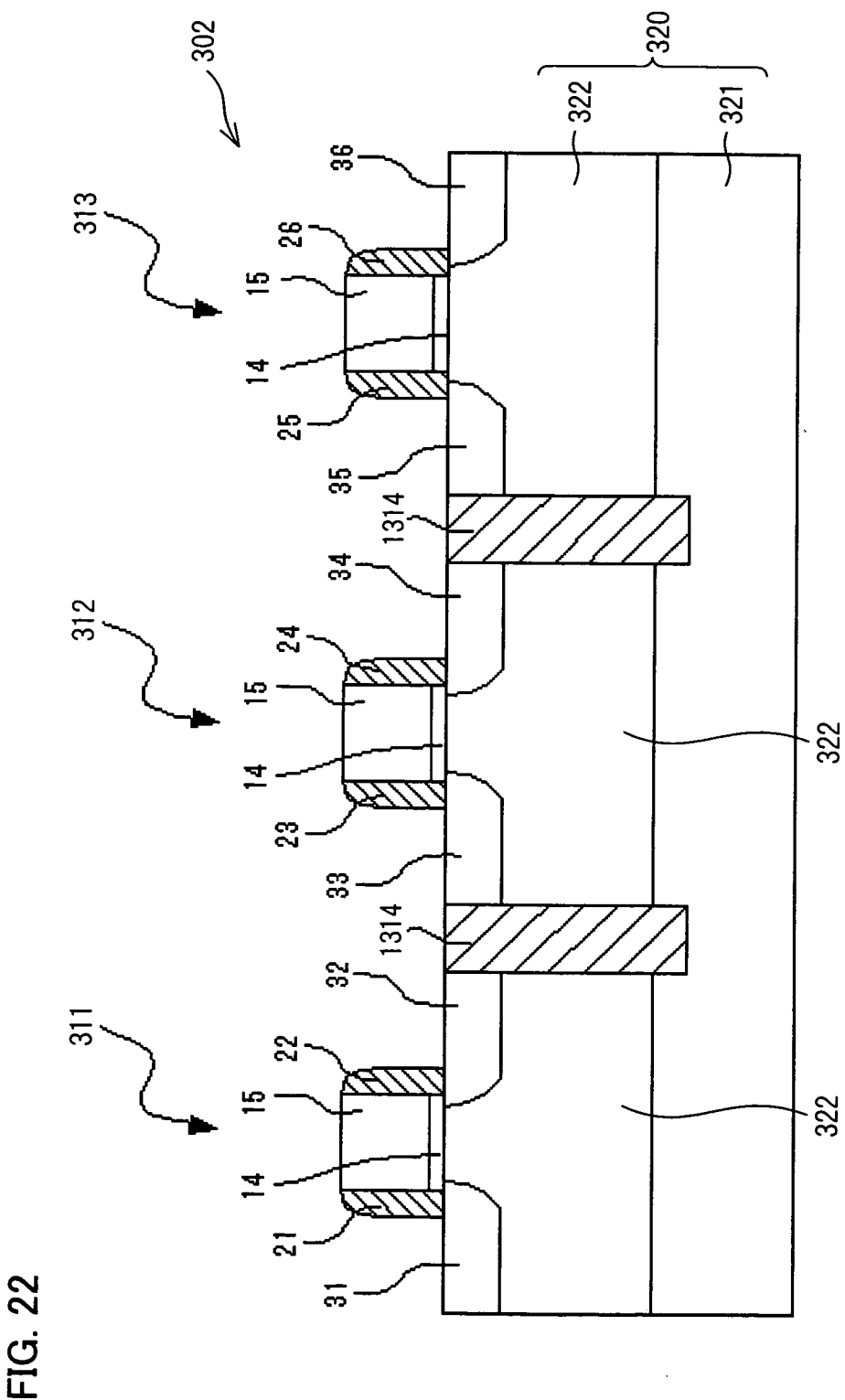
FIG. 22 is a longitudinal sectional view schematically showing another example of the semiconductor storage device or the semiconductor device shown in FIG. 21.

FIG. 22 shows a case of using a bulk substrate 320 instead of the semiconductor substrate 10 in the semiconductor device 301 shown in FIG. 21. In the bulk substrate 320, a P-type well region 322 is formed on an N-type semiconductor substrate (or an N-type well region) 321.

In the bulk substrate 320, at least the P-type well region 322 which belongs to the volatile memory element 312 is separated from a region which belongs to other element. Specifically, the P-type well region 322 is separated from other P-type well region 322 by the element separation region 1314 and the semiconductor substrate 321 for each element. Thus, in the volatile memory element 312, an amount of electric charge stored in the P-type well region 322 corresponds to stored information.

Figure 23:
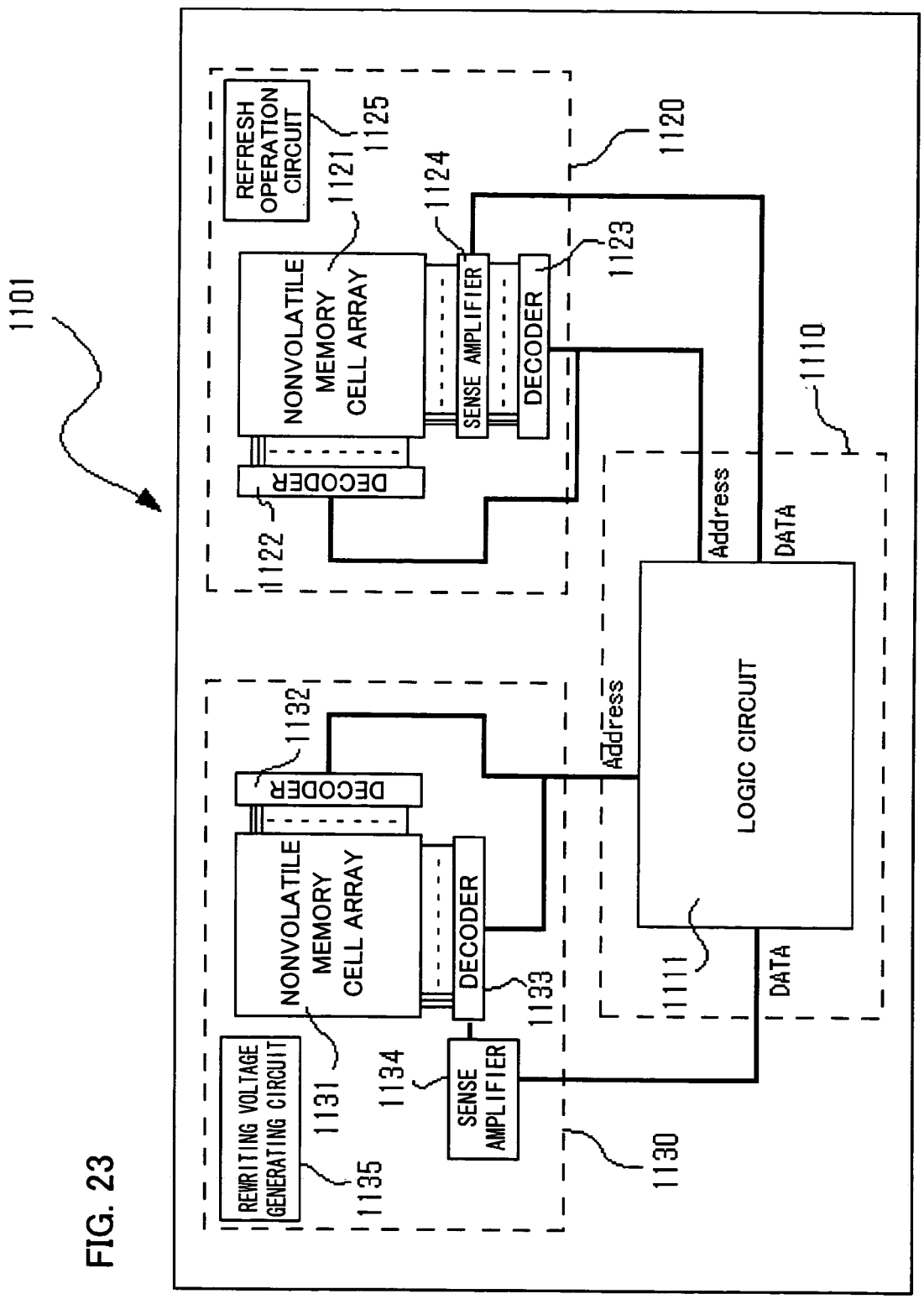
FIG. 23 is a block diagram showing a semiconductor storage device or a semiconductor device of one embodiment of the present invention.

FIG. 23 is a block diagram showing respective function sections of a semiconductor device 1101 constituted of the semiconductor devices 301 or 302. The semiconductor device 1101 includes a logic circuit section 1110, a volatile memory section 1120, and a nonvolatile memory section 1130.

The logic circuit 1110 includes a logic circuit 1111, and the logic circuit 1111 constitutes MPU (Micro Processing Unit) for example.

The volatile memory section 1120 includes a volatile memory cell array (first memory cell array) 1121, a row decoder 1122 having a row driver, a column decoder 1123 having a column driver, a sense amplifier 1124, and a refresh operation circuit 1125. The volatile memory cell array 1121 is arranged so that the volatile memory elements 312 each of which is constituted of a field effect transistor are disposed. Each of the row decoder 1122, the column decoder 1123, the sense amplifier 1124, and the refresh operation circuit 1125 is a volatile memory peripheral circuit (first memory peripheral circuit), and is arranged so that the logic circuit transistors 311 each of which is constituted of a field effect transistor are disposed.

The nonvolatile memory section 1130 includes a nonvolatile memory cell array (second memory cell array) 1131, a row decoder 1132, a column decoder 1133, a sense amplifier 1134, and a rewriting voltage generating circuit 1135. The nonvolatile memory cell array 1131 is arranged so that the nonvolatile memory elements 313 each of which is constituted of a field effect transistor are disposed. Each of the row decoder 1132, the column decoder 1133, the sense amplifier 1134, and the rewriting voltage generating circuit 1135 is a nonvolatile memory peripheral circuit (second memory peripheral circuit), and is arranged so that the logic circuit transistors 311 each of which is constituted of a field effect transistor are disposed.

Note that, circuits included in the volatile memory peripheral circuit and the nonvolatile memory peripheral circuit may belong to the logic circuit section 1110.

Further, in the semiconductor device 1101 shown in FIG. 23, the logic circuit section 1110, the volatile memory section 1120, and the nonvolatile memory section 1130 are provided together. However, it may be so arranged that merely the volatile memory section 1120 and the nonvolatile memory section 1130 are provided. Further, it may be so arranged that: peripheral circuits are not included, and merely the volatile memory cell array 1121 and the nonvolatile memory cell array 1131 are provided together. In this manner, in the semiconductor device 1101 (semiconductor devices 301 or 302), the volatile memory element 312 and the nonvolatile memory element 313 are provided together on a single semiconductor chip, and it is easy to provide them together.

As apparent from the foregoing description, in each of the semiconductor devices 301, 302, and 1101, although the volatile memory element and the nonvolatile memory element are provided together on a single semiconductor chip, structures of the elements are similar to each other in terms of various points, and each of the structures of the elements is similar to an ordinary field effect transistor. Thus, it is possible to form the elements without drastically changing steps performed in forming an ordinary field effect transistor. Thus, it is possible to manufacture the elements with a simple process, and it is possible to easily obtain an arrangement including the volatile memory element and the nonvolatile memory element that are formed on a single chip.

Further, it is preferable that: the volatile memory cell array 1121 arranged so that the volatile memory elements 312 each of which is constituted of a field effect transistor are disposed includes a peripheral circuit having the refresh operation circuit 1125. By making such arrangement, information stored in the volatile memory cell array 1121 is refreshed within a certain time, so that the information is connectively retained. Moreover, the peripheral circuit is constituted of a field effect transistor (logic circuit transistor 311), it is possible to avoid a condition under which formation of the refresh operation circuit 1125 complicates the process.

Further, it is preferable that: the nonvolatile memory cell array 1131 arranged so that the nonvolatile memory elements 313 each of which is constituted of a field effect transistor are disposed includes a peripheral circuit having a rewriting voltage generating circuit which generates a voltage required in rewriting information of the memory cell. By making such arrangement, even in case where a voltage required in rewriting information of the nonvolatile memory element 313 is higher than a voltage for driving other element, the voltage generating circuit generates a voltage required in rewriting information of the nonvolatile memory element 313, so that it is easy to rewrite information of the nonvolatile memory element 313. In this case, it is preferable that a thickness of the gate insulating film 14 of the field effect transistor (nonvolatile memory element 313) to which a high voltage is supplied as required is made thicker.

As described above, the semiconductor device 1101 of the present embodiment does not have to include the logic circuit section 1110. However, in case where not only the volatile memory section 1120 and the nonvolatile memory section 1130 but also the logic circuit section 1110 are provided together, this arrangement exhibits remarkable effects such as improvement of an operation speed of the LSI and reduction of the manufacturing cost, so that this arrangement is preferable.

Further, it is preferable that a power source voltage supplied to the logic circuit section 1110 is lower than a power source voltage supplied to the nonvolatile memory section 1130. According to the arrangement, it is possible to realize a high speed operation by supplying a voltage sufficient to rewrite information in the nonvolatile memory section 1130, so that it is possible to control power consumption in the logic circuit section 1110. Further, it is possible to reduce the withstand voltage of an element constituting the logic circuit section 1110, so that it is possible to miniaturize the element constituting the logic circuit section 1110. Thus, it is possible to realize the semiconductor device 1101, highly integrated, whose operation speed is high and power consumption is low.

Further, it is preferable to form the well region or the body region, which belongs to the volatile memory element 312 constituted of a field effect transistor, on the insulating film. This is because it is possible to greatly reduce the capacitance of the well region or the body region compared with the case where the P-type well region 322 is connected with the N-type semiconductor substrate 321 as shown in FIG. 22. That is, in case where the capacitance of the well region or the body region is small, variation of a potential when electric charge is stored in the well region or the body region is large, so that the memory effect is enhanced. Particularly, as shown in FIG. 21, in case where the volatile memory element 312 is formed on the SOI substrate, it is possible to sufficiently reduce the capacitance of the body region 42 and the capacitance of the diffusion layer regions 33 and 34, so that this arrangement is preferable.

Further, it is preferable that: in the nonvolatile memory element 313 constituted of a field effect transistor, the diffusion layer regions (third and fourth diffusion layer regions) 35 and 36 do not exist under the gate electrode 15, and the nonvolatile memory element 313 has an offset structure. This is based on the following reason. In case where the nonvolatile memory element 13 has the offset structure, a condition under which the offset region under the charge retaining film (memory function sections 25 and 26) tends to invert when a voltage applied to the gate electrode 15 is greatly varied depending on electric charge stored in the memory function sections 25 and 26, so that the memory effect is enhanced.

While, it is preferable that: in the logic circuit transistor 311 constituted of a field effect transistor, each of the diffusion layer regions (first and second diffusion layer regions) 31 and 32 extends so as to be positioned under the gate electrode 15 (the logic circuit transistor 311 does not have an offset structure). Thus, it is possible to make a driving voltage of the logic circuit transistor 311 large, so that it is possible to operate the logic circuit transistor 311 at high speed.

Further, as described above, the field effect transistor which functions as the nonvolatile memory element 313 can retain stored information of 2 bits as a single transistor, but the field effect transistor can retain stored information of merely 1 bit. However, it is more preferable that stored information of 2 bits is retained in a single transistor because it is possible to make the storage capacity of the nonvolatile memory element 313 larger.

Further, it is preferable that: as described in Embodiment 4, in a field effect transistor 3 which functions as the nonvolatile memory element, regions (silicon nitride film 242, charge retaining film) for retaining electric charge in the memory function sections 261 and 262 respectively overlap the diffusion layer regions (third and fourth diffusion layer regions) 212 and 213. By using such memory element in the semiconductor storage device of the present embodiment, it is possible to sufficiently enhance the reading speed of the semiconductor device.

Further, it is preferable to use the best formation process described in Embodiment 2 so as to form the nonvolatile memory element 313. In this case, it is possible to realize a best property of the semiconductor storage device or the semiconductor device.

Embodiment 12

Figure 24:
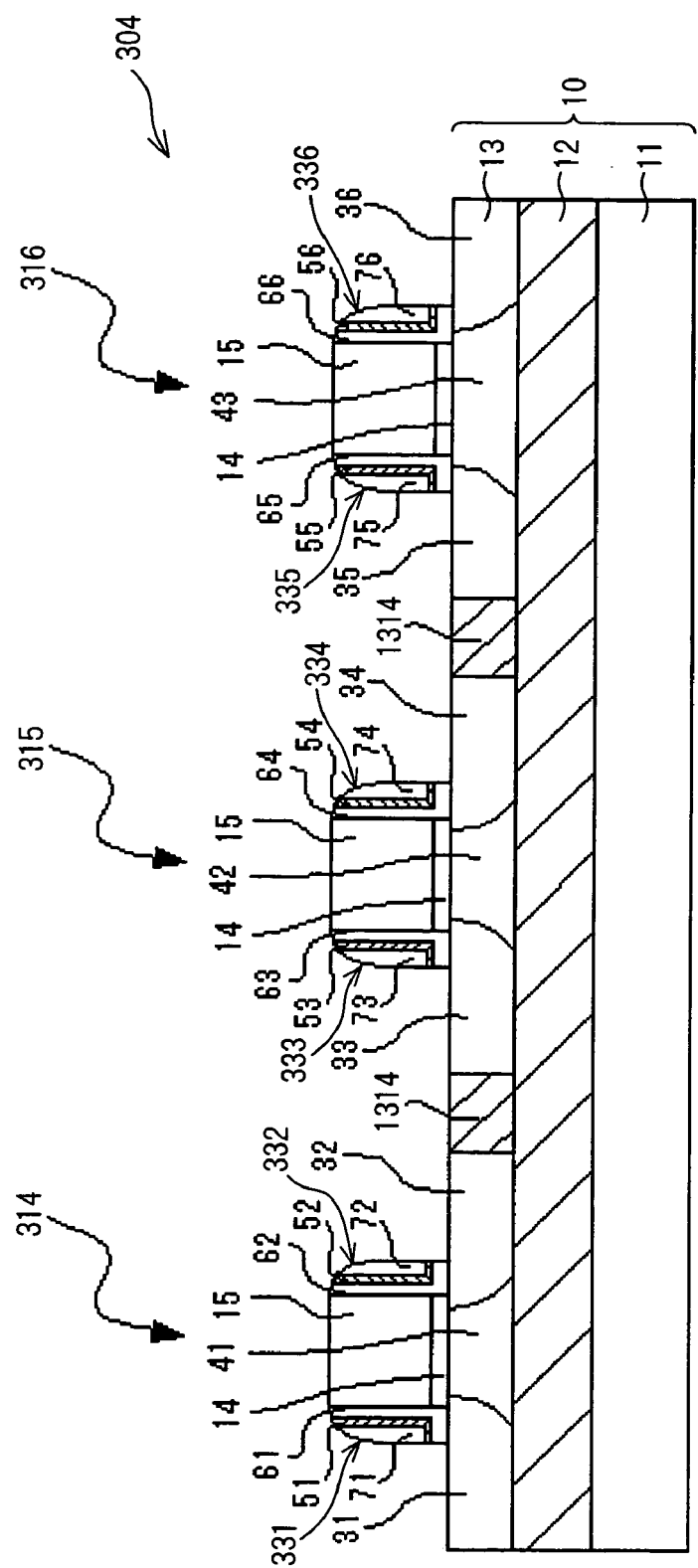
FIG. 24 is a longitudinal sectional view schematically showing a semiconductor storage device or a semiconductor device of another embodiment of the present invention.

The following description will explain a semiconductor device (semiconductor storage device) of the present embodiment with reference to FIG. 24. FIG. 24 is a longitudinal cross sectional view schematically showing an arrangement of a semiconductor device 304 of the present embodiment. Note that, merely differences from an arrangement described in Embodiment 11 (FIG. 21, FIG. 22) will be described here, and description of portions arranged in the same manner is omitted.

In the semiconductor device 304 of the present embodiment, a logic circuit transistor 314, a volatile memory element 315, and a nonvolatile memory element 316 are provided together on a single semiconductor substrate. Each of the logic circuit transistor 314, the volatile memory element 315, and the nonvolatile memory element 316 is constituted of a field effect transistor. The logic circuit transistor 314, the volatile memory element 315, and the nonvolatile memory element 316 are respectively different from the logic circuit transistor 311, the volatile memory element 312, and the nonvolatile memory element 313, that are described in Embodiment 11, in terms of a structure of the memory function section (gate side wall insulating film).

That is, in the semiconductor device 304, a gate side wall insulating film 331 of the logic circuit transistor 314 is arranged so that a silicon nitride film 51 is sandwiched by silicon oxide films 61 and 71, and a gate side wall insulating film 332 of the logic circuit transistor 314 is arranged so that a silicon nitride film 52 is sandwiched by silicon oxide films 62 and 72. A gate side wall insulating film 333 of the volatile memory element 315 is arranged so that a silicon nitride film 53 is sandwiched by silicon oxide films 63 and 73, and a gate side wall insulating film 334 of the volatile memory element 315 is arranged so that a silicon nitride film 54 is sandwiched by silicon oxide films 64 and 74. A memory function section (gate side wall insulating film) 335 of the nonvolatile memory element 316 is arranged so that a silicon nitride film 55 is sandwiched by silicon oxide films 65 and 75, and a memory function section (gate side wall insulating film) 336 of the nonvolatile memory element 316 is arranged so that a silicon nitride film 56 is sandwiched by silicon oxide films 66 and 76.

In the nonvolatile memory element (second field effect transistor) 316 constituted of a field effect transistor, it is preferable that: as described above, in the memory function sections 335 and 336, a film (silicon nitride film 55, charge retaining film) constituted of a first insulator having a function for trapping electric charge is sandwiched by films (silicon oxide films 65 and 75) each of which is constituted of a second insulator and a film (silicon nitride film 56, charge retaining film) constituted of a first insulator having a function for trapping electric charge is sandwiched by films (silicon oxide film 66 and 76) each of which is constituted of a third insulator.

According to the arrangement, each of the first insulators (silicon nitride films 55 and 56) storing electric charge is in a film shape, so that it is possible to enhance charge concentration in the first insulators (silicon nitride films 55 and 56) in a short time by injecting electric charge, and it is possible to uniform the charge concentration. Note that, in case where charge distribution in the first insulators for storing electric charge is uneven, the electric charge moves in the first insulators while retaining the electric charge, so that the reliability of the memory element may be lowered.

Further, the first insulator (silicon nitride films 55 and 56) for storing electric charge is separated from conductor sections (gate electrode 15, diffusion layer regions 35 and 36, channel region, semiconductor substrate 10) by other insulating film (silicon oxide films 65 and 66), so that leakage of the electric charge is suppressed, thereby obtaining a sufficient retaining time. Thus, in case where each of the memory function sections 335 and 336 has the sandwich structure, it is possible to realize high speed rewriting, improvement of the reliability, and the sufficient retaining time of the nonvolatile memory element (semiconductor storage device) 316.

As specific arrangement of the memory function sections 335 and 336 realizing the foregoing functions, it is particularly preferable to arrange them so that: the silicon nitride film (silicon nitride films 55 and 56) functions as the first insulator, and the silicon oxide films (silicon oxide films 65 and 66, silicon oxide films 75 and 76) as the second insulators. The silicon nitride film has a large number of levels for trapping electric charge, so that it is possible to obtain a great hysteresis property. The silicon oxide film has a large band gap, so that it is highly effective in preventing electric charge from scattering. Further, the silicon nitride film and the silicon oxide film are so ordinarily used in the LSI process, so that use of them is preferable in terms of a manufacturing process.

It is preferable that a thickness of each of the silicon oxide films 65 and 66 is 3 nm to 15 nm. In case where the thickness of each of the silicon oxide films 65 and 66 is less than 3 nm, electric charge stored in the silicon nitride films 55 and 56 tends to escape, so that the retaining property is deteriorated. In case where the thickness of each of the silicon oxide films 65 and 66 exceeds 15 nm, an efficiency at which information is written in the silicon nitride films 55 and 56 drops, so that the writing time increases. Thus, when the thickness of each of the silicon oxide films 65 and 66 is set to be 3 nm to 15 nm, the nonvolatile memory element 316 realizes a sufficient retaining property and high-speed rewriting at the same time, so that the arrangement is preferable.

Further, it is preferable that the thickness of each of the silicon nitride films 55 and 56 is 2 nm to 10 nm. In case where the thickness of each of the silicon nitride films 55 and 56 is less than 2 nm, the electric charge trapping concentration in the silicon nitride film is insufficient, so that the threshold value of the memory element does not sufficiently vary. In case where the thickness of each of the silicon nitride films 55 and 56 exceeds 10 nm, it is difficult to uniformly inject electric charge into the silicon nitride film in rewriting information, or it takes long time to rewrite information. Thus, when the thickness of each of the silicon nitride films 55 and 56 is set to be 2 nm to 10 nm, the nonvolatile memory element 316 has sufficient reliability, so that the arrangement is preferable.

Further, as described in Embodiment 4 (FIG. 9), it is preferable to arrange the nonvolatile memory element 316 so that: each of the memory function sections 335 and 336 includes the charge retaining film disposed substantially in parallel to a surface of the gate insulating film 14. By using such nonvolatile memory element 316 in the semiconductor storage device or the semiconductor device 304 of the present embodiment, it is possible to reduce unevenness in the memory effect of the nonvolatile memory element 316, so that it is possible to suppress unevenness in a reading current of the semiconductor storage device or the semiconductor device 304. Further, it is possible to reduce property variation of the nonvolatile memory element 316 in retaining the stored information, so that the semiconductor storage device or the semiconductor device 304's property for retaining the stored information is improved.

Further, as described in Embodiment 5 (FIG. 14), it is preferable to arrange the nonvolatile memory element 316 so that: each of the memory function sections 335 and 336 includes the charge retaining film disposed substantially in parallel to a surface of the gate insulating film 14, and the charge retaining film includes a portion extending substantially in parallel to a side face of the gate electrode 15. When such nonvolatile memory element 316 is used in the semiconductor storage device or the semiconductor device 304 of the present embodiment, a rewriting speed of the nonvolatile memory element 316 is improved, so that it is possible to perform the rewriting operation in the semiconductor storage device or the semiconductor device 304 at higher speed.

Further, in the semiconductor device 304, as the nonvolatile memory element 316, it is preferable to use a nonvolatile memory element (nonvolatile memory element 6A) described in Embodiment 8 (FIG. 18). That is, in the nonvolatile memory element 316, it is preferable that: the thickness T1 of each of the silicon oxide films 65 and 66 (silicon oxide film 241) for respectively separating the silicon nitride films 55 and 56, each of which functions as the charge retaining film, from the channel region or the well region is 0.8 nm or more so that the thickness T1 is thinner than the thickness T2 of the gate insulating film 14 (gate insulating film 214).

When such nonvolatile memory element 316 is used in the semiconductor storage device or the semiconductor device 304 of the present embodiment, it is possible to drop a voltage in the writing and erasing operation, or it is possible to improve a speed at which the writing and erasing operation are performed. Further, the memory effect of the nonvolatile memory element 316 is enhanced, so that it is possible to improve the reading speed of the semiconductor storage device or the semiconductor device 304.

Further, as the nonvolatile memory element 316, it is preferable to use the nonvolatile memory element (nonvolatile memory element 6B) described in Embodiment 9 (FIG. 19). That is, it is preferable that: the thickness T1 of each of the silicon oxide films 65 and 66 (silicon oxide film 241) for respectively separating the silicon nitride films 55 and 56, each of which functions as the charge retaining film, from the channel region or the well region is 20 nm or less so that the thickness T1 is thicker than the thickness T2 of the gate insulating film 14 (gate insulating film 214).

When such nonvolatile memory element 316 is used in the semiconductor storage device or the semiconductor device 304 of the present embodiment, it is possible to improve the retaining property without accelerating the short channel effect of the nonvolatile memory element 316. Thus, it is possible to obtain a sufficient property for retaining the stored information even when the semiconductor storage device or the semiconductor device 304 is highly integrated.

Embodiment 13

Figure 25:
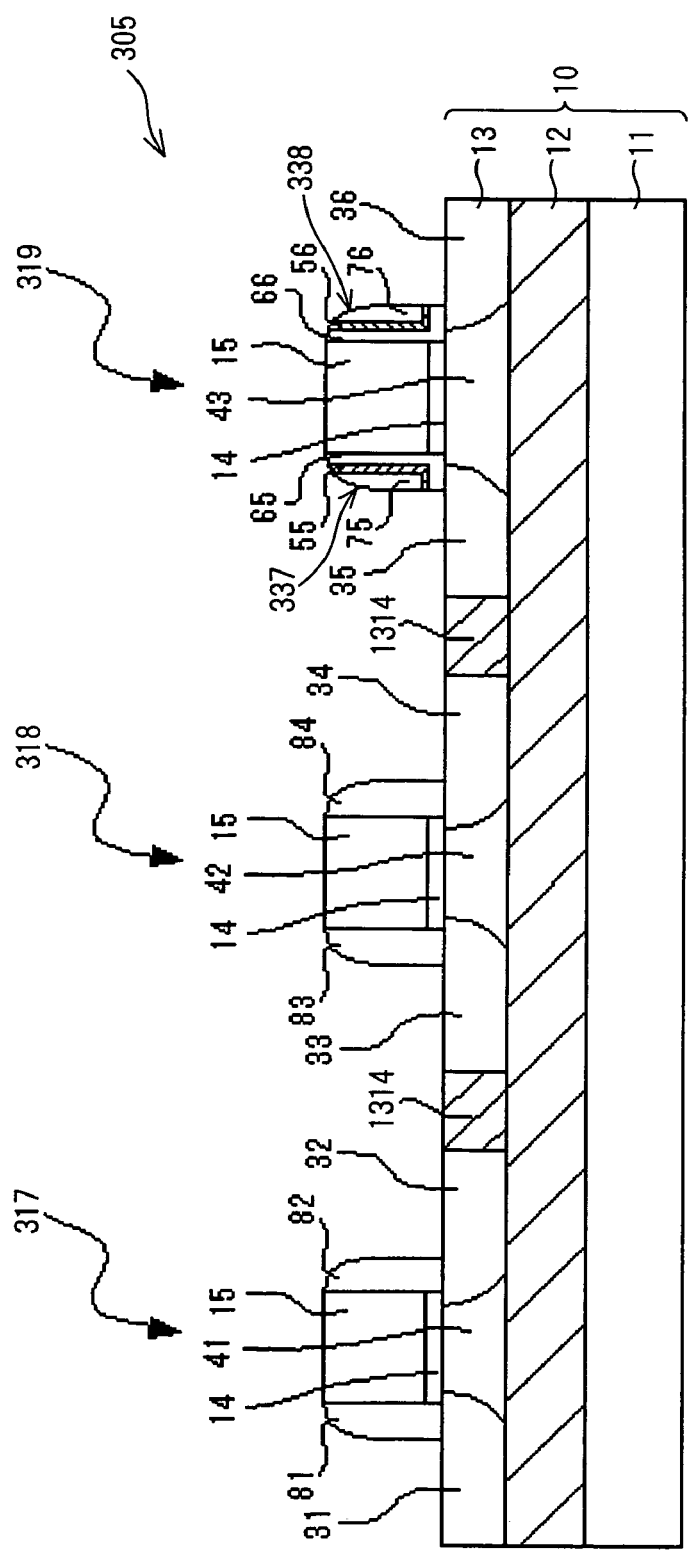
FIG. 25 is a longitudinal sectional view schematically showing a semiconductor storage device or a semiconductor device of still another embodiment of the present invention.
Figure 26:
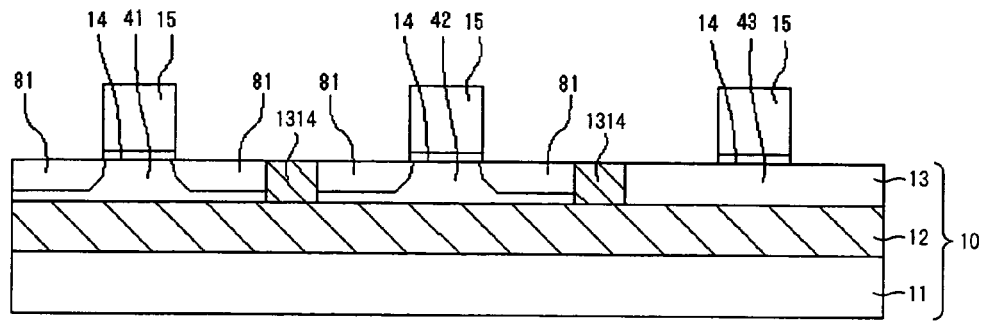
FIG. 26(a) is a longitudinal sectional view which shows a manufacturing process of the semiconductor storage device or the semiconductor device shown in FIG. 25 so as to show a step of forming a gate electrode and a step of injecting N-type impurity ions into a semiconductor substrate.
FIG. 26(b) is a longitudinal sectional view which shows a step of stacking a silicon oxide film and a silicon nitride film on and above the semiconductor substrate in the same manufacturing process.
FIG. 26(c) is a longitudinal sectional view which shows a step of etching the silicon nitride film.
Figure 26:
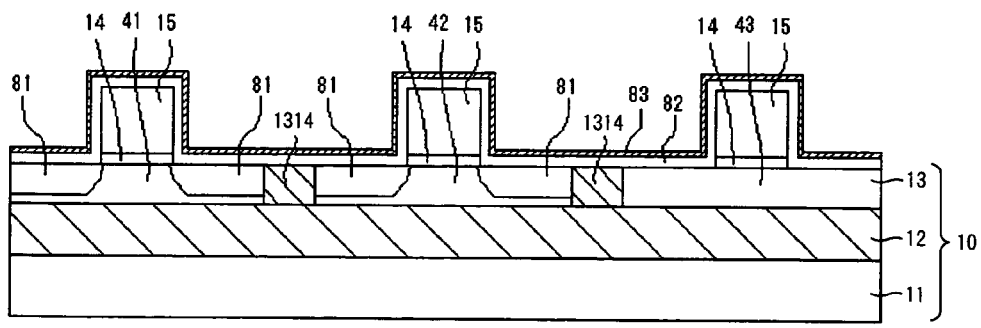
Figure 26:
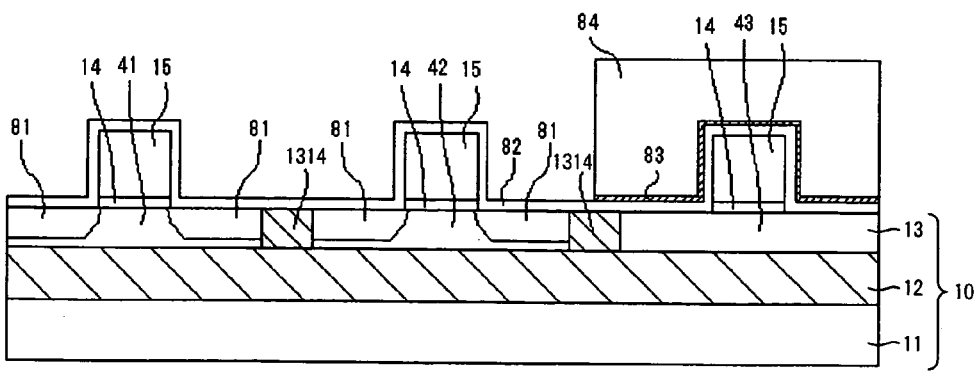
Figure 27:
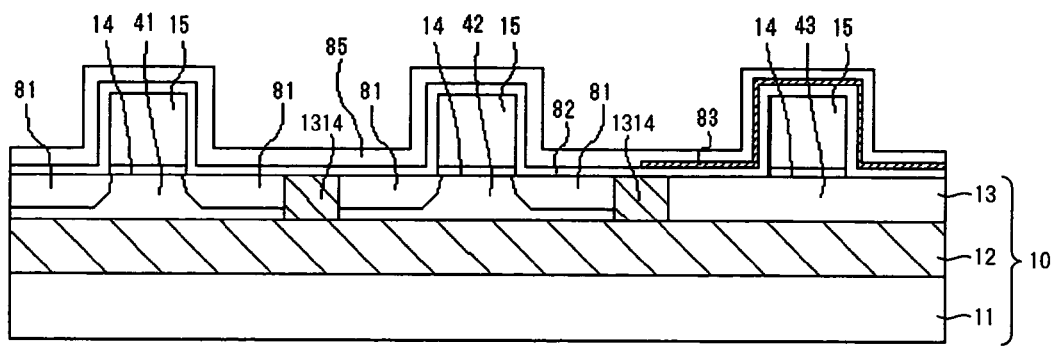
FIG. 27(a) is a longitudinal sectional view which shows a manufacturing process of the semiconductor storage device or the semiconductor device that is performed after the manufacturing process shown in FIG. 26(a) so as to show a step of forming the silicon oxide film.
FIG. 27(b) is a longitudinal sectional view which shows a step of forming the memory function section by etching the silicon oxide film and the silicon nitride film.
Figure 27:
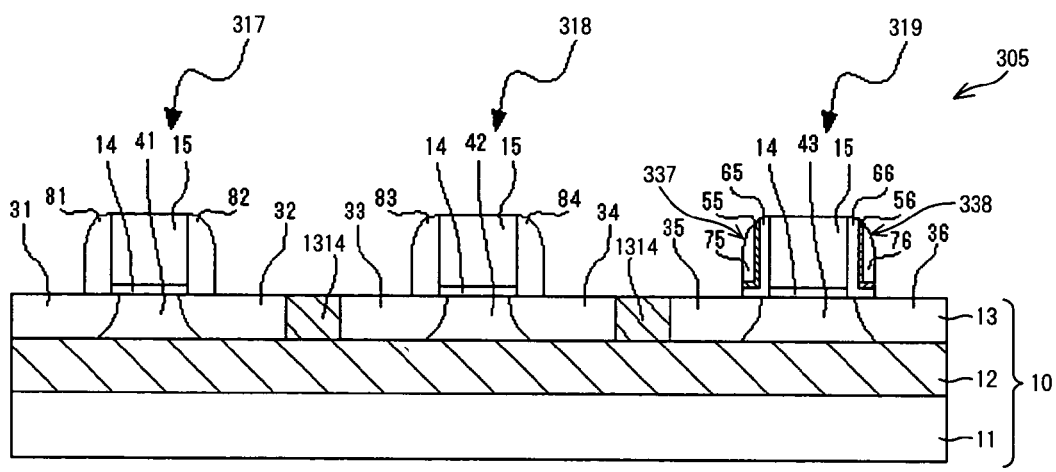

The following description will explain a semiconductor device (semiconductor storage device) of the present embodiment with reference to FIG. 25 to FIG. 27. FIG. 25 is a longitudinal cross sectional view schematically showing a semiconductor device 305 of the present embodiment. Each of FIG. 26 and FIG. 27 is a longitudinal cross sectional view schematically showing manufacturing steps of the semiconductor device 305 of the present embodiment. Note that, merely differences from an arrangement described in Embodiment 12 (FIG. 24) will be described here, and description of portions arranged in the same manner is omitted.

In the semiconductor device 305 of the present embodiment, a logic circuit transistor 317, a volatile memory element 318, and a nonvolatile memory element 319 are provided together on a single semiconductor substrate. Each of the logic circuit transistor 317, the volatile memory element 318, and the nonvolatile memory element 319 is constituted of a field effect transistor. There are the logic circuit transistor 317, the volatile memory element 318, and the nonvolatile memory element 319. Among them, the logic circuit transistor 317 and the volatile memory element 318 are respectively different from the logic circuit transistor 314 and the volatile memory element 315, that are described in Embodiment 12, in terms of a structure of the gate side wall insulating film.

That is, in the semiconductor device 305, each of gate side wall insulating films 81 and 82 of the logic circuit transistor 317 is constituted merely of a silicon oxide film, and each of gate side wall insulating films 83 and 84 of the volatile memory element 318 is constituted merely of a silicon oxide film. While, memory function sections (gate side wall insulating films) 337 and 338 of the nonvolatile memory element 319 are arranged in the same manner as in the memory function sections 335 and 336 of the nonvolatile memory element 316, and the memory function section 337 is arranged so that a silicon nitride film 55 is sandwiched by silicon oxide films 65 and 75, and the memory function section 338 is arranged so that a silicon nitride film 56 is sandwiched by silicon oxide films 66 and 76.

According to the semiconductor device 305 of the present embodiment, in the volatile memory element 318 constituted of a field effect transistor, it is possible to prevent electric charge from being injected into the gate side wall insulating films 83 and 84, thereby preventing a transistor property thereof from varying. That is, in the volatile memory element 315 shown in FIG. 24 for example, hot electrons generated in writing a "1" value are injected into the silicon nitride films 53 and 54, so that the threshold value of the transistor may vary. On the other hand, in the volatile memory element 318 arranged so that each of the gate side wall insulating films 83 and 84 is constituted merely of the silicon oxide film, it is possible to prevent the foregoing condition. Thus, in the volatile memory element 318, that is, in the semiconductor device 305, it is possible to improve the reliability thereof.

Next, important portions of the manufacturing steps of the semiconductor device 305 are described as follows with reference to FIG. 26 and FIG. 27.

When manufacturing the semiconductor device 305, first, as shown in FIG. 26(a), the gate electrode 15 is formed, and ions of an N-type impurity are injected while using the gate electrode 15 as a mask. In injecting the ions, a region which should function as the nonvolatile memory element 319 is masked by a photo resist.

The ion injection is performed in order to form LDD (Lightly Doped Drain) regions of the logic circuit transistor 317 and the volatile memory element 318. Thus, it is possible to offset merely the nonvolatile memory element 319 to which the ions are not injected. The foregoing step can be applied to a manufacturing process of the semiconductor devices 301. 302, and 304 that are respectively shown in FIG. 21, FIG. 22, and FIG. 24.

Next, as shown in FIG. 26(b), the silicon oxide film 82 and the silicon nitride film 83 are stacked on and above an entire surface of the semiconductor substrate 10 in this order. It is preferable to form the silicon oxide film 82 so that its thickness is 0.8 nm to 20 nm, and it is preferable to form the silicon nitride film 83 so that its thickness is 2 nm to 10 nm.

Next, as shown in FIG. 26(c), the photo resist 84 is patterned, and a region which should be used as the nonvolatile memory element 319 is masked, and the silicon nitride film 83 is selectively removed. In order to remove the silicon nitride film 83, wet etching is performed by using phosphoric acid, or dry etching which realizes a great effect as isotopic etching is performed.

Next, as shown in FIG. 27(a), the silicon oxide film 85 is stacked on an entire surface of the silicon oxide film 82 after removing the photo resist 84.

Next, as shown in FIG. 27(b), the silicon oxide films 82, 85, and the silicon nitride film 83 are selectively etched back, thereby forming the memory function sections 337 and 338. Thus, it is possible to provide the silicon nitride films 55 and 56 merely on the memory function sections 337 and 338 of the nonvolatile memory element 319. Thereafter, ions of an N-type impurity are injected while using the gate electrode 15, the gate side wall insulating films 81 to 84, and the memory function sections 337 and 338 as masks. By injecting the ions and subsequently performing a thermal process, the diffusion layer regions 31, 32, 33, 34, 35, and 36 are formed.

Thereafter, upper wirings are formed by a known method, thereby completing the semiconductor device 305.

According to the foregoing procedure, it is possible to improve the reliability of the field effect transistor as the volatile memory element 318 with a simple process. Further, it is possible to form the field effect transistor, which can rewrite information at a high speed, and can retain information for a sufficiently long time, and has high reliability, and functions as the nonvolatile memory element 319, with a simple process.

Each of the semiconductor devices 301, 302, 304, and 305 that are described in Embodiments 11 to 13 can be used in a mobile electronic device driven by battery, particularly in a mobile information terminal. Examples of the mobile electronic device include the mobile information terminal, a cellular phone, a game device, and the like.

Figure 28:
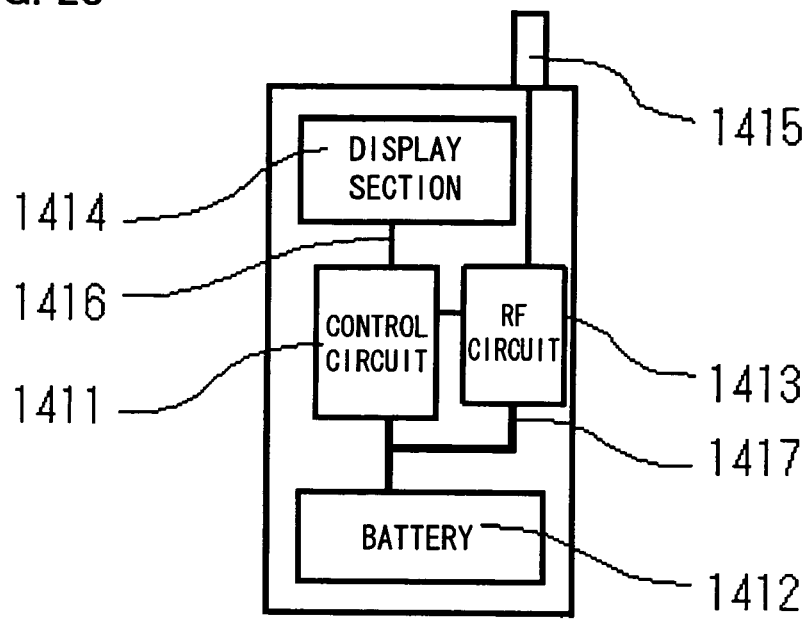
FIG. 28 is a block diagram showing an example of a cellular phone using any one of the semiconductor devices shown in FIG. 24 and FIG. 25.

FIG. 28 shows an example of where any one of the semiconductor devices 301, 302, 304, and 305 is applied to a cellular phone 1410. In FIG. 28, the semiconductor device of the present embodiment is provided on a control circuit 1411. It is preferable that: the control circuit 1411 is an integrated circuit arranged so that elements, which are identical with each other in terms of a structure, respectively function as the volatile memory element, the nonvolatile element, and the logic circuit element, as described in Embodiments 11 to 13. 1412 is a battery, and 1413 is an RF (radio frequency) circuit section, and 1414 is a display section, and 1415 is an antenna section, and 1316 is a signal line, and 1417 is a power source line.

The semiconductor device of the present embodiment is arranged so that the volatile memory element and the nonvolatile memory element are provided together on a single semiconductor chip, and can be formed with a simple process. Thus, the semiconductor device has high performance, and can be manufactured at lower cost. Therefore, by using the semiconductor device in a mobile electronic device, it is possible to improve functions and an operation speed of the mobile electronic device, and it is possible to reduce the manufacturing cost.

The semiconductor device of the present invention includes the aforementioned semiconductor storage device, and further includes a plurality of the field effect transistors, provided on the semiconductor chip, which function as a logic circuit section, wherein each of the field effect transistors has fifth and sixth diffusion layer regions and the gate electrode.

According to the arrangement, the semiconductor device includes a plurality of the field effect transistors which function as the logic circuit section, so that the volatile memory, the nonvolatile memory, and the logic circuit are provided together on a single semiconductor chip. In the case where the logic circuit is provided together as described above, it is possible to obtain a remarkable effect such as improvement of an operation speed of the LSI and reduction of the manufacturing cost compared with the case where merely the volatile memory and the nonvolatile memory are provided together.

The semiconductor storage device may be arranged so that: a plurality of the first field effect transistors and a plurality of the second field effect transistors are formed on the semiconductor chip, and the first field effect transistors are disposed so as to constitute a first memory cell array, and the second field effect transistors are disposed so as to constitute a second memory cell array, and (I) a first memory peripheral circuit for refreshing memory cells of the first memory cell array and (II) a second memory peripheral circuit having a voltage generating circuit for generating a voltage required in rewriting information of memory cells of the second memory cell array are provided on the semiconductor chip, and each of the first and second memory peripheral circuits includes a plurality of third field effect transistors each of which has fifth and sixth diffusion layer regions and a gate electrode.

According to the arrangement, the first and second field effect transistors are respectively disposed so as to constitute the first and second memory cell arrays, and the first memory cell array includes the first memory peripheral circuit having a circuit for performing a refreshing operation, and the second memory cell array includes the second memory peripheral circuit having the voltage generating circuit for generating a voltage required in rewriting information. Thus, information stored in the first memory cell array can be refreshed by the first memory peripheral circuit at constant intervals, so that the stored information can be connectively retained.

Moreover, the first memory peripheral circuit is constituted of the third field effect transistor, so that it is possible to prevent formation of the refresh operation circuit (first memory peripheral circuit) from complicating the process.

Furthermore, there is provided the second memory peripheral circuit having the voltage generating circuit. Thus, even when a voltage required in varying an amount of electric charge retained in the charge retaining section of the second field effect transistor is larger than a voltage for driving the first field effect transistor, that voltage is generated by the voltage generating circuit (second memory peripheral circuit), thereby rewriting information of the second memory cell.

The semiconductor device of the present invention includes the foregoing semiconductor storage device, and further includes a logic circuit section constituted of the third field effect transistor.

According to the arrangement, the semiconductor device further includes the third field effect transistor constituting the logic circuit section, so that the volatile memory, the nonvolatile memory, and the logic circuit section are provided together on a single semiconductor chip. In the case where also the logic circuit is provided in this manner, it is possible to obtain a remarkable effect such as improvement of an operation speed of the LSI and reduction of the manufacturing cost compared with the case where merely the volatile memory and the nonvolatile memory are provided together.

The foregoing semiconductor device may be arranged so that: a power source voltage supplied to the logic circuit section is lower than a power source voltage supplied to the second memory cell array and the second memory peripheral circuit.

According to the arrangement, the second memory cell array which functions as the nonvolatile memory section operates at high speed by receiving a sufficient voltage for rewriting information, and it is possible to suppress the power consumption in the logic circuit section. Further, it is possible to drop the pressure resistance of an element (third field effect transistor) constituting the logic circuit section, so that it is possible to miniaturize the logic circuit section. Thus, it is possible to provide a highly integrated semiconductor device which operates at high speed and realizes low power consumption.

The foregoing semiconductor storage device may be arranged so that: the third and fourth diffusion layer regions in the second field effect transistor are respectively positioned externally away from the gate electrode in the gate length direction so as not to overlap the gate electrode in a stacking direction of the gate electrode on the semiconductor chip, and the fifth and sixth diffusion layer regions in the third field effect transistor are respectively positioned so as to overlap the gate electrode in a stacking direction of the gate electrode on the semiconductor chip.

According to the arrangement, the second field effect transistor has an offset structure in which: the third and fourth diffusion layer regions do not overlap the gate electrode in a stacking direction of the gate electrode above the semiconductor chip (the third and fourth diffusion layer regions are not positioned under the gate electrode). Thus, when a voltage is applied to the gate electrode, a condition under which the offset region under the memory function section tends to invert is greatly varied depending on an amount of electric charge stored in the memory function section, so that the memory effect is enhanced (an amount of a current flowing from one diffusion layer region to the other diffusion layer region greatly varies).

Meanwhile, in the third field effect transistor, the fifth and sixth diffusion layer regions overlap the gate electrode in a stacking direction of the gate electrode above the semiconductor chip (the fifth and sixth diffusion layer regions are positioned under the gate electrode), so that it is possible to make the driving voltage sufficiently large. Thus, it is possible to provide a semiconductor storage device which realizes a high-speed logic circuit section and a preferable memory property.

The foregoing semiconductor storage device may be arranged so that: an amount of electric charge retained in one of the memory function sections in the second field effect transistor and an amount of electric charge retained in the other of the memory function sections in the second field effect transistor are respectively controlled, and the second field effect transistor retains quaternary or more information.

According to the arrangement, it is possible to enlarge the storage capacity of the nonvolatile memory section (second field effect transistor).

The foregoing semiconductor storage device may be arranged so that: the well region or the body region of the first field effect transistor are formed on an insulating film, and are electrically separated from a well region or a body region of another field effect transistor adjacent to the first field effect transistor by the insulating film and an element separation region provided on the well region or the body region.

According to the arrangement, it is possible to greatly reduce the capacitance of the well region or the body region, so that it is possible to obtain a remarkable memory effect of the first field effect transistor.

The foregoing semiconductor storage device may be arranged so that: the field effect transistors are formed on an SOI substrate.

According to the arrangement, the capacitance of the PN junction between the well region or the body region and the diffusion layer region is made sufficiently small, so that it is possible to obtain a further remarkable memory effect of the first field effect transistor.

The foregoing semiconductor storage device may be arranged so that: each of the memory function sections of the second field effect transistor is constituted of first, second, and third insulating films, and the first insulating film which has a function for storing electric charge is sandwiched by the second insulating film and the third insulating film each of which has a function for preventing the electric charge from scattering.

According to the arrangement, the first insulating film having a function for storing electric charge is in a film shape, so that it is possible to improve the electric charge concentration in the first insulating film in a shorter time by injecting electric charge, and it is possible to uniform the electric charge concentration. Further, the first insulating film storing electric charge is separated from the conductor section (gate electrode, diffusion layer regions, well region or body region) by the second or third insulating film, so that leakage of electric charge is suppressed, thereby obtaining sufficient retaining time. Thus, it is possible to realize high speed rewriting, improvement of the reliability, and sufficient retaining time in the semiconductor storage device.

The foregoing semiconductor storage device may be arranged so that: a gate insulating film is formed under the gate electrode, and the first insulating film of the memory function section includes a portion, being opposite to a plane parallel to a surface of the gate insulating film via the second insulating film, whose plane extends along that plane.

According to the arrangement, it is possible to reduce unevenness in the memory effect of the second field effect transistor, so that it is possible to suppress unevenness in a reading current of the semiconductor storage device. Further, it is possible to reduce variation in properties of the second field effect transistor which retains stored information, so that the semiconductor storage device's property for retaining stored information is improved.

The foregoing semiconductor storage device may be arranged so that: the first insulating film of the memory function section includes a portion, being opposite to a side face of the gate insulating film via the second insulating film, which extends along the side face.

According to the arrangement, electric charge injected into the memory function section in causing the second field effect transistor to perform the rewriting operation increases, and the rewriting speed is improved, so that it is possible to cause the semiconductor storage device to perform the rewriting operation at higher speed.

The foregoing semiconductor storage device may be arranged so that: the gate electrode of the second field effect transistor is formed above the well region or the body region via the gate insulating film, and the first insulating film of the memory function section is separated from the well region or the body region by the second insulating film, and a thickness of the second insulating film is thinner than a thickness of the gate insulating film and is 0.8 nm or more.

According to the arrangement, the thickness of the second insulating film is thinner than the thickness of the gate insulating film, so that it is possible to drop a voltage required in the writing and erasing operation of the semiconductor storage device, or it is possible to perform the writing and erasing operation at higher speed. Further, the memory effect of the second field effect transistor constituting the semiconductor storage device is enhanced, so that it is possible to improve the reading speed of the semiconductor storage device. Note that, it is preferable to set the thickness of the second insulating film to be 0.8 nm or more. The thickness of 0.8 nm enables uniformity in the manufacturing process and quality of the film to be kept at a certain level, and is a limit above which the retaining property is not significantly deteriorated.

The foregoing semiconductor storage device may be arranged so that: the gate electrode of the second field effect transistor is formed above the well region or the body region via the gate insulating film, and the first insulating film of the memory function section is separated from the well region or the body region by the second insulating film, and a thickness of the second insulating film is thicker than a thickness of the gate insulating film and is 20 nm or less.

According to the arrangement, the thickness of the second insulating film is thicker than the thickness of the gate insulating film, so that it is possible to enhance a function for preventing electric charge retained in the memory function section from scattering. Thus, it is possible to improve the retaining property without promoting a short channel effect of the second field effect transistor constituting the semiconductor storage device. As a result, it is possible to obtain a sufficient property for retaining stored information even when the semiconductor storage device is highly integrated. Note that, it is preferable to set the thickness of the second insulating film to be 20 nm or less taking drop of the rewriting speed into consideration.

The foregoing semiconductor storage device may be arranged so that: the first insulating film is a silicon nitride film, and each of the second and third insulating films is a silicon oxide film.

According to the arrangement, the first insulating film is a silicon nitride film in which there are a large number of levels for trapping electric charge, so that it is possible to enhance hysteresis of the nonvolatile memory. Further, the second insulating film is a silicon oxide film which has a large band gap and so effectively prevents electric charge from scattering, so that it is possible to obtain a superior retaining property in the nonvolatile memory. Further, the silicon oxide film and the silicon nitride film are materials that are ordinarily used in the LSI process, so that the arrangement is preferable.

The foregoing semiconductor storage device may be arranged so that: the first field effect transistor includes gate side wall insulating films provided on both side walls of the gate electrode in the gate length direction, and each of the gate side wall insulating films does not have a function for retaining electric charge (for example, each of the gate side wall insulating films does not include a material having a function for retaining electric charge).

According to the arrangement, the first field effect transistor which functions as the volatile memory does not include a material having a function for retaining electric charge. Thus, in the first field effect transistor, it is possible to prevent electric charge injected into the gate side wall insulating film from varying the transistor property. Thus, it is possible to improve the reliability of the first field effect transistor which functions as the volatile memory element.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor storage device, comprising
one or more first field effect transistors and one or more second field effect transistors that are formed on a single semiconductor chip, wherein:
the first field effect transistor includes a well region or a body region, a gate electrode, and first and second diffusion layer regions, and the first field effect transistor varies an amount of a current, flowing from the first diffusion layer region to the second diffusion layer region in applying a voltage to the gate electrode, in accordance with an amount of electric charge retained in the well region or the body region, and
the second field effect transistor includes third and fourth diffusion layer regions, a gate electrode, and memory function sections, formed on both side walls of the gate electrode so as to be disposed in a gate length direction, each of which has a charge retaining function, and the second field effect transistor varies an amount of a current, flowing from the third diffusion layer region to the fourth diffusion layer region in applying a voltage to the gate electrode, in accordance with an amount of electric charge retained in the memory function sections.

2. The semiconductor storage device as set forth in claim 1, wherein:
a plurality of the first field effect transistors and a plurality of the second field effect transistors are formed on the semiconductor chip, and the first field effect transistors are disposed so as to constitute a first memory cell array, and the second field effect transistors are disposed so as to constitute a second memory cell array, and
a first memory peripheral circuit for refreshing memory cells of the first memory cell array and a second memory peripheral circuit having a voltage generating circuit for generating a voltage required in rewriting information of memory cells of the second memory cell array are provided on the semiconductor chip, and
each of the first and second memory peripheral circuits includes a plurality of third field effect transistors each of which has fifth and sixth diffusion layer regions and a gate electrode.

3. The semiconductor storage device as set forth in claim 2, wherein:
the third and fourth diffusion layer regions in the second field effect transistor are respectively positioned externally away from the gate electrode in the gate length direction so as not to overlap the gate electrode in a stacking direction of the gate electrode above the semiconductor chip, and
the fifth and sixth diffusion layer regions in the third field effect transistor are respectively positioned so as to overlap the gate electrode in a stacking direction of the gate electrode above the semiconductor chip.

4. The semiconductor storage device as set forth in claim 1, wherein
an amount of electric charge retained in one of the memory function sections in the second field effect transistor and an amount of electric charge retained in the other of the memory function sections in the second field effect transistor are respectively controlled, and the second field effect transistor retains quaternary or more information.

5. The semiconductor storage device as set forth in claim 1, wherein
the well region or the body region of the first field effect transistor are formed on an insulating film, and are electrically separated from a well region or a body region of another field effect transistor adjacent to the first field effect transistor by the insulating film and an element separation region provided on the well region or the body region.

6. The semiconductor storage device as set forth in claim 5, wherein the field effect transistors are formed on an SOI substrate.

7. The semiconductor storage device as set forth in claim 1, wherein
each of the memory function sections of the second field effect transistor is constituted of first, second, and third insulating films, and the first insulating film which has a function for storing electric charge is sandwiched by the second insulating film and the third insulating film each of which has a function for preventing the electric charge from scattering.

8. The semiconductor storage device as set forth in claim 7, wherein
a gate insulating film is formed under the gate electrode, and the first insulating film of the memory function section includes a portion, being opposite to a plane parallel to a surface of the gate insulating film via the second insulating film, whose plane extends along that plane.

9. The semiconductor storage device as set forth in claim 8, wherein
the first insulating film of the memory function section includes a portion, being opposite to a side face of the gate insulating film via the second insulating film, which extends along the side face.

10. The semiconductor storage device as set forth in claim 7, wherein
gate electrode of the second field effect transistor is formed above the well region or the body region via the gate insulating film, and the first insulating film of the memory function section is separated from the well region or the body region by the second insulating film, and a thickness of the second insulating film is thinner than a thickness of the gate insulating film and is 0.8 nm or more.

11. The semiconductor storage device as set forth in claim 7, wherein
the gate electrode of the second field effect transistor is formed above the well region or the body region via the gate insulating film, and the first insulating film of the memory function section is separated from the well region or the body region by the second insulating film, and a thickness of the second insulating film is thicker than a thickness of the gate insulating film and is 20 nm or less.

12. The semiconductor storage device as set forth in claim 7, wherein the first insulating film is a silicon nitride film, and each of the second and third insulating films is a silicon oxide film.

13. The semiconductor storage device as set forth in claim 1, wherein
the first field effect transistor includes gate side wall insulating films provided on both side walls of the gate electrode in the gate length direction, and each of the gate side wall insulating films does not have a function for retaining electric charge.

14. A semiconductor device, comprising a semiconductor storage device which includes
one or more first field effect transistors and one or more second field effect transistors that are formed on a single semiconductor chip, wherein:
the first field effect transistor includes a well region or a body region, a gate electrode, and first and second diffusion layer regions, and the first field effect transistor varies an amount of a current, flowing from the first diffusion layer region to the second diffusion layer region in applying a voltage to the gate electrode, in accordance with an amount of electric charge retained in the well region or the body region, and
the second field effect transistor includes third and fourth diffusion layer regions, a gate electrode, and memory function sections, formed on both side walls of the gate electrode so as to be disposed in a gate length direction of the gate electrode, each of which has a charge retaining function, and the second field effect transistor varies an amount of a current, flowing from the third diffusion layer region to the fourth diffusion layer region in applying a voltage to the gate electrode, in accordance with an amount of electric charge retained in the memory function sections,
said semiconductor device further comprising a plurality of third field effect transistors, functioning as a logic circuit section, each of which has fifth and sixth diffusion layer regions and a gate electrode.

15. The semiconductor device as set forth in claim 14, wherein:
the third and fourth diffusion layer regions in the second field effect transistor are respectively positioned externally away from the gate electrode in the gate length direction so as not to overlap the gate electrode in a stacking direction of the gate electrode above the semiconductor chip, and
the fifth and sixth diffusion layer regions in the third field effect transistor are respectively positioned so as to overlap the gate electrode in a stacking direction of the gate electrode above the semiconductor chip.

16. A semiconductor device, comprising a semiconductor storage device which includes
one or more first field effect transistors and one or more second field effect transistors that are formed on a single semiconductor chip, wherein:
the first field effect transistor includes a well region or a body region, a gate electrode, and first and second diffusion layer regions, and the first field effect transistor varies an amount of a current, flowing from the first diffusion layer region to the second diffusion layer region in applying a voltage to the gate electrode, in accordance with an amount of electric charge retained in the well region or the body region, and
the second field effect transistor includes third and fourth diffusion layer regions, a gate electrode, and memory function sections, formed on both side walls of the gate electrode so as to be disposed in a gate length direction of the gate electrode, each of which has a charge retaining function, and the second field effect transistor varies an amount of a current, flowing from the third diffusion layer region to the fourth diffusion layer region in applying a voltage to the gate electrode, in accordance with an amount of electric charge retained in the memory function sections, and
a first memory peripheral circuit for refreshing memory cells of a first memory cell array and a second memory peripheral circuit having a voltage generating circuit for generating a voltage required in rewriting information of memory cells of a second memory cell array are provided on the semiconductor chip, and
each of the first and second memory peripheral circuits includes a plurality of third field effect transistors each of which has fifth and sixth diffusion layer regions and a gate electrode,
said semiconductor device further comprising a logic circuit section constituted of the third field effect transistors.

17. The semiconductor device as set forth in claim 16, wherein a power source voltage supplied to the logic circuit section is lower than a power source voltage supplied to the second memory cell array and the second memory peripheral circuit.

18. A semiconductor storage device, comprising
one or more first field effect transistors and one or more second field effect transistors that are formed on a single semiconductor chip, wherein:
the first field effect transistor includes a well region or a body region, a gate electrode provided in a stacking direction with respect to the well region or the body region, and first and second diffusion layer regions positioned on both sides of the gate electrode in a gate length direction of the well region or the body region, and
the second field effect transistor includes third and fourth diffusion layer regions, a gate insulating film, and a channel region formed between the third and fourth diffusion layer regions so as to be positioned under the gate insulating film, a gate electrode formed on the gate insulating film, and memory function sections, formed on both side walls of the gate electrode in the gate length direction, each of which has a function for retaining electric charge.

19. The semiconductor storage device as set forth in claim 18, wherein:
the third and fourth diffusion layer regions of the second field effect transistor respectively overlap the memory function sections in a stacking direction of the gate electrode above the semiconductor chip, and
the memory function sections partially overlap the channel region in the stacking direction of the gate electrode above the semiconductor chip.

20. The semiconductor storage device as set forth in claim 18, wherein
each of the memory function sections of the second field effect transistor includes:
a charge retaining film having a function for retaining electric charge; and
an insulating film for covering the charge retaining film so as to insulate the charge retaining film from the third and fourth diffusion layer regions, the channel region, and the gate electrode of the second field effect transistor.

21. The semiconductor storage device as set forth in claim 20, wherein the charge retaining film overlaps the third or fourth diffusion layer region in the stacking direction of the gate electrode above the semiconductor chip.

22. The semiconductor storage device as set forth in claim 20, wherein the charge retaining film is a silicon nitride film.

23. The semiconductor storage device as set forth in claim 20, wherein the insulating film is a silicon oxide film.

24. The semiconductor storage device as set forth in claim 20, wherein at least a part of the charge retaining film extends substantially in parallel to a surface of the gate insulating film of the second field effect transistor.

25. The semiconductor storage device as set forth in claim 20, wherein at least a part of the charge retaining film extends along the stacking direction of the gate electrode of the second field effect transistor.

26. The semiconductor storage device as set forth in claim 18, wherein the well region or the body region of the first field effect transistor is formed on an insulating film.

27. The semiconductor storage device as set forth in claim 18, wherein there is formed an element separation region for electrically separating the well region or the body region of the first field effect transistor from the field effect transistor other than the first field effect transistor.

28. The semiconductor storage device as set forth in claim 18, wherein there is provided a refresh operation circuit for refreshing information stored in the first field effect transistor at constant intervals so as to connectively retain the information that has been refreshed.

29. The semiconductor storage device as set forth in claim 28, wherein the refresh operation circuit includes a third field effect transistor which has fifth and sixth diffusion layer regions and a gate electrode.

30. The semiconductor storage device as set forth in claim 18, wherein there is provided a voltage generating circuit for generating a voltage required in rewriting information of a memory cell of the second field effect transistor.

31. A mobile electronic device, comprising a semiconductor storage device which includes one or more first field effect transistors and one or more second field effect transistors that are formed on a single semiconductor chip, wherein:

the first field effect transistor includes a well region or a body region, a gate electrode, and first and second diffusion layer regions, and the first field effect transistor varies an amount of a current, flowing from the first diffusion layer region to the second diffusion layer region in applying a voltage to the gate electrode, in accordance with an amount of electric charge retained in the well region or the body region, and the second field effect transistor includes third and fourth diffusion layer regions, a gate electrode, and memory function sections, formed on both side walls of the gate electrode so as to be disposed in a gate length direction of the gate electrode, each of which has a charge retaining function, and the second field effect transistor varies an amount of a current, flowing from the third diffusion layer region to the fourth diffusion layer region in applying a voltage to the gate electrode, in accordance with an amount of electric charge retained in the memory function sections.

* * * * *